United States Patent [19]

Inada et al.

[11] Patent Number: 5,963,472
[45] Date of Patent: Oct. 5, 1999

[54] INFORMATION STORAGE APPARATUS AND METHOD FOR OPERATING THE SAME

[75] Inventors: Nobufumi Inada; Koji Shigematsu; Junichi Kitabuki; Tetsuya Hayashi, all of Tokyo, Japan

[73] Assignee: NKK Corporation, Tokyo, Japan

[21] Appl. No.: 09/120,180

[22] Filed: Jul. 22, 1998

Related U.S. Application Data

[62] Division of application No. 08/696,879, Aug. 20, 1996, Pat. No. 5,848,002.

[30] Foreign Application Priority Data

| Dec. 27, 1994 | [JP] | Japan | 6-336859 |
| Dec. 27, 1994 | [JP] | Japan | 6-336862 |
| Dec. 27, 1994 | [JP] | Japan | 6-336863 |
| Dec. 27, 1994 | [JP] | Japan | 6-336864 |
| Dec. 25, 1995 | [JP] | Japan | 7-335574 |
| Dec. 25, 1995 | [JP] | Japan | 7-335575 |
| Dec. 25, 1995 | [JP] | Japan | 7-335576 |
| Dec. 25, 1995 | [JP] | Japan | 7-335577 |
| Dec. 25, 1995 | [JP] | Japan | 7-335578 |

[51] Int. Cl.[6] .................................................. G11C 11/36
[52] U.S. Cl. .......................... 365/175; 365/148; 365/233; 365/100; 365/194
[58] Field of Search .................................. 365/175, 168, 365/148, 233, 100, 194

[56] References Cited

U.S. PATENT DOCUMENTS

| 4,488,261 | 12/1984 | Ueno et al. | 365/104 |
| 4,734,886 | 3/1988 | Blankenship et al. | 365/104 X |
| 4,802,121 | 1/1989 | Schreck et al. | 365/104 |
| 5,046,045 | 9/1991 | Ebel et al. | 365/104 X |
| 5,280,445 | 1/1994 | Shieh et al. | 365/175 |
| 5,432,744 | 7/1995 | Nagata | 365/230.06 X |
| 5,499,208 | 3/1996 | Shoji | 365/233 X |
| 5,535,156 | 7/1996 | Levy et al. | 365/175 |
| 5,596,538 | 1/1997 | Joo | 365/194 X |

FOREIGN PATENT DOCUMENTS

| 60-3710 | 1/1985 | Japan. |
| 4-363062 | 12/1992 | Japan. |

*Primary Examiner*—Huan Hoang
*Attorney, Agent, or Firm*—Nixon & Vanderhye P.C.

[57] ABSTRACT

A mask ROM is so configured as to read out information through the utilization of a cumulative time delay involved when a read-out signal applied to memory elements making connection between a word line WL1 and bit lines BL1 crossing the word line is passed through delay elements R1 to R7, that is, as to read out stored information on a time base, in which the conductions of switching transistors T1 to T8 are controlled by the outputs of the delay elements R1 to R7 and the information appearing at the bit line BL1 is sequentially read out at a predetermined time corresponding to a time delay resulting from the delay elements R1 to R7.

26 Claims, 34 Drawing Sheets

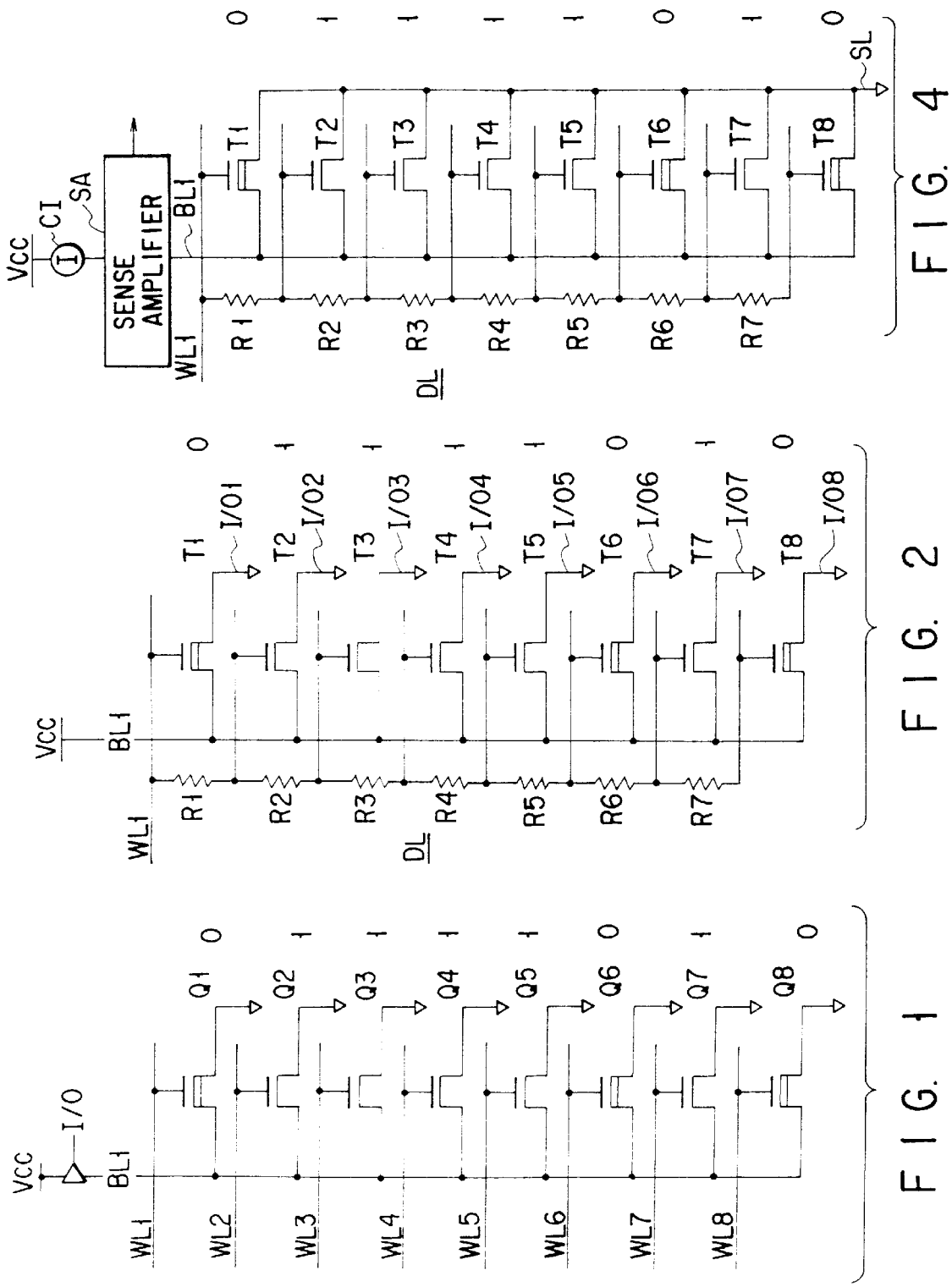

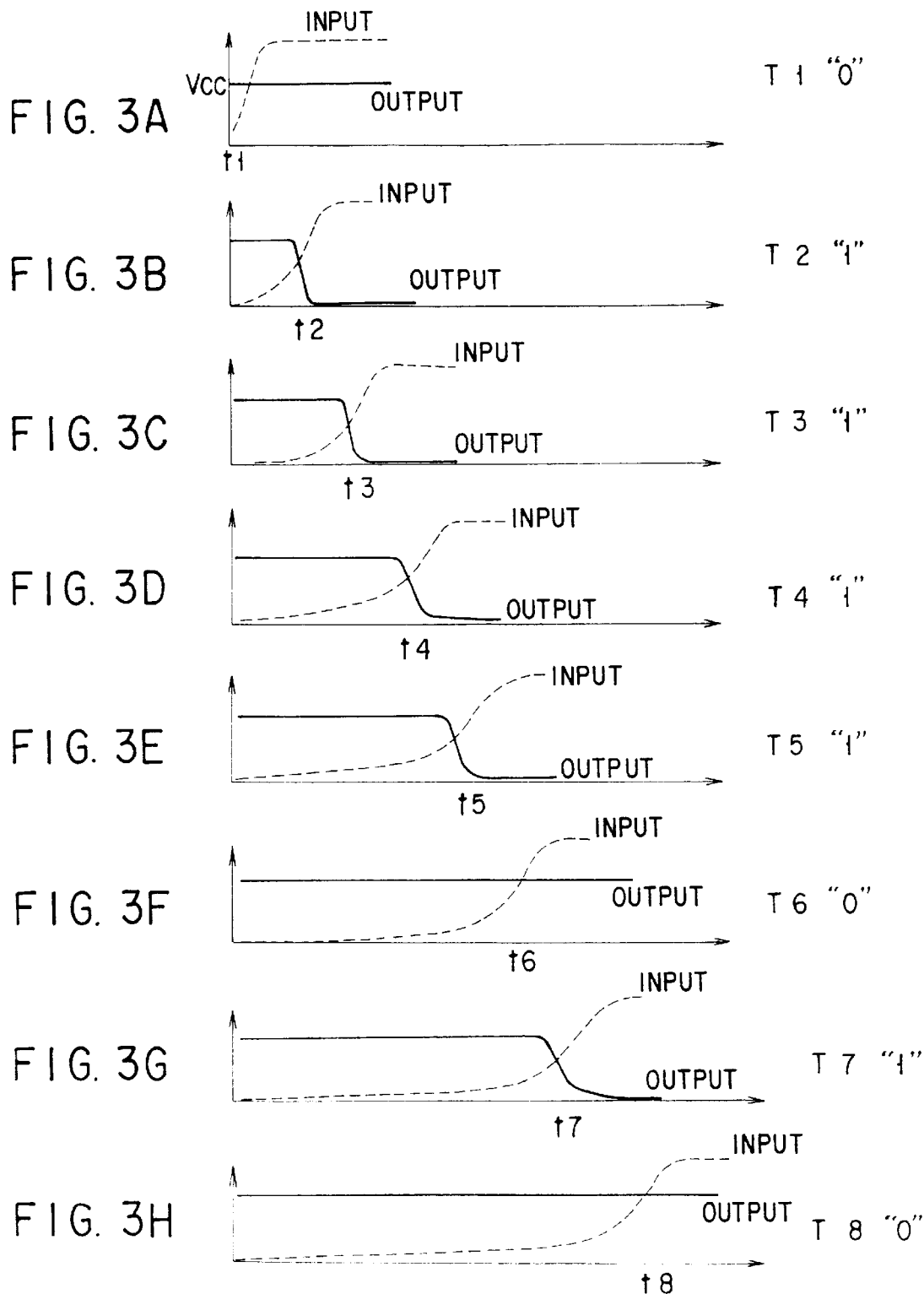

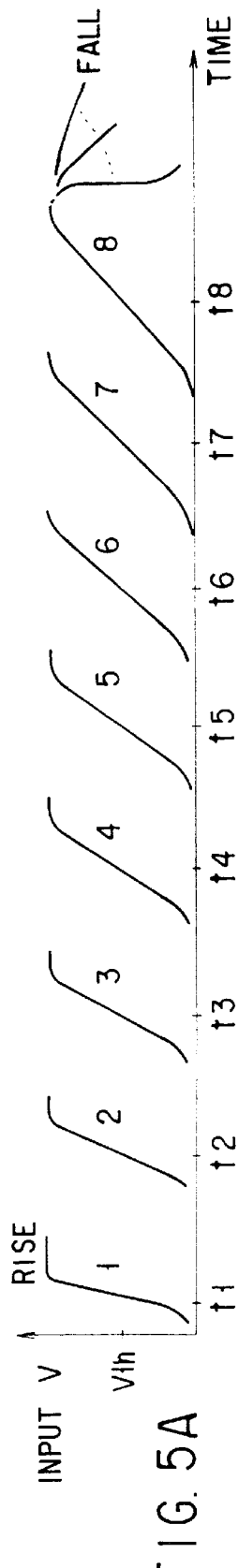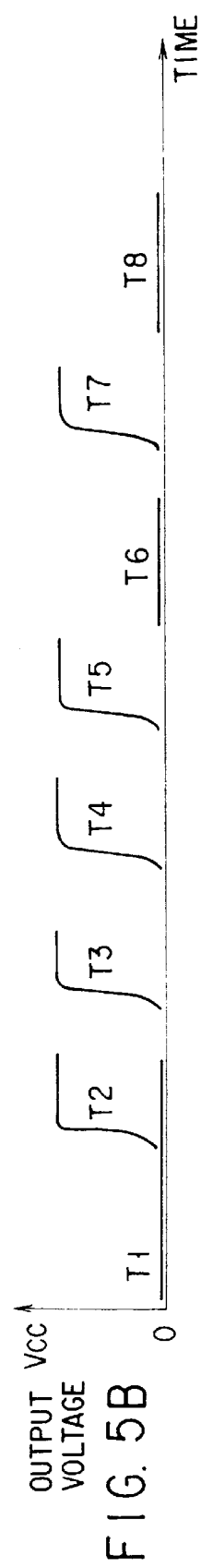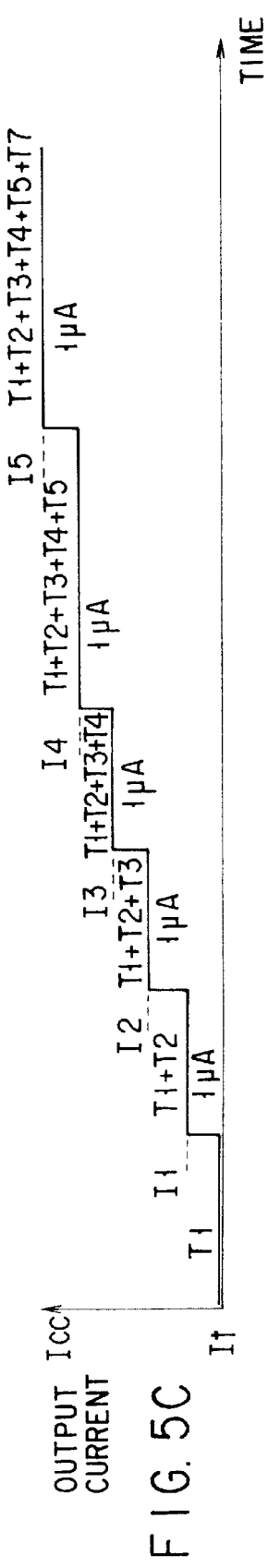

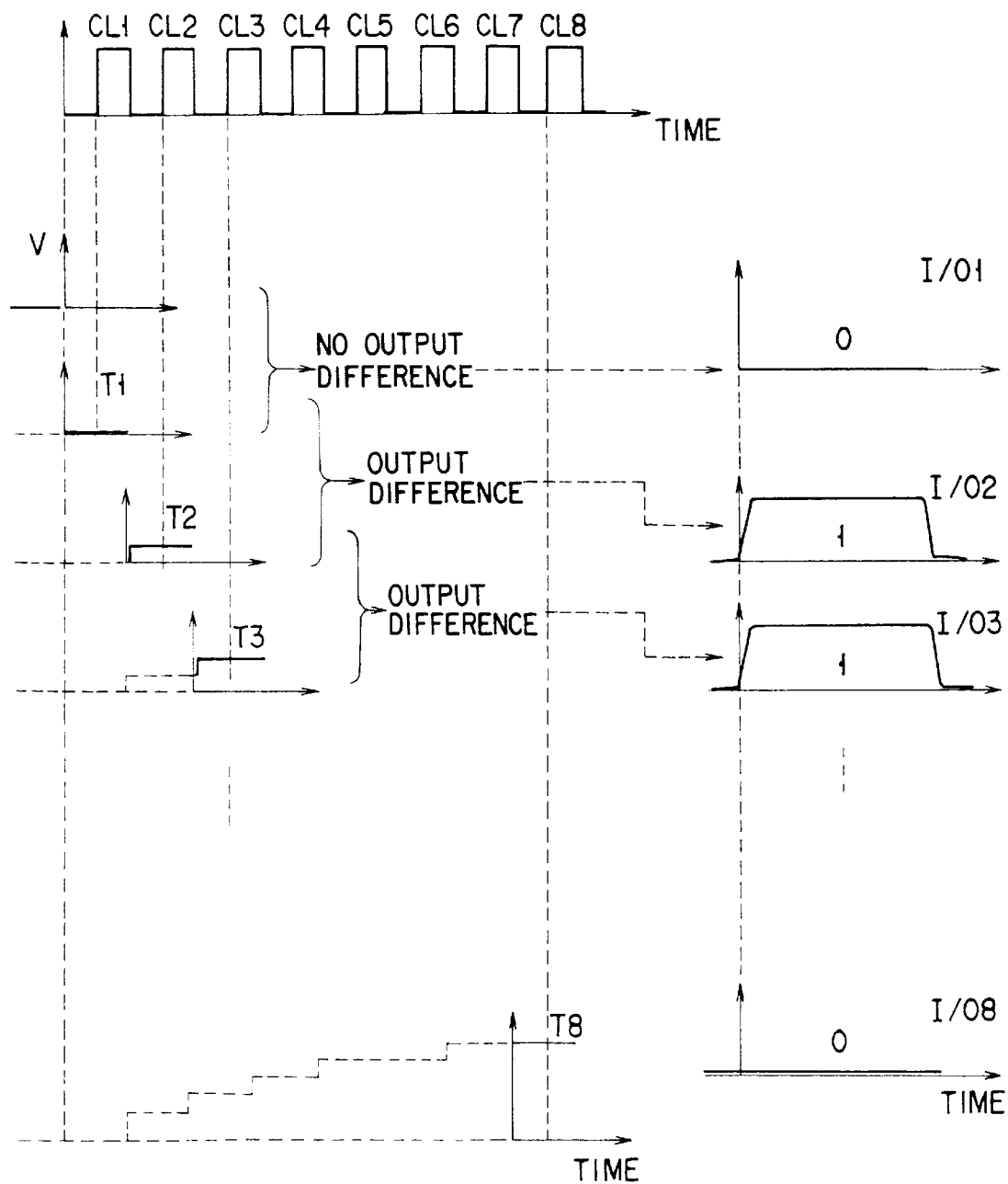
F I G. 6

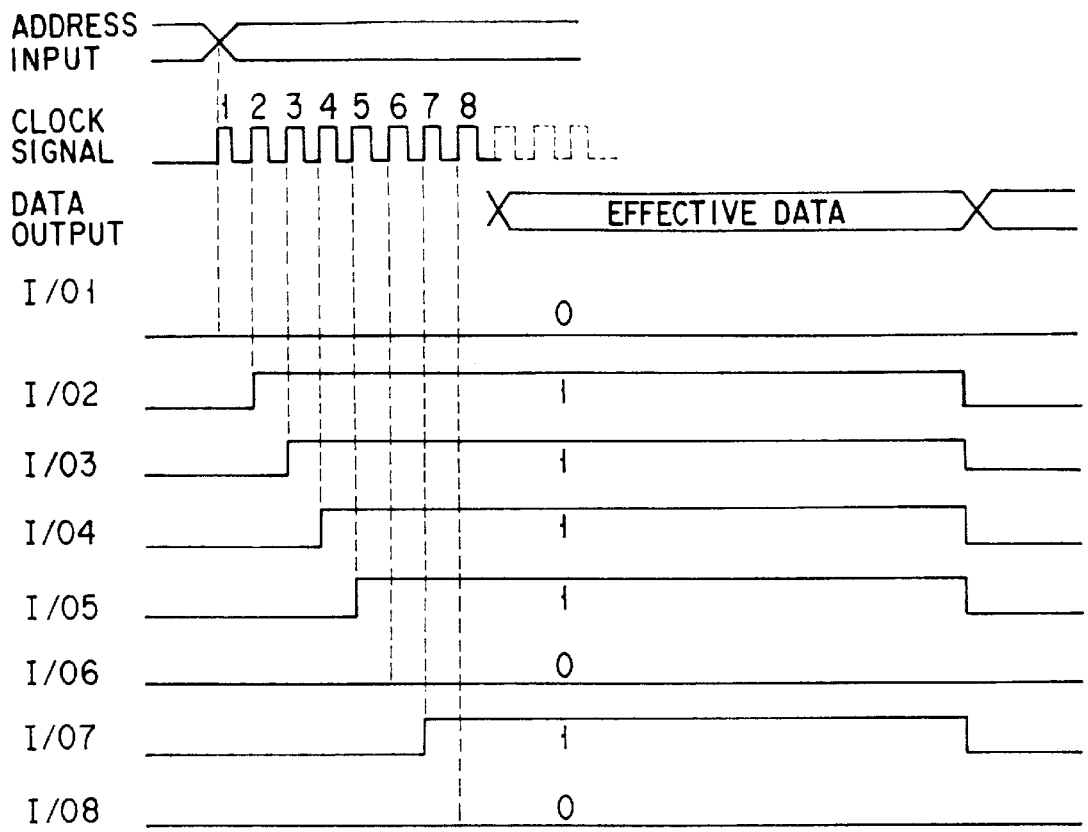
F I G. 7
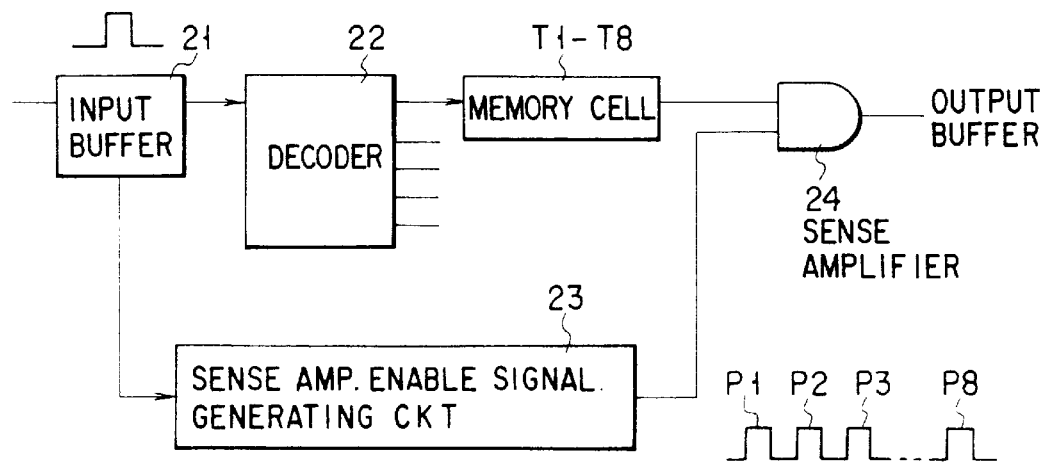
F I G. 8

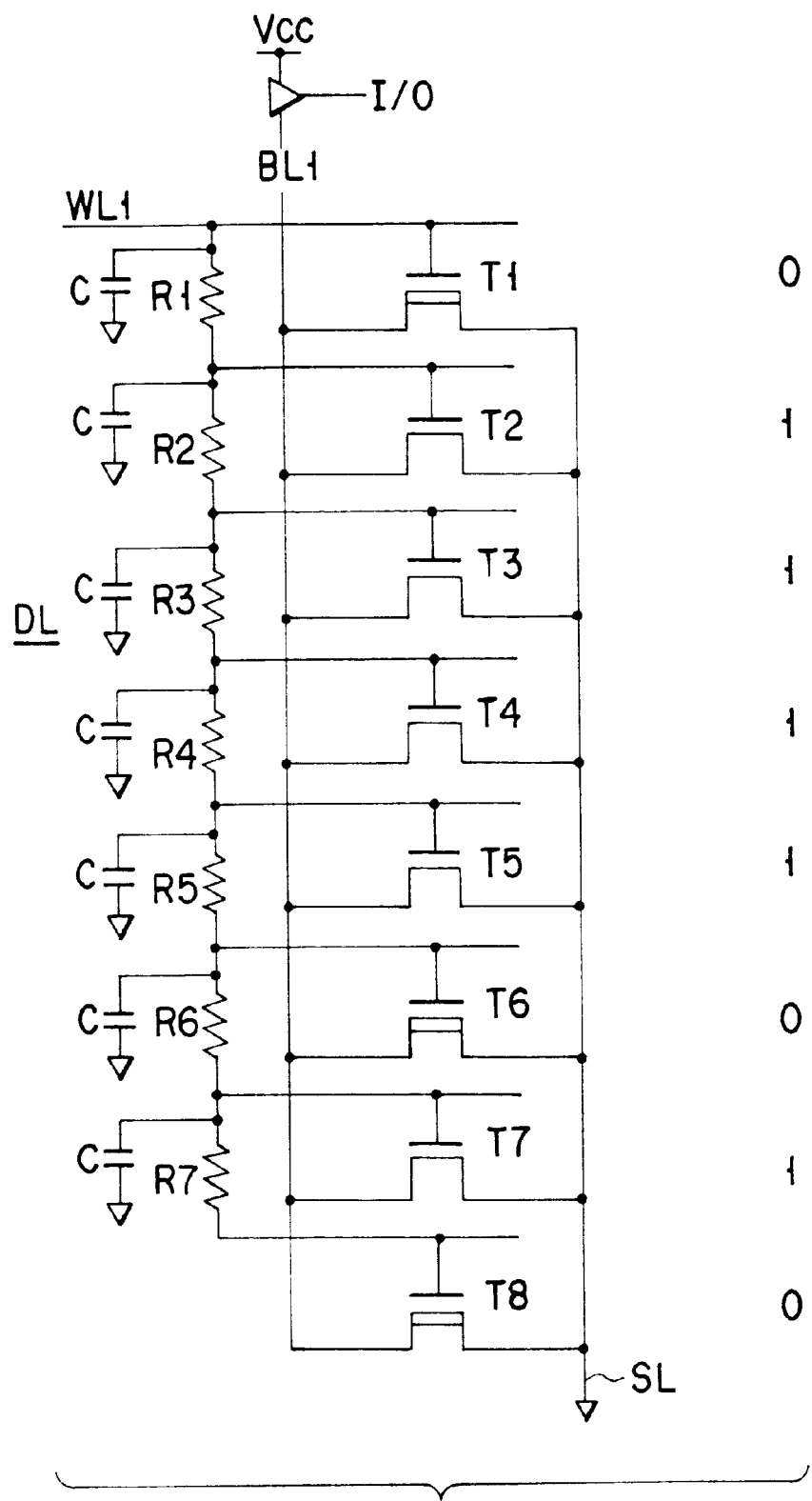
F I G. 13

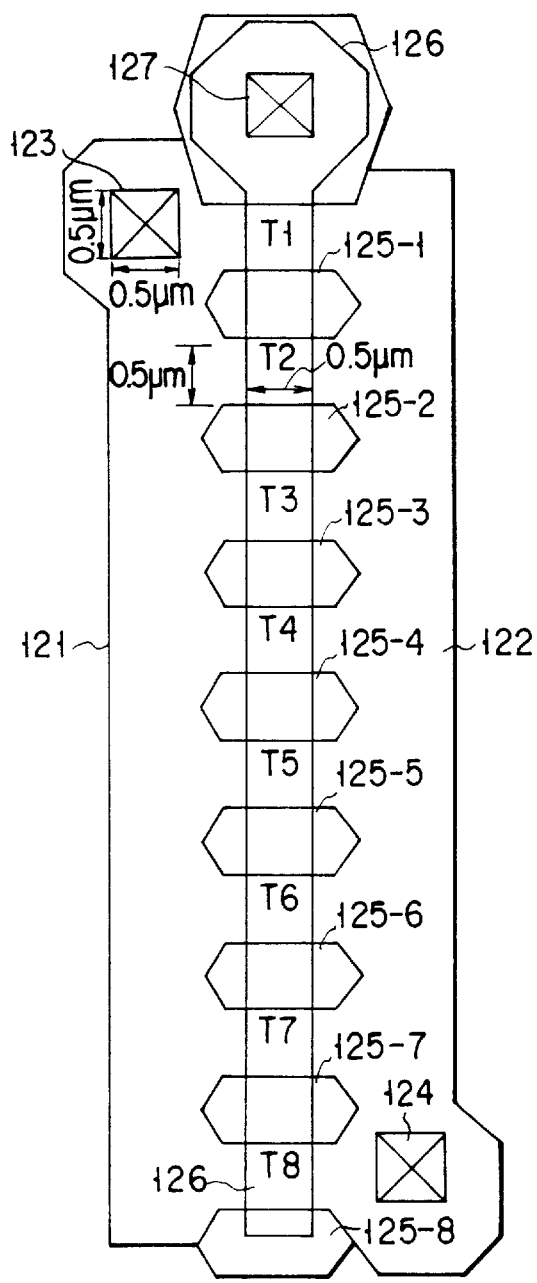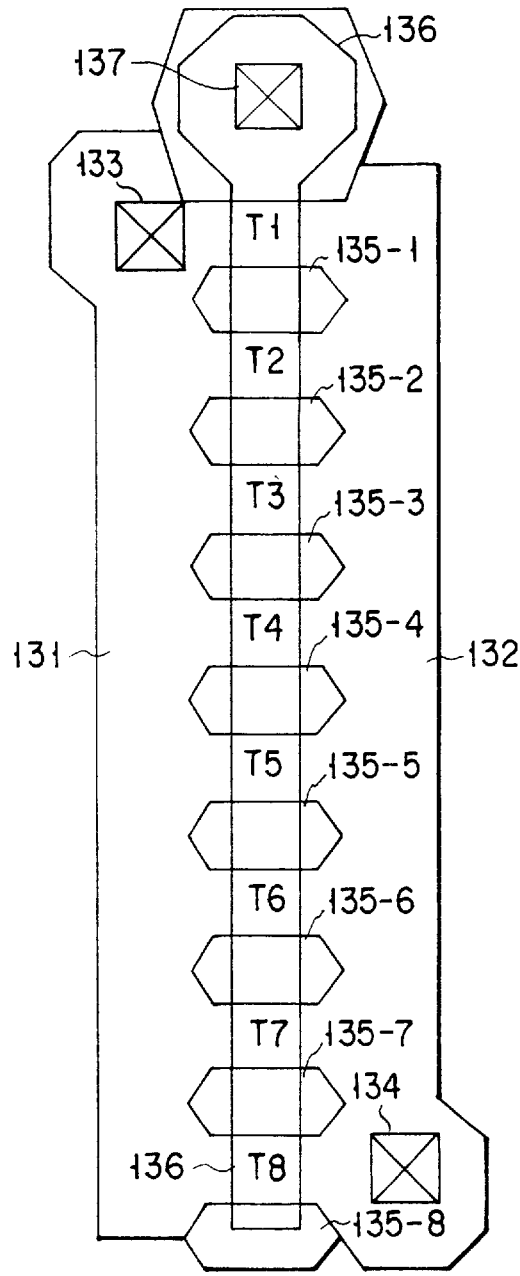
F I G. 14
F I G. 16

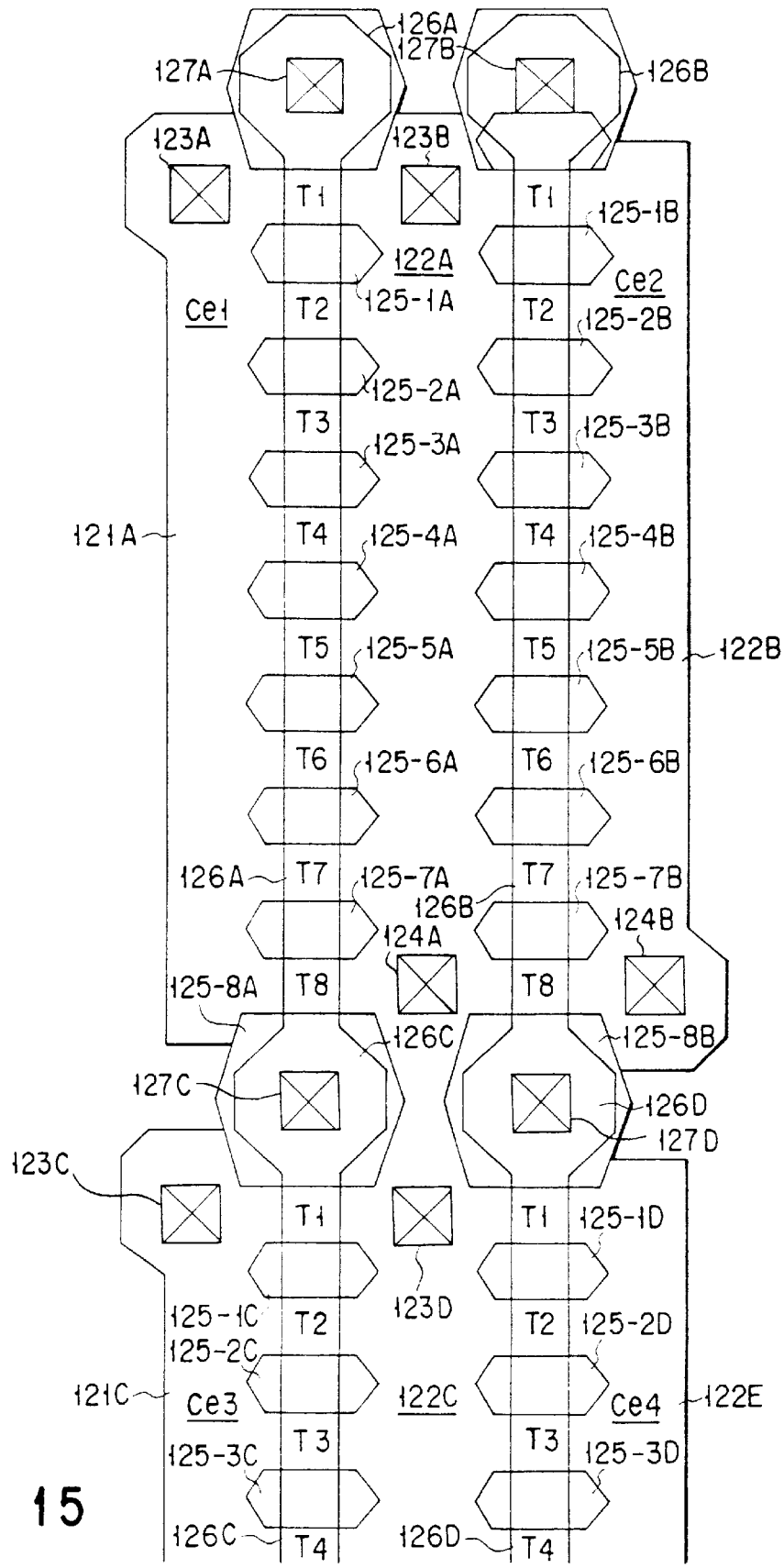
F I G. 15

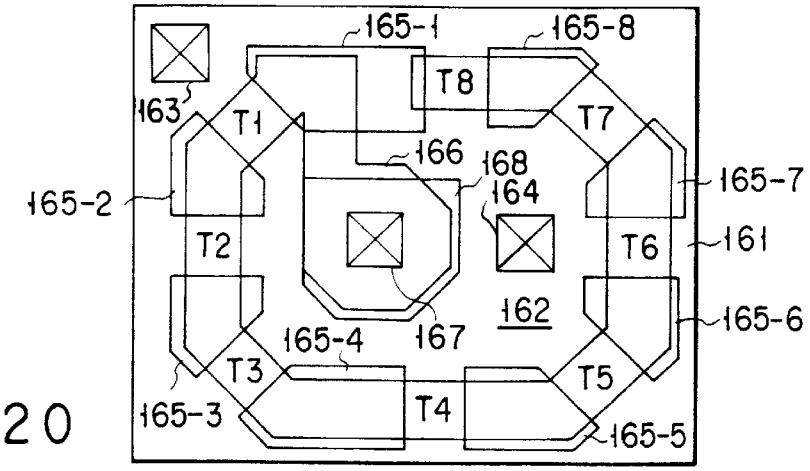
F I G. 20
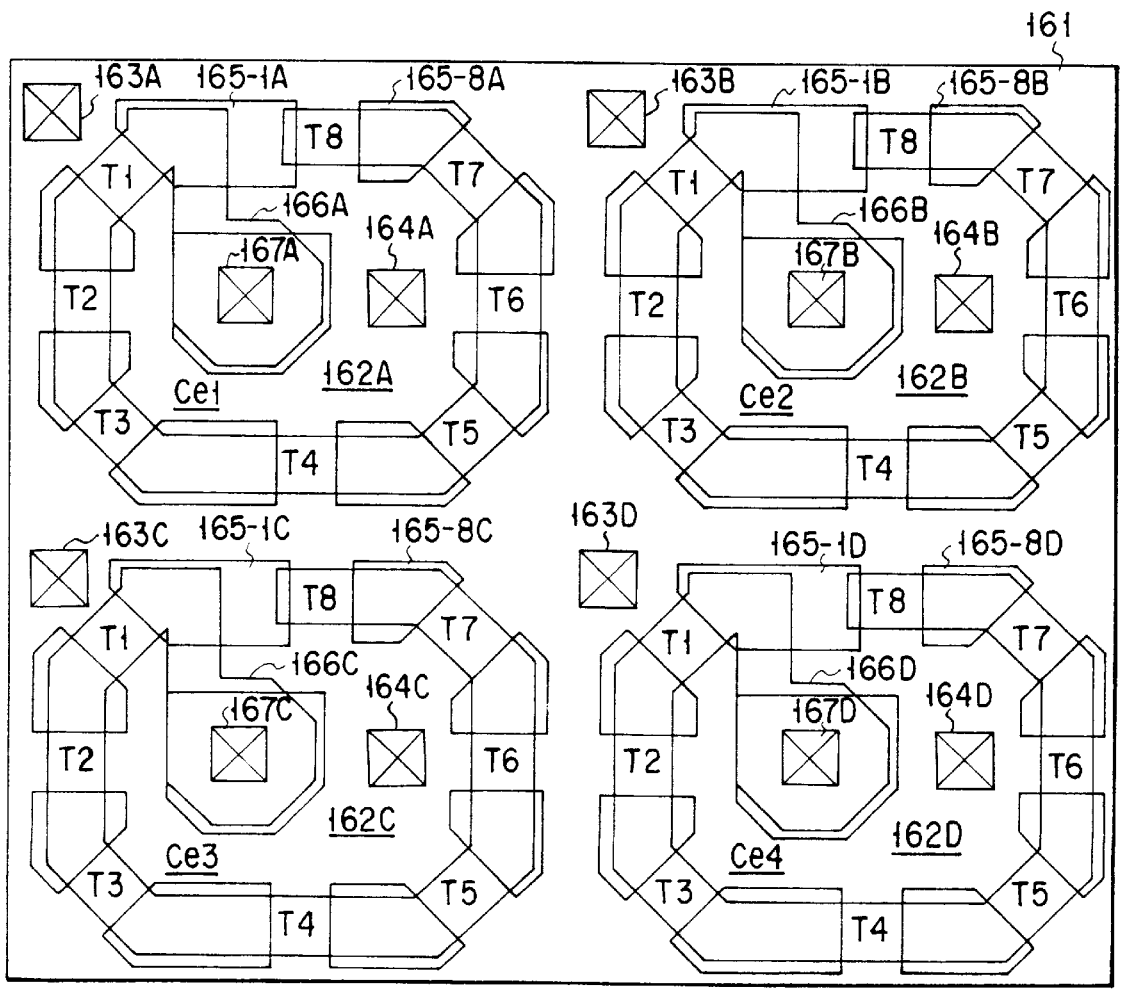
F I G. 21

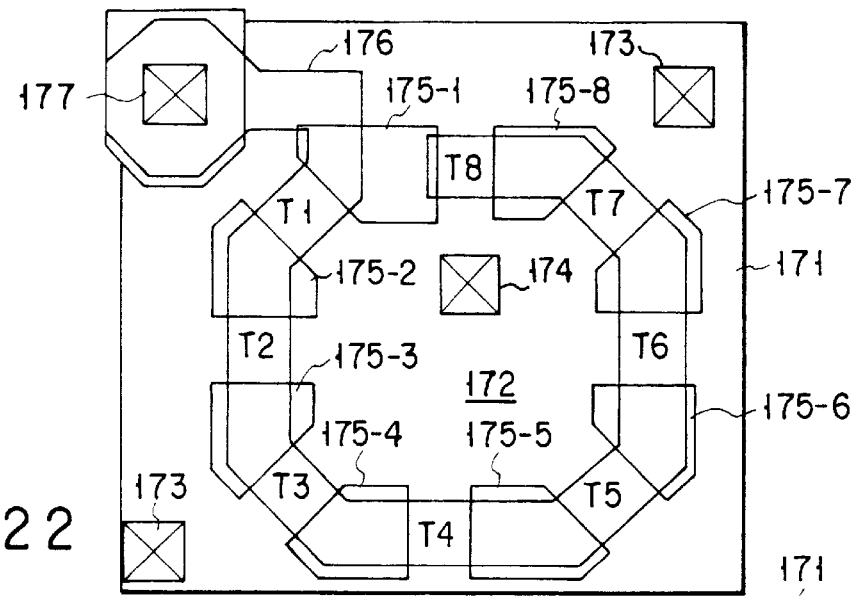
F I G. 22
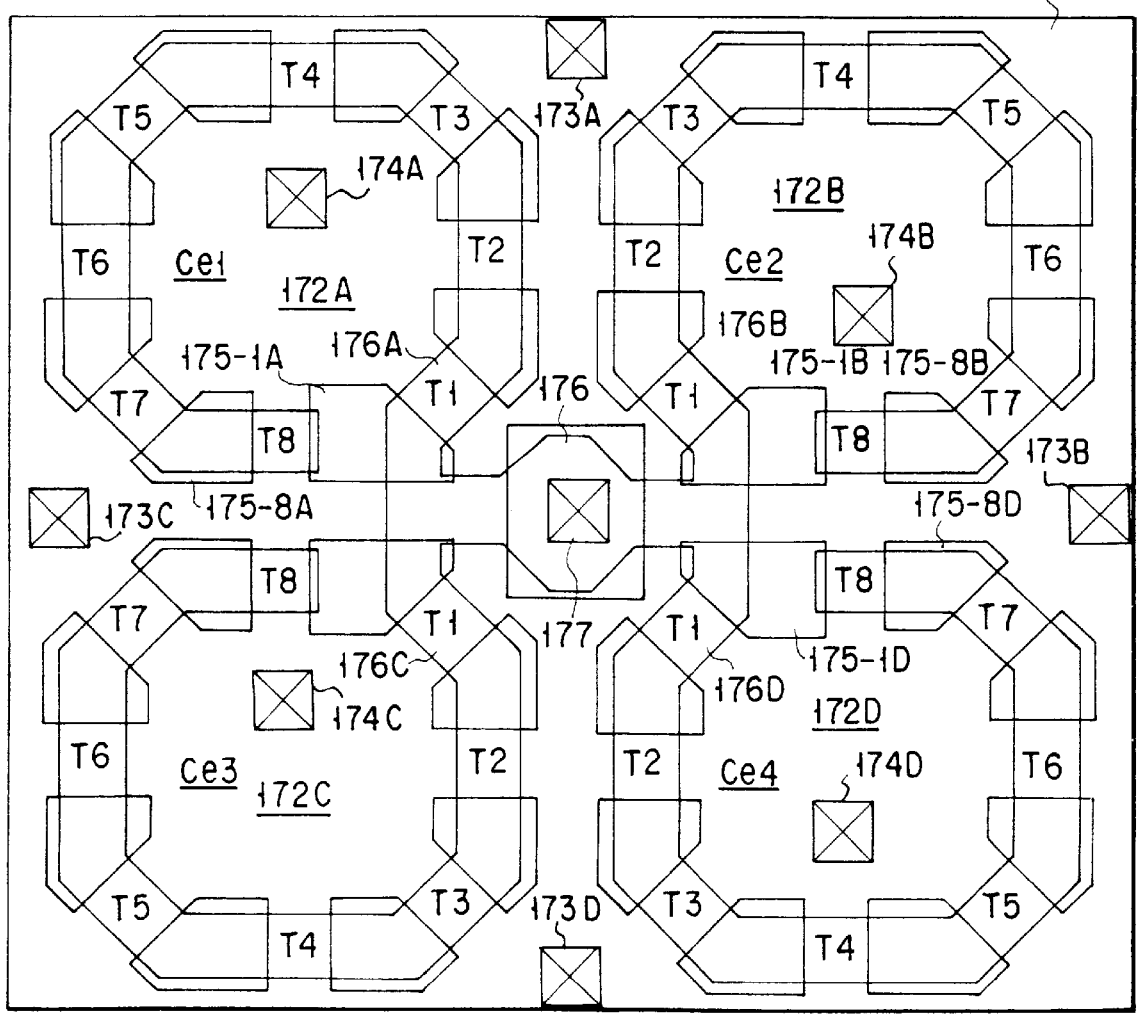
F I G. 23

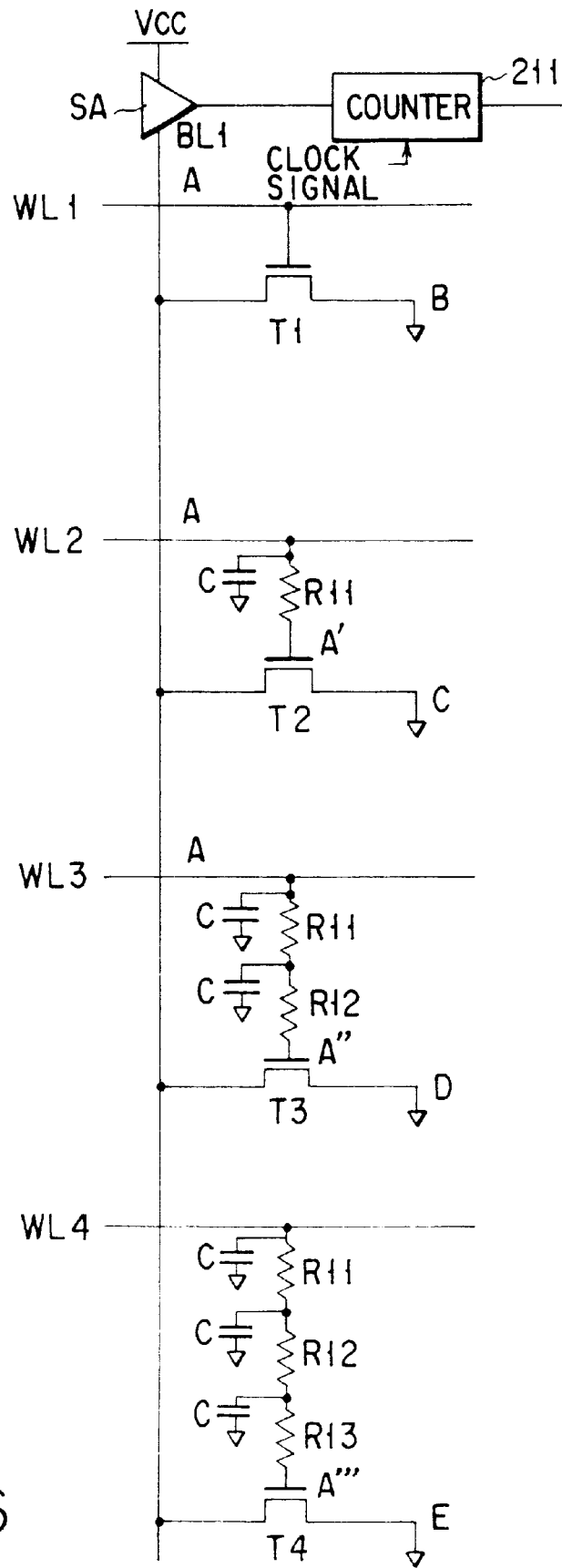
F I G. 26

ADDRESS SIGNAL

SELECT T1, COUNT "3"

SELECT T2, COUNT "2"

SELECT T3, COUNT "1"

SELECT T4, COUNT "0"

EFFECTIVE RANGE

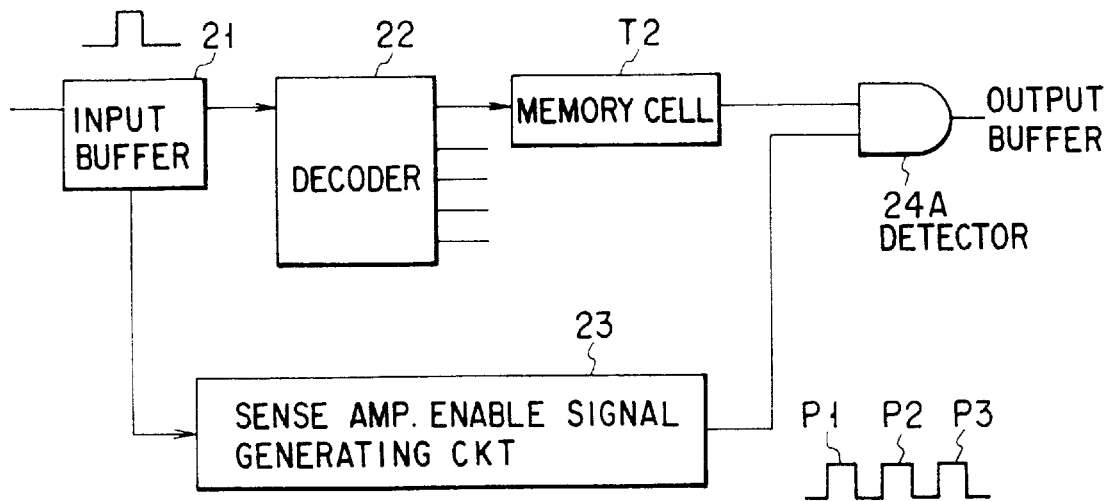
F I G. 28
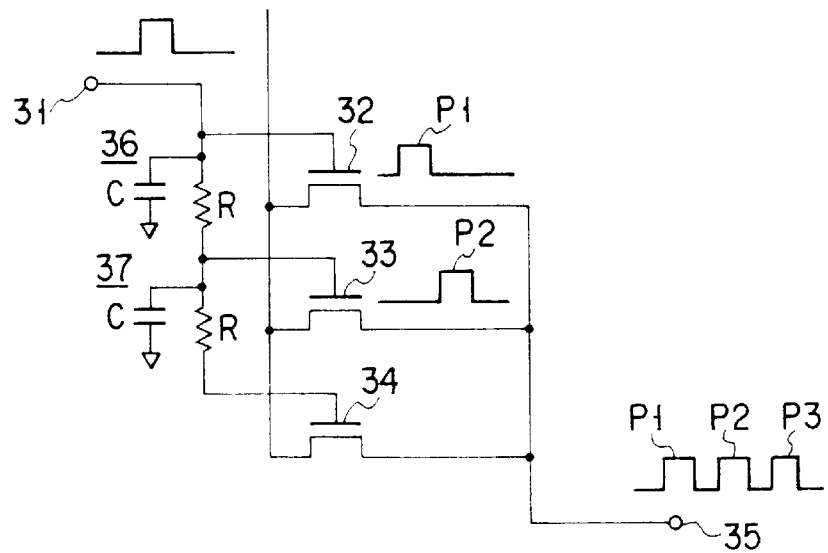
F I G. 29

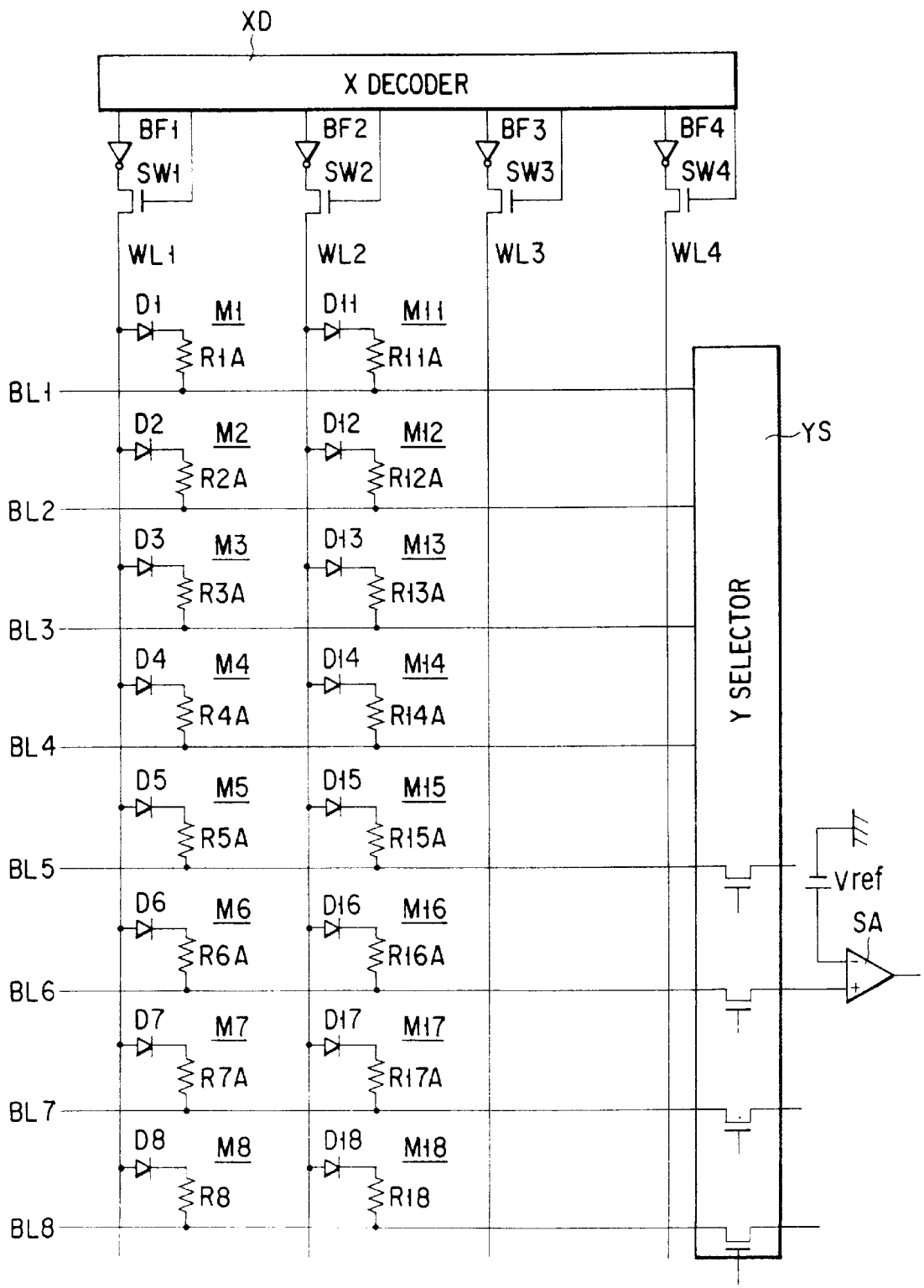
F I G. 34

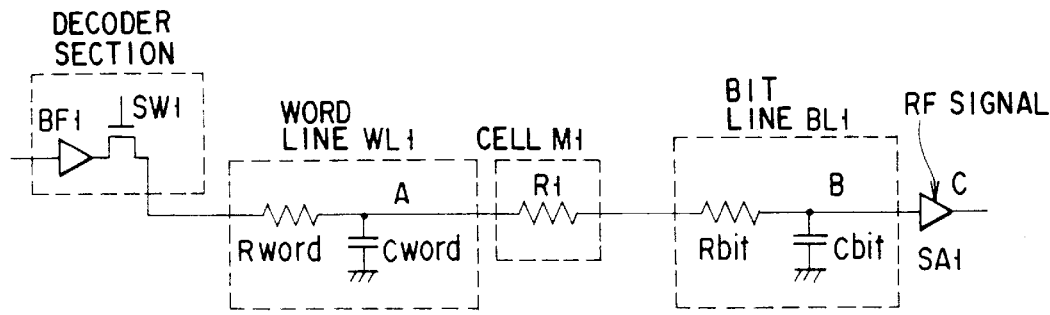
FIG. 37
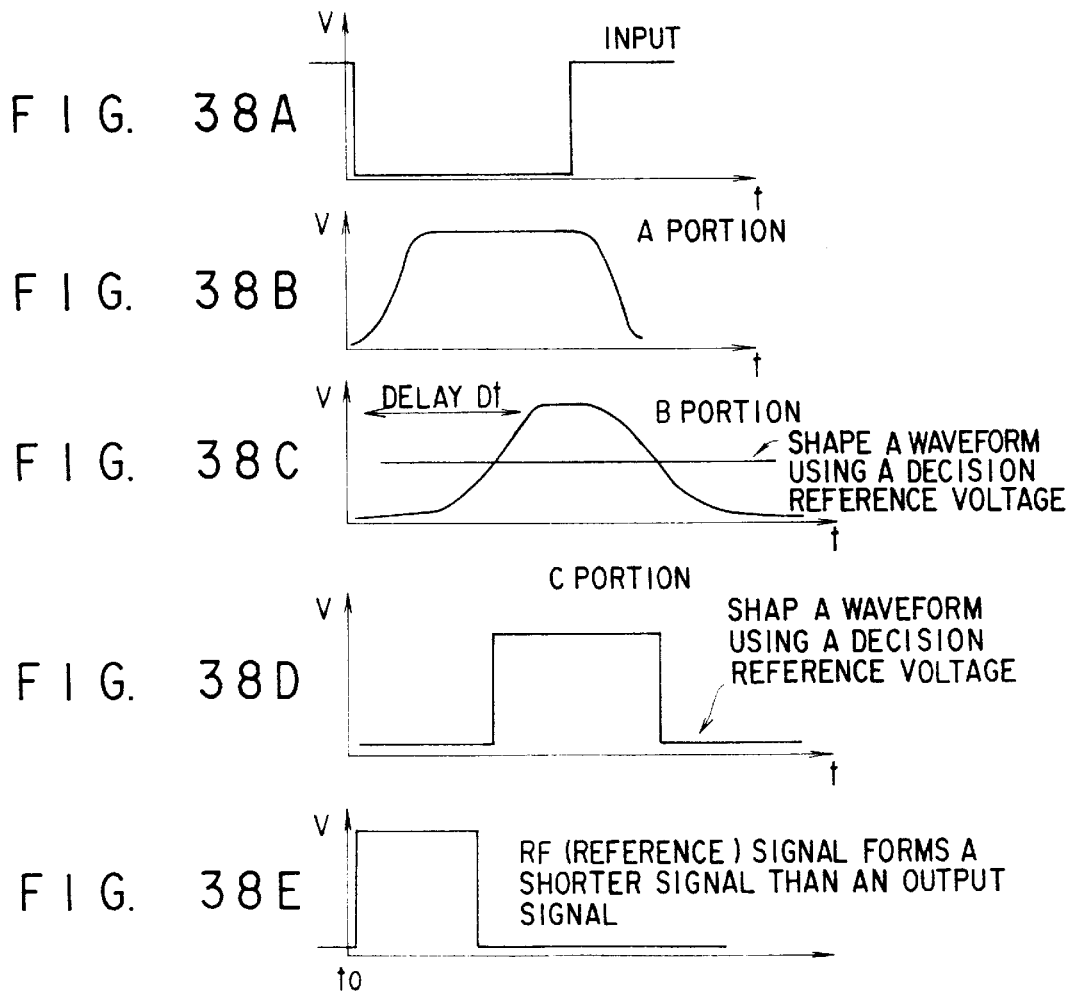
FIG. 38A
FIG. 38B
FIG. 38C
FIG. 38D
FIG. 38E

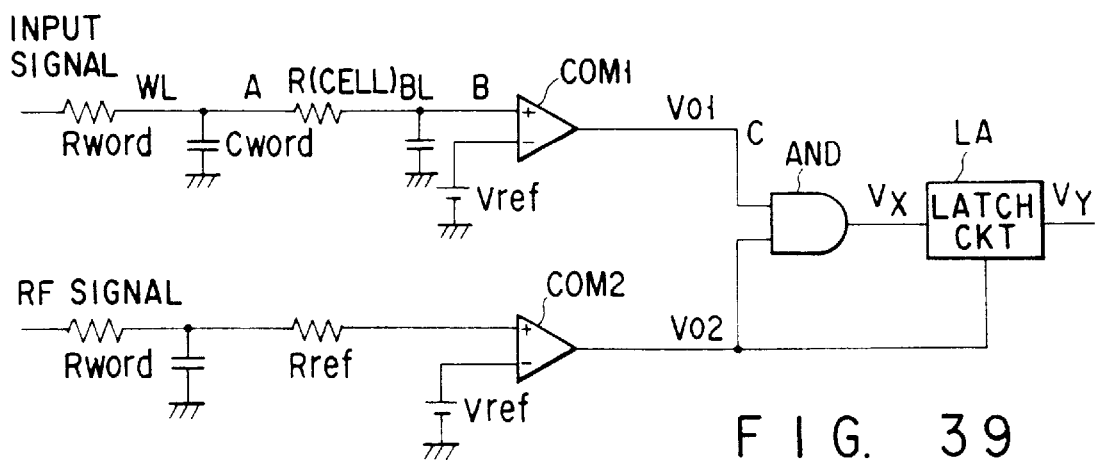
F I G. 39
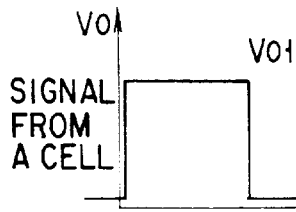
F I G. 40A
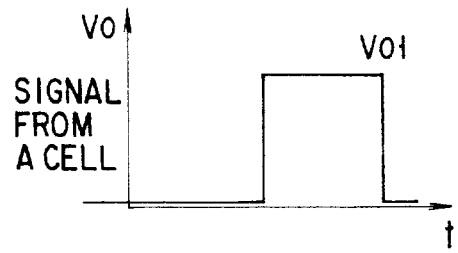
F I G. 40D
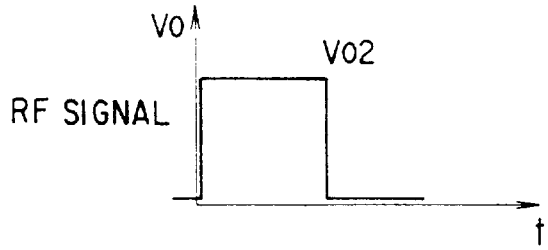
F I G. 40B
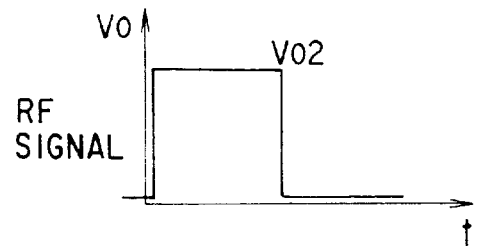
F I G. 40E
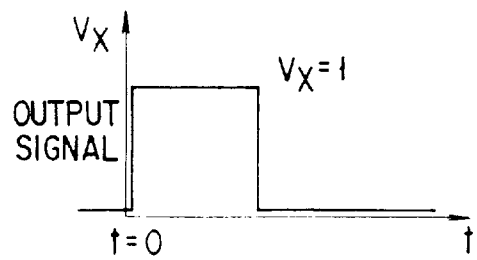
F I G. 40C
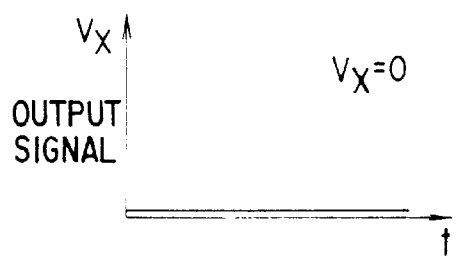
F I G. 40F

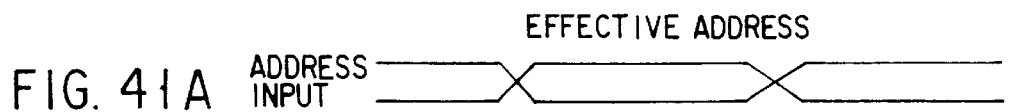
FIG. 41A ADDRESS INPUT — EFFECTIVE ADDRESS
FIG. 41B INPUT SIGNAL WL1
FIG. 41C REFERENCE SIGNAL — RF1, RF2
FIG. 41D CELL PASSING SIGNAL WITHOUT NO RESISTANCE — NO RESISTANCE
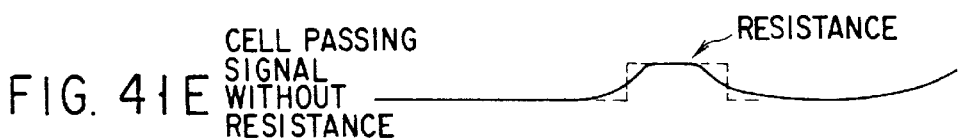
FIG. 41E CELL PASSING SIGNAL WITHOUT RESISTANCE — RESISTANCE
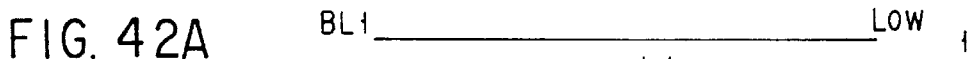
FIG. 42A  BL1 — LOW  1
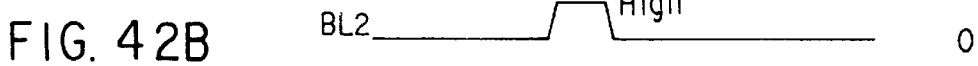
FIG. 42B  BL2 — High  0
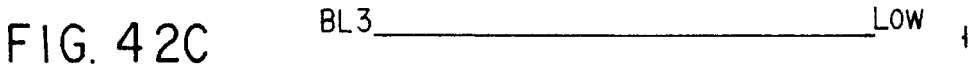
FIG. 42C  BL3 — LOW  1
FIG. 42D  BL4 — LOW  1
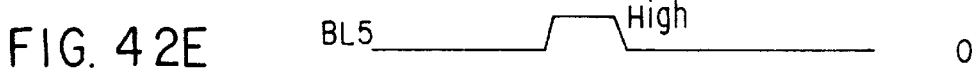
FIG. 42E  BL5 — High  0
FIG. 42F  BL6 — LOW  1
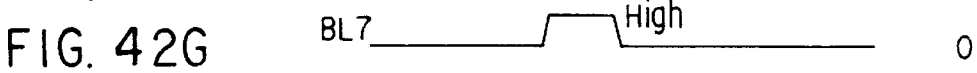
FIG. 42G  BL7 — High  0
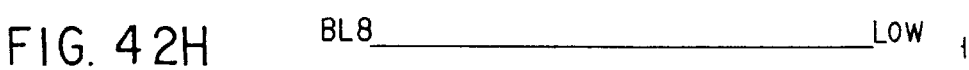
FIG. 42H  BL8 — LOW  1
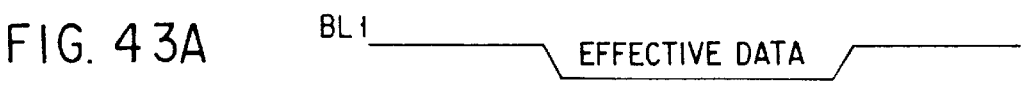
FIG. 43A  BL1 — EFFECTIVE DATA
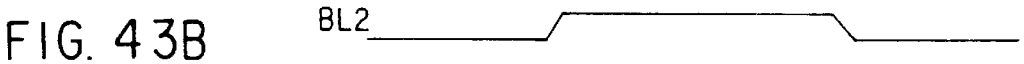
FIG. 43B  BL2
FIG. 43C
Time

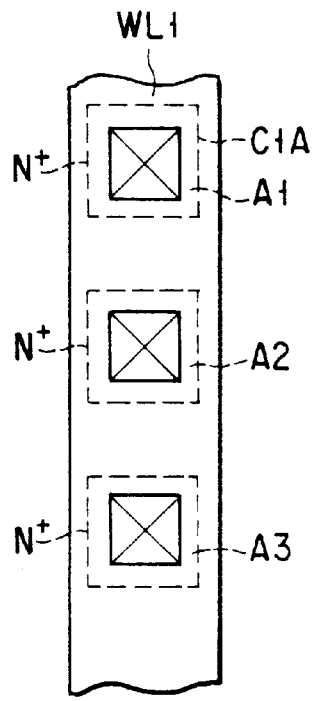 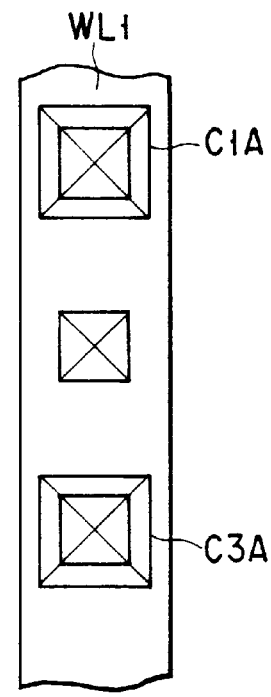
F I G. 44A  F I G. 44B
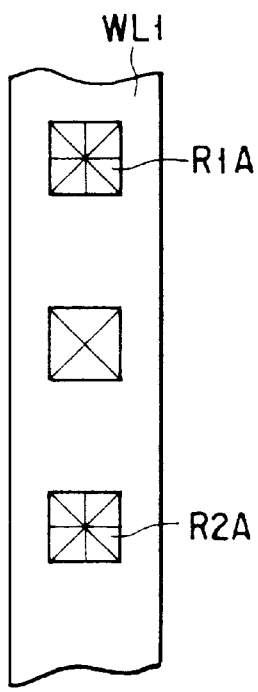 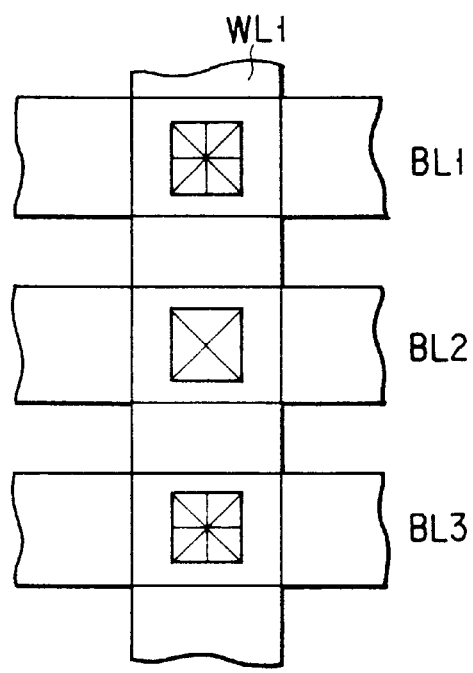
F I G. 44C  F I G. 44D

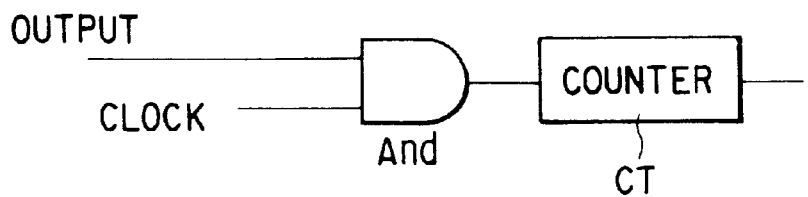
F I G. 4 8
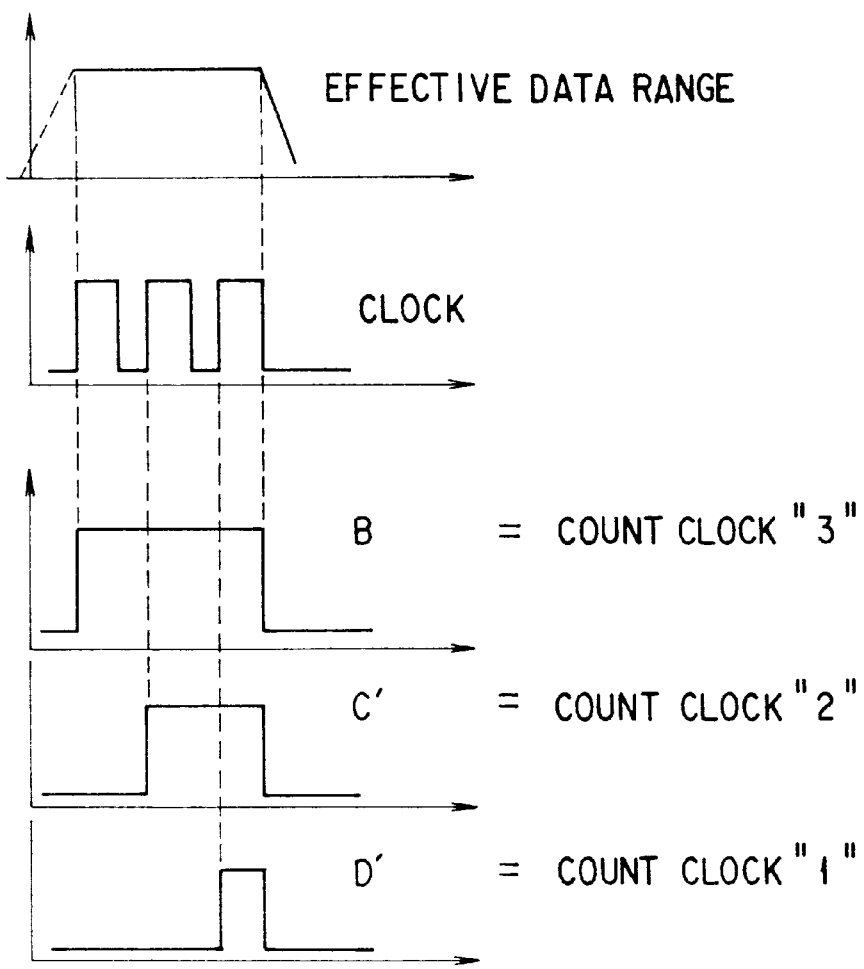
F I G. 4 9

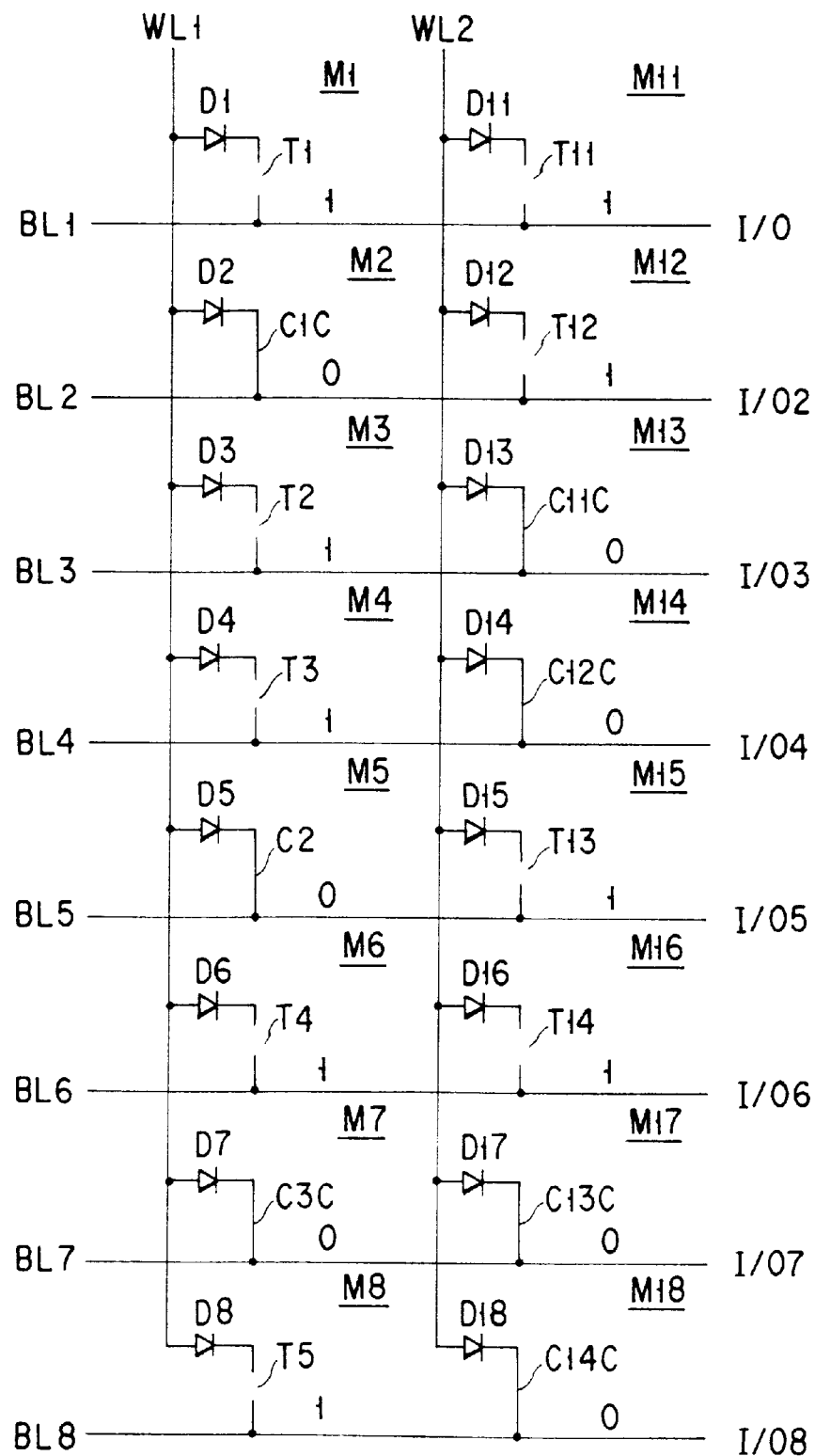
F I G. 50

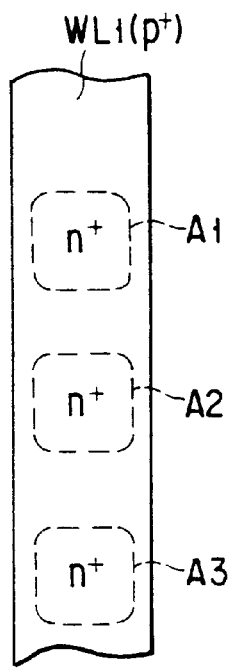
F I G. 53A
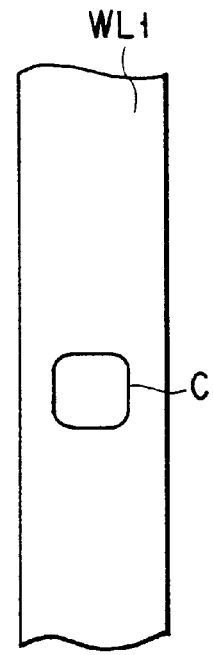
F I G. 53B
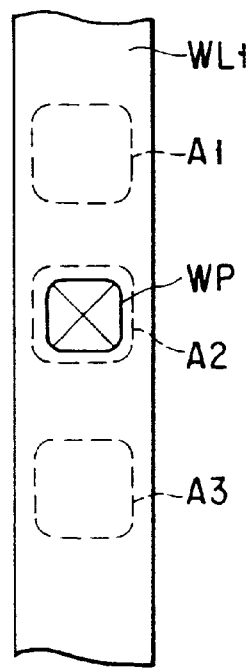
F I G. 53C
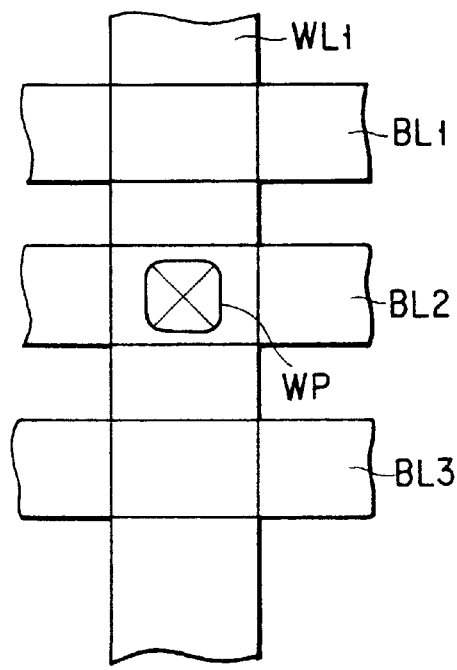
F I G. 53D

5,963,472

INFORMATION STORAGE APPARATUS AND METHOD FOR OPERATING THE SAME

This is a division of application Ser. No. 08/696,879, filed Aug. 20, 1996, now U.S. Pat. No. 5,848,002.

TECHNICAL FIELD

The present invention relates to an information storage apparatus and, in particular, an information storage apparatus for recording and reproducing binary or multi-leveled information along a time base and a method for operating the same.

BACKGROUND ART

A semiconductor storage apparatus, such as a mask ROM, is known as an information storage apparatus. This mask ROM is of such a ROM as to write information to memory cell transistors in a mask process, that is, fix "1" or "0" information, this being a so-called read-only memory.

FIG. 1 is a circuit diagram showing part of a conventional mask ROM which is structured with the use of MOS type memory cell transistors. In FIG. 1, Q1 to Q8 show MOS type memory transistors and the transistors Q1 to Q8 are connected at their gate electrodes to word lines WL1 to WL8. The transistors Q1 to Q8 are connected at their drain electrodes commonly to a bit line BL1 and grounded at their source electrodes. Depending upon whether the MOS type transistor is of an enhancement type or a depletion type ion implanted to vary the threshold value, their fixed storage contents are made to correspond to "1" and "0". In such a structure, the transistor Q1 is made fixed to "0" and the transistor Q2 to "1", for example.

In the mask ROM thus formed, when 8-bit information or one-word information for instance is to be read out, dedicated word lines are required for the respective bits and it is, therefore, necessary to provide eight word lines in total. If, here, it is only necessary to use one word line so as to read out one-word information, then the mask ROM structure can be very much simplified.

In order to read out the one-word information of a multi-bit configuration in the conventional mask ROM it will be necessary to use word lines corresponding to the number of bits. In consequence, the mask ROM becomes complicated in configuration and it has been impossible to reduce the area of memory cells by that extent.

Although only one bit information can be recorded or reproduced with a conventional memory cell, such as one transistor, if it is possible to record and reproduce plural-bit information or multi-valued information with one memory cell, then the mask ROM can be made in highly compact form.

DISCLOSURE OF INVENTION

It is accordingly the object of the present invention to, in order to solve the above-mentioned task, provide an information storage apparatus and its operation method which can reduce the number of word lines and reduce the area of a memory cell.

In order to achieve the object of the present invention there is provided an information storage apparatus characterized by comprising:

a plurality of memory elements;

means for connecting read-out control terminals of the memory elements commonly to one word line; and a timing control circuit including delay elements, connected between the read-out control terminals and the word line, for sequentially supplying read-out signals from the word line to the control terminals with predetermined delay times corresponding to the contents of information, wherein the information is stored along a time base by combining together the delay elements and memory elements.

Further, the present invention provides an information storage apparatus characterized by comprising:

a plurality of switching elements;

means for connecting switching control terminals of the switching elements commonly to one word line;

a timing control circuit including delay elements, connected between the switching control terminals and the word line, for supplying read-out signals from the word line sequentially to the switching control terminals with predetermined delay times corresponding to the contents of information; and means for sequentially reading out information from the switching elements along a time base in accordance with read-out signals supplied to the delay elements, wherein the information is stored along the time base by combining together the delay elements and switching elements.

This invention provides a semiconductor storage apparatus characterized by comprising:

a plurality of memory cell transistors formed on a semiconductor substrate;

one word line;

a delay circuit connected at one end to the word line and having a plurality of series-connected resistive elements;

means for connecting a switching control terminal of the respective memory cell transistor to a corresponding intermediate connection point-between the sequentially series-connected resistive elements; and means for sequentially reading out information from the memory cell transistors along a time base in accordance with a read-out signal supplied to the word line, wherein the information is stored along the time base by combining together the delay circuit and memory cell transistors.

According to the information storage apparatus of the present invention, multi-bit information stored in the memory elements can be taken out continuously in a time sequence with the use of one word line and the multi-bit information is latched to, for example, a register, as required, and can also be taken as parallel plural-bit information.

In order to achieve the above-mentioned object, the present invention provides a time-difference reading-out mask ROM apparatus characterized by comprising:

a semiconductor substrate of a first conductivity type;

first and second semiconductor regions of a second conductivity type formed in the semiconductor substrate of the first conductivity type at a predetermined interval relative to each other;

a plurality of gate electrodes so provided over the semiconductor substrate with an insulating film therebetween as to form memory transistors each situated astride between the first and second semiconductor regions; and delay lines having predetermined resistive values and formed over the gate electrodes in such a state that the gate electrodes are mutually electrically connected to each other, wherein information is stored along a time base by combining together the delay lines and memory transistors.

Further, the present invention provides a time-difference reading-out mask ROM apparatus characterized by comprising:

a semiconductor substrate of a first conductivity type;

at least first, second and third semiconductor regions of a second conductivity type formed in the semiconductor substrate at predetermined intervals relative to each other;

first and second gate electrode groups so provided over the semiconductor substrate with an insulating film interposed therebetween as to form memory transistors astride between the first and second semiconductor regions and between the second and third semiconductor regions; and first and second delay lines having predetermined resistive values and formed over gate electrodes in a state to electrically connect together the corresponding gate electrodes of the first and second gate electrode groups, wherein the second semiconductor region is used commonly relative to the first and second gate electrode groups and the first and second delay lines and those associated memory transistors are combined together to allow information to be stored along a time base.

Further, the present invention provides a time-difference reading-out mask ROM apparatus characterized by comprising:

a semiconductor substrate of a first conductivity type;

a plurality of first semiconductor regions of a second conductivity type having a predetermined configuration and mutually formed at predetermined distances in the semiconductor substrate of the first conductivity type;

a second semiconductor region of the second conductivity type formed commonly around the first semiconductor regions of the first conductivity type at a predetermined distance from the first semiconductor regions;

a plurality of gate electrode groups so formed with an interposing insulating film created on the semiconductor substrate as to form memory transistors astride between the first and second semiconductor regions; and a plurality of delay lines having predetermined resistive values and formed in a manner to correspond to the first semiconductor regions over the gate electrodes in such a state as to mutually electrically connect the gate electrodes of the each gate electrode group, wherein the second semiconductor region is used commonly relative to the first semiconductor regions and the delay lines and those associated memory transistors are combined together to allow information to be stored along a time base.

According to the time-difference reading-out mask ROM apparatus of the invention, multi-bit information stored in the memory elements can be taken out continuously in a time sequence with the use of one word line and the multi-bit information is latched to, for example, a register, as required, and can also be taken as parallel plural-bit information.

A storage device of the present invention is characterized by comprising:

at least one switching element; and a delay element connected selectively to a switching control terminal and controlling switching of the switching element with a delay time corresponding to the contents of multi-valued information, wherein the multi-valued information is stored on a time base.

A multi-valued information storage apparatus of the present invention is characterized by comprising:

at least one switching element;

delay elements connected selectively to a switching control terminal of the switching element and controlling switching of the switching element with a delay time corresponding to the contents of multi-valued information; and means for sequentially reading out the multi-valued information from the switching element along a time base in accordance with a read-out signal supplied to the delay element.

A semiconductor storage apparatus of the present invention is characterized by comprising:

a plurality of memory cell transistors formed on a semiconductor substrate;

a plurality of delay elements connected to switching control terminals of the corresponding memory cell transistors and controlling switching of the memory cell transistors with delay times corresponding to the contents of multi-valued information; and means for sequentially reading out the multivalued information from the memory cell transistors along a time base in accordance with a read-out signal supplied to the delay elements.

A semiconductor storage apparatus of the present invention is characterized by comprising:

a plurality of memory cell transistors formed on a semiconductor substrate;

a plurality of delay elements selectively connected to switching control terminals of the corresponding memory cell transistors and controlling switching of the memory cell transistors with delay times corresponding to the contents of multi-valued information; and means for sequentially reading out the multivalued information from the memory cell transistors along a time base in accordance with a read-out signal supplied to the delay elements.

A semiconductor storage apparatus of the present invention is characterized by comprising:

a plurality of memory cell transistors formed on a semiconductor substrate;

a plurality of delay elements selectively connected to switching control terminals of corresponding memory cell transistors and controlling switching of the memory cell transistors with delay times corresponding to the contents of multi-valued information;

a plurality of word lines for supplying read-out signals to the switching control terminals of the corresponding memory cell transistors through the corresponding delay elements; and means for allowing signals which are output from the memory cell transistors to be read out as the multi-valued serial information sequentially at a predetermined time along a time base in accordance with the read-out signal supplied to the delay elements.

A method for operating a multi-valued information storage apparatus according to the present invention is characterized by comprising the steps of:

delaying a control signal supplied to a switching control terminal of a switching element by an integral multiple of a period of a read-out clock and allowing signals which appear at an output terminal of the switching element to be sequentially read in serial form in synchronism with the read-out clock whereby multi-valued information is read out in serial form from the switching element along a time base.

According to the multi-valued information storage apparatus of the present invention, the multi-valued information can be read out in serial form from the switching element on a time base by delaying a control signal supplied to the switching control terminal of the switching element, by a predetermined time, by the delay element, and reading out signals appearing at the output terminal of the switching element at a predetermined time and taking out them in serial form.

In order to achieve the above-mentioned object the present invention provides an information storage apparatus characterized by comprising:

a plurality of bit lines;

at least one word line arranged in a direction to cross the bit lines;

a plurality of delay elements each connected to a crosspoint between the bit lines and the word line;

electric current control means for allowing electric currents to flow in the delay elements, respectively, in a predetermined direction only; and means for detecting plural-bit information appearing at the bit lines at a predetermined time in accordance with a read-out signal applied to the word line;

wherein the plural-bit information is stored by combining together the delay elements and electric current control means.

Further, the present invention provides an information storage apparatus characterized by comprising:

a plurality of bit lines;

at least one word line arranged in a direction to cross the bit lines;

a first memory element connected to a crosspoint between a selected one of the bit lines and the word line and having a first resistive element;

a second memory element connected to a crosspoint between the other bit line of the bit lines and the word line and having a second resistive element different in resistive value from the first resistive element;

electric current control means for making electric current flow in the first and second memory elements respectively in a predetermined direction only; and means for detecting multi-valued information appearing at a predetermined time at the word line in accordance with the read-out signal applied to the word line, wherein the multi-valued information is stored by the first and second resistive elements and electric current control means.

Further, the present invention provides an information storage apparatus characterized by comprising:

a plurality of bit lines;

contact areas provided at corresponding bit lines;

diodes formed in the corresponding contact areas;

a resistive material selectively buried in the contact areas so as to be connected to the diode;

a plurality of bit lines arranged in a direction to cross the word lines and connected directly or via the resistive material to the contact area; and means for detecting a potential variation appearing at a predetermined time at the bit line in accordance with a read-out signal applied to the word line, wherein the information is stored by combining together the diodes and resistive material.

Further, the present invention provides an information storage apparatus characterized by comprising:

at least one bit line;

a plurality of word lines arranged in a direction to cross the bit line;

a plurality of delay elements connected to crosspoints between bit line and word lines and having at least three kinds of delay times;

electric current control means for allowing electric current to flow in the delay elements in a corresponding predetermined direction only; and means for detecting information appearing at least three different timings at the bit lines in accordance with a read-out signal applied to the word lines;

wherein the information is stored at a predetermined timing along a time base by combining together the delay elements and electric current control means.

A method for operating an information storage apparatus having resistances of different values connected between one word line and a plurality of bit lines, comprising the steps of delaying signals flowing between the word line and the plurality of bit lines in accordance with an access signal supplied to the word line, by a predetermined period in accordance with the different resistive values, and reading out the delayed signals as information at a predetermined timing.

According to the present invention, the plural-bit information stored is obtained from a plurality of bit lines in accordance with an input signal supplied to a word line, by allowing delay amounts of signals flowing between the word line and the bit lines to vary in accordance with the values of the resistances of the memory elements and comparing the input signal with an output signal appearing after the passage of a predetermined period of time and, when a time difference between the input signal and the output signal is below a predetermined value, recognizing it as "1" and, when it is above that predetermined value, as "0".

Further, it is possible to record the multi-valued information in the respective memory elements by preparing resistors having three or more resistive values and reading out these values at corresponding different timings.

Further, the present invention provides an information storage apparatus characterized by comprising:

a plurality of bit lines;

at least one word line arranged in a direction to cross the bit lines;

a plurality of memory elements connected at crosspoints between the bit lines and the word line and including resistors having resistive values of substantially zero or substantially infinity; and means for detecting information of the memory elements appearing at a predetermined time at the bit lines in accordance with an access signal applied to the word line.

Further, the present invention provides an information storage apparatus characterized by comprising:

a plurality of bit lines;

a plurality of word lines arranged in a direction to cross the bit lines;

a plurality of memory elements respectively connected to crosspoints between the bit lines and the word lines and including resistors having resistive value of substantially zero or substantially infinity; and means for reading out plural-bit information from the bit lines at a predetermined time in accordance with an access signal applied to a selected word line or detecting information of the memory elements appearing at the word lines through the memory elements connected to selected bit lines.

Further, the present invention provides information storage apparatus characterized by comprising:

a plurality of bit lines;

a plurality of contact areas formed at the bit lines;

diodes formed at the contact areas;

conductive layers selectively buried at the contact areas to be connected to the diodes;

a plurality of word lines arranged in a direction to cross the bit lines and connected to the contact areas via insulating layers or the conducting layers; and means for reading out plural-bit information from the bit lines at a predetermined time in accordance with an access signal applied to a selected word line, wherein the plural-bit information is stored by combining together the conducting layers and insulating layers.

Further, the present invention provides a method for operating an information storage apparatus having memory elements with resistors having resistive values of substantially zero or substantially infinity connected between one word line and a plurality of bit lines, characterized by reading out signals appearing at the bit lines, at a predetermined time, in accordance with an access signal supplied to the word line and reading out them as plural-bit information on a time base.

In the arrangement thus arranged, the presence or absence of signals flowing between the word line and bit lines is detected in accordance with an access signal supplied to the word line and comparison is made between the input access signal and the output signal and when the output signal is present it is recognized as "1" though depending upon its definition and when the output is not present it is as "0" though depending upon its definition, whereby the plural-bit information is obtained from the memory elements at those crosspoints relative to the bit line in accordance with the access signal supplied to the word line.

BRIEF DESCRIPTION OF DRAWINGS

FIG. 1 is a view showing one example of a circuit configuration of a conventional mask ROM;

FIG. 2 is a circuit arrangement according to one embodiment of the present invention;

FIGS. 3A to 3H are signal waveforms for explaining the operation of the embodiment of FIG. 2;

FIG. 4 is a circuit diagram for explaining another embodiment of the present embodiment;

FIGS. 5A to 5C are signal waveform diagrams for explaining the operation of the embodiment of FIG. 4;

FIG. 6 is a signal waveform diagram for explaining the operation of the FIG. 4 embodiment;

FIG. 7 is a signal waveform diagram for explaining the operation of the FIG. 4 embodiment;

FIG. 8 is a block diagram showing a whole circuit including the operation circuits of the embodiments of FIGS. 2 and 4;

FIG. 13 is a circuit diagram showing an equivalent circuit of the layout shown in FIGS. 11 and 12;

FIG. 14 is a modified layout shown in FIG. 11;

FIG. 15 shows a combination layout including a plurality of layouts each being as shown in FIG. 14;

FIG. 16 shows a modification of the layout shown in FIG. 11;

FIG. 20 shows a modification of the layout shown in FIG. 12;

FIG. 21 shows a combination layout, of a plurality of layouts each being shown in FIG. 20;

FIG. 22 shows a modification of the layout shown in FIG. 12;

FIG. 23 shows a combination layout of a plurality of layouts each being shown in FIG. 22;

FIG. 26 is a circuit arrangement showing another embodiment of the present invention;

FIG. 28 is a circuit block diagram including an operation circuit of the FIG. 26 embodiment;

FIG. 29 is a circuit diagram showing one example of a sense amplifier enable signal generating circuit in FIG. 28;

FIG. 34 is a circuit arrangement showing a further embodiment of the present invention;

FIG. 37 is a view showing a simplified cell circuit for explaining the operation of this embodiment;

FIGS. 38A to 38E are timing charts for explaining the operation of the FIG. 37 embodiment;

FIG. 39 is a block diagram showing, in detail, one example of an arrangement of a detector shown in FIG. 35;

FIGS. 40A to 40F are timing charts for explaining an operation of a circuit of FIG. 39;

FIGS. 41A to 41E are timing charts for explaining a read-out operation of a memory shown in FIG. 34;

FIGS. 42A to 42H are timing charts for explaining a read-out operation of the memory shown in FIG. 34;

FIGS. 43A to 43C are timing charts for explaining a read-out operation of the memory shown in FIG. 34;

FIGS. 44A to 44D are plan views showing one example of a circuit of the FIG. 34 embodiment which is formed on a semiconductor substrate;

FIG. 48 shows a schematic diagram showing a part of a memory read-out circuit of the embodiment shown in FIG. 46;

FIG. 49 is a timing chart for explaining an operation of the embodiment shown in FIG. 46;

FIG. 50 is a schematic diagram of a circuit according to still another embodiment of the present invention;

FIGS. 53A to 53D are views showing the process of forming a circuit of the FIG. 50 embodiment which is formed on a semiconductor substrate.

BEST MODE OF CARRYING OUT THE INVENTION

Figure 9:
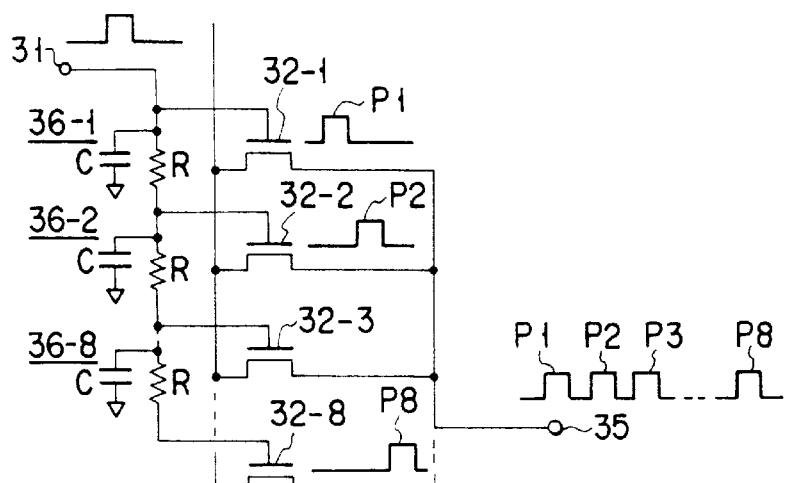
FIG. 9 is a circuit diagram showing one example of a sense amplifier enable signal generating circuit.

The embodiments of the present invention will be explained below with reference to the accompanying drawings.

FIG. 2 is a circuit diagram showing a portion of a memory cell of a mask ROM according to a first embodiment of the present invention.

In FIG. 2, eight MOS transistors T1 to T8 are comprised of transistors for programming. These transistors T1 to T8 are each connected at one electrode, that is, a drain electrode, to a Vcc source through a bit line BL1 and at the other electrode, that is, a source electrode, to ground. A word line WL1 is commonly connected to the transistors T1 to T8.

To the word line WL1 is connected a delay circuit DL comprised of a plurality of series resistors R1 to R7. A connection point between the resistors R1 and R2 is connected to a gate of the transistor T2. Similarly, a connection point between the resistors R2 and R3 is connected to a gate of a transistor T3; a connection point between the resistors R3 and R4 a gate of a transistor T4; a connection point between the resistors R4 and R5 a gate of a transistor T5; a connection point of the resistances R5 and R6 a gate of a transistor 6 and a connection point of the resistors R6 and R7 a gate of a transistor T7. The other end of the resistance R7 is connected to the gate of a transistor T8. Here, the resistors R1 to R7 serve as signal delay elements and have their respective resistive values equal to each other so that their delay times are substantially equal to each other. Further, those transistors T1 to T8 have their fixed storage contents corresponding to data "1" and "0" depending upon whether or not they are of an enhancement type or of a depletion type resulting from the injection of ions for threshold level variation. In this way, the storage contents of the mask ROM of the present embodiment are fixed.

Referring to FIGS. 3A to 3H, explanation will be given below about the operation principle on which the storage contents of the mask ROM having multi-bit information stored therein and corresponding to the embodiment of FIG. 2 are read out. An input access signal supplied to the word line WL1 rises at time t1. This signal is supplied directly to the gate of the transistor T1 and, since the transistor T1 is of a depression type, it has been turned ON and a Vcc power supply voltage has been output. This is defined as a "0" output to I/O1, as shown in FIG. 3A.

On the other hand, due to the resistor R1, an access signal supplied to the word line WL1 is supplied as an input signal to the gate of the transistor T2 at time t2 as shown in FIG. 3B which is delayed from a reference time t1 by a time constant resulting from the resistance level of the resistor R1. The transistor T2, being of an enhancement type, is turned ON at time t2 and a potential on a bit line becomes zero at time t2 as shown in FIG. 3B and a "1" output I/O2 is defined. Similarly, at times t3 to t8 the respective fixed storage contents are sequentially output at substantially equal intervals from the transistors T3 to T8 as shown in FIGS. 3A to 3H. Here, since the transistors T6 and T8 are, like the transistor T1, of the depletion type, the Vcc output does not vary and the output contents are specified if output voltages are detected at times t6 and t8. If in this way those outputs at times t1 to t8 are integrated, an 8-bit serial output "01111010" emerges as shown in FIG. 2 in accordance with one input to one word line WL1. That is, the conventional counterpart needs eight word lines so as to obtain an eight-bit output, while according to the present embodiment it is only necessary to provide a single word line so that a memory cell area can be reduced by omitting remaining word lines.

A more practical embodiment than the FIG. 2 embodiment will be explained below with reference to FIG. 4. In FIG. 4, explanation of elements corresponding to those of the FIG. 2 embodiment are omitted with the same reference numerals attached thereto. In FIG. 4, the embodiment is different from the FIG. 2 embodiment in that the source electrodes of the transistors T1 to T8 are connected to a source line S and hence grounded.

In the embodiment of FIG. 4, an input signal of a pulse waveform supplied to the gate of the transistor T1 at time t1 is sequentially delayed and supplied at times t2, t3, ..., t8 to the gates of the transistors T2 to T8 as shown in FIG. 5A. Depending upon a depletion type or enhancement type the outputs of the transistors T1 to T8 are generated in "0" or "1" form, that is, as a serial output "01111010" in an equally divided way on a time base as shown in FIG. 5B. Stated in a general way, an n-th transistor Tn generates an output at an n-th time and a signal "1" or "0" is detected at a corresponding time.

Since, however, the embodiment shown in FIG. 4 is integrated with the use of a single source line SL, it is difficult to detect I/O output as a voltage output. This can be detected by the method as will be set out below. That is, the level of current flowing through the bit line BL1 to which all the transistors T1 to T8 are connected is increased at a step of, for example, 1 μA as shown in FIG. 5C as the number of those ON-state transistors is increased as shown in FIG. 2. This current can be detected through a current-amplification type sense amplifier SA connected to the bit line BL1. Here, since the time at which the input is applied to the respective transistor is substantially determined, if a current amount at a predetermined time is seen, then it is possible to decide whether the transistor corresponding to that time is turned ON or OFF, that is, "1" or "0".

Since the current levels obtained at times t1 to t8 varies at steps of 1 $\mu$A as shown in FIG. 5C, comparison is made sequentially between the output current levels of adjacent transistors as shown, for example, in FIG. 6 in accordance with clock signals CL1 to CL8. Since the output current increase is zero relative to the clock CL1, there is no output difference between it and its previous one, so that I/O1="0". Relative to the clock CL12 an output current is, for example, 1 $\mu$m and an output difference of a predetermined level is obtained relative to a current level at the clock CL1 and hence I/O1="1". In this way, each time the clocks CL3 . . . CL8 are generated, a difference from their immediately previous current level is detected as to whether or not it is a predetermined level.

FIG. 7 is a timing chart showing a relation among an address input to the mask ROM of the FIG. 4 embodiment, clock signals and data outputs I/O1 . . . I/O8 read out in accordance with the clock signals.

A general circuit arrangement for reading the serial multi-bit information from the mask ROM arranged as shown in FIG. 4 is as indicated by a block diagram, for example, in FIG. 8. In FIG. 8, an address signal of a memory is supplied to an input buffer 21. The output signal of the input buffer 21 is supplied to a decoder 22 where it is decoded. And a given word line, such as WL1, is selected.

The output signal of the input buffer 21 is supplied to an input terminal of a sense amplifier enable signal generating circuit 23. As set out above, the sense amplifier enable signal generating circuit 23 is adapted to generate read-out clocks synchronized to respective address inputs corresponding to memory cells T1 to T8 connected to the word line WL1. As a result, eight-bit serial information "01111010" can be read out from the sense amplifier 24 as shown in FIG. 4.

FIG. 9 shows one form of the sense amplifier enable signal generating circuit 23 and a pulse signal is input from the input buffer 21 to the input terminal 31. The gate of the MOS transistor 32-1 is connected to the input terminal 31 and a CR delay circuit 36-1 is connected at one end to the input terminal 31 and has the same time constant as those of the resistors R1 to R8 in FIGS. 2 and 4. The other end of the CR delay circuit 36-1 is connected to the gate of the next stage transistor 32-2 and connected to one end of the CR delay circuit 36-2 having substantially the same time constant as that of the CR delay circuit 36-1. The other end of the CR delay circuit 36-2 is connected to the gate of the next stage transistor 32-3. The sources of the transistors 32-1, 32-2 and 32-3 are connected from an output terminal 35 to the sense amplifier 24. The outputs of the CR delay circuits 36-1 to 36-8 of the same configuration are sequentially supplied to the gates of the transistors 32-1 to 32-8.

In the circuit arrangement shown in FIG. 9, when a pulse signal is supplied to the input terminal 31, an output P1 is immediately obtained from the transistor 32-1 and then an output P2 is obtained from the transistor 32-2 after the lapse of a predetermined time corresponding to the delay time of the CR delay circuit 36-1. After the lapse of a predetermined time corresponding to the delay time of the CR delay circuit 36-2 an output P3 is obtained from the transistor 32-3. Similarly, after the lapse of predetermined times corresponding to the delay times of the CR delay circuits 36-1 to 36-8, outputs P1 to P8 are sequentially obtained. These outputs P1 to P8 are supplied as a read-out clocks to the sense amplifier 24 and a serial output "01111010" as shown in FIGS. 2 and 4 is obtained.

Figure 10:
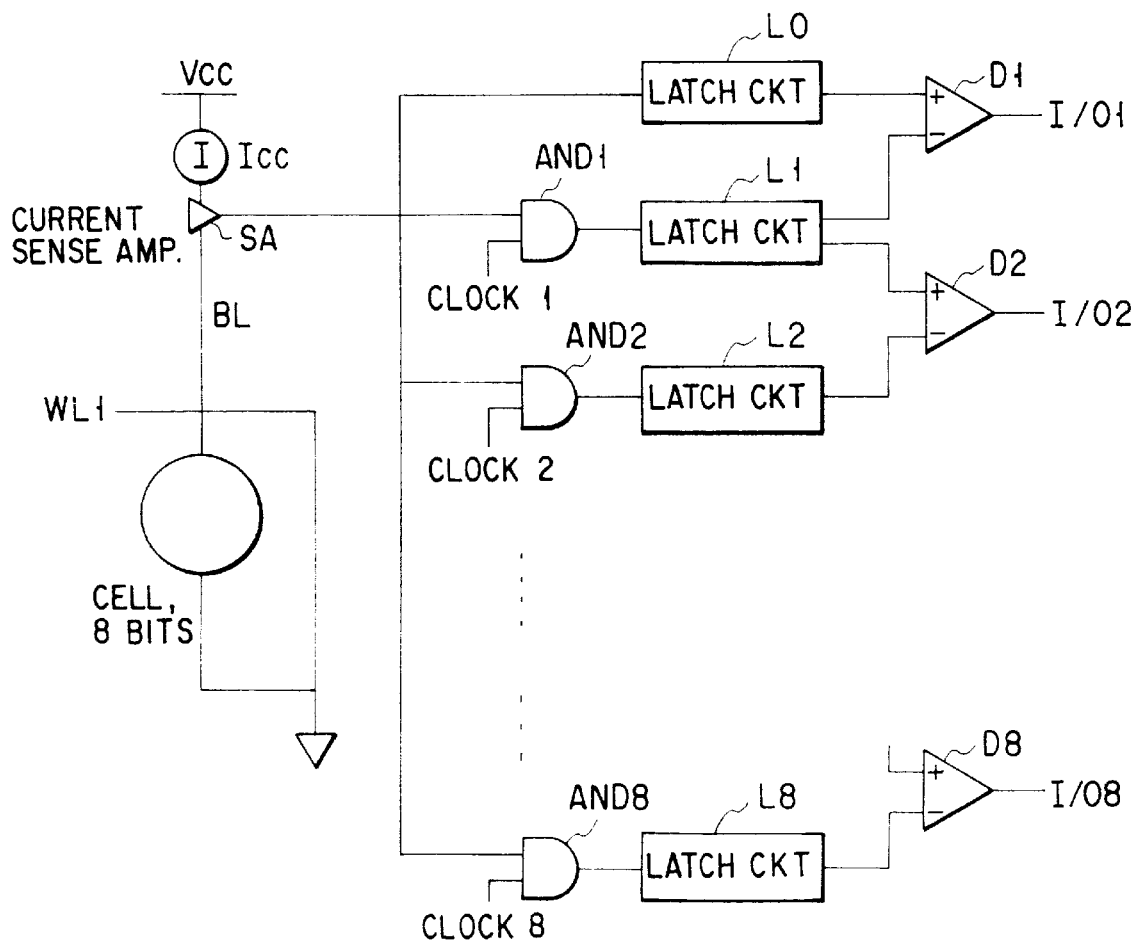
FIG. 10 is a block diagram showing one example of an output detection circuit of a circuit arrangement of the FIG. 4 embodiment.

An information read-out method of the FIG. 4 embodiment as explained in FIGS. 5, 6 and 7 can be realized by, for example, a circuit of FIG. 10. In FIG. 10, a current output as shown in FIG. 5C which is produced from the current sense amplifier SA is supplied to a first latch circuit L0 and to one-end sides of AND circuits AND1 to AND8. Clocks CL1 to CL8 are supplied to other-end sides of the AND circuits AND1 to AND8, the outputs of which are supplied to the input ends of respective latch circuits L1 to L8. The outputs of those mutually adjacent latch circuits L0 and L1, L1 and L2, L7 and L8 are supplied to the input ends of differential amplifiers D1 to D8 where read-out outputs I/O1 to I/O8 are fixedly obtained.

Then the operation of the circuit of FIG. 10 will be explained below. When a read-out signal is supplied to the word line WL0, an output from the current sense amplifier SA prior to being supplied with a first clock CL1 is latched to the latch circuit 10. When the first clock CL1 is supplied, an output from the current sense amplifier SA is supplied to the AND circuits AND1 to AND8 but, out of these, the AND circuit AND1 only has its gate opened by the first clock CL1 and an output from the current sense amplifier SA is latched to the latch circuit L1. Similarly in this way, each time the clock pulse is supplied an output from the current sense amplifier SA is latched to the corresponding latch circuit through the corresponding AND circuit. The outputs of those mutually adjacent latches L0 to L1, L1 and L2, . . . , L7 and L8 are supplied to the input ends of the differential amplifiers D1 to D8 and read out as shown in FIG. 7 and the outputs I/O1 to I/O8 are fixedly obtained from the differential amplifiers D1 to D8.

Needless to say, the memory sections of FIGS. 2 and 4 can be formed on the same semiconductor substrate as the sense amplifier circuit of FIGS. 8 and 9 or the circuit of FIG. 10.

Figure 11:
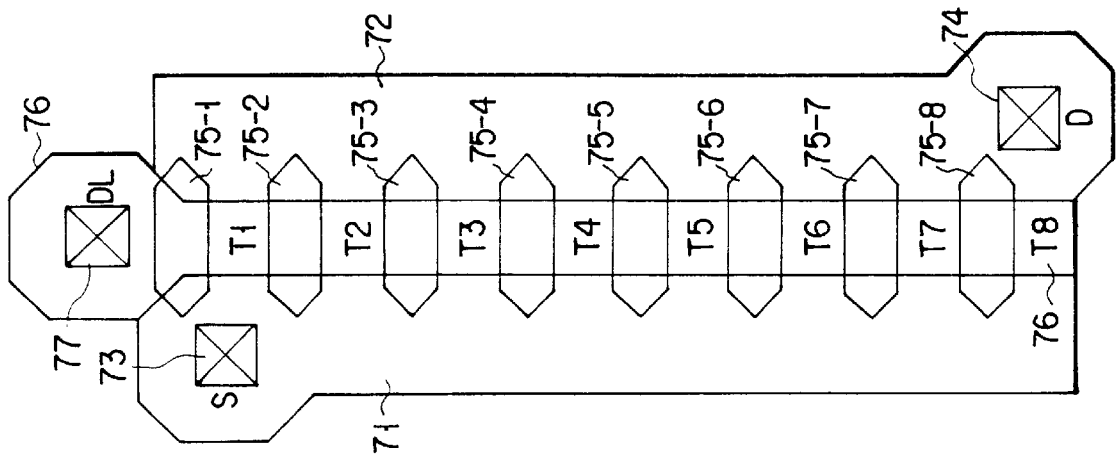
FIG. 11 is a layout showing one example of the FIG. 4 embodiment's circuit formed on a semiconductor substrate.

The circuit of the FIG. 4 embodiment can be embodied with a layout of each element as shown in FIG. 11. In FIG. 11, mutually opposite, long source region 71 and drain region 72 are formed in surface portions of a semiconductor substrate. As a result, the bit line BL1 of FIG. 4 is included in the drain region 72 and the source line SL is included in the source region 71. A source contact 73 is formed at one end of the source region 71 and a drain contact 74 is formed at one end of the drain region 72.

Between the mutually opposite, long source region 71 and drain region 72, eight gate electrodes are formed at predetermined intervals in those positions corresponding to channel regions of transistors T1 to T8 through a gate oxide (not shown) in a manner to be isolated by LOCOS areas 75-1 to 75-8. Here, the transistors T1, T6 and T8 are such that ion injection is made at a predetermined dosage in the channel regions to make them of a depletion type.

Further, a silicide resistance layer 76 corresponding to the delay circuit DL of FIG. 4 is formed along and between the source region 71 and the drain region 72 in an overlying relation to the gate electrodes and LOCOS areas 75-1 to 75-8. This silicide resistance layer 76 can be readily formed by first forming, for example, a polysilicon layer and changing it to a silicide with a metal such as tungsten. At this time, if a dosage is such as to have a resistance level uniformly distributed throughout the whole length of the silicide resistance layer 76, resistances of substantially equal resistance level are each connected across the respective gate electrodes. A contact 77 is formed at one end of the silicide resistance layer 76 near the transistor T1 and the layer is connected via a word line, not shown, through the contact 77. That is, the resistors R1 to R7 of FIG. 4 are connected to the gate electrodes of the transistors T2 to T8.

Figure 12:
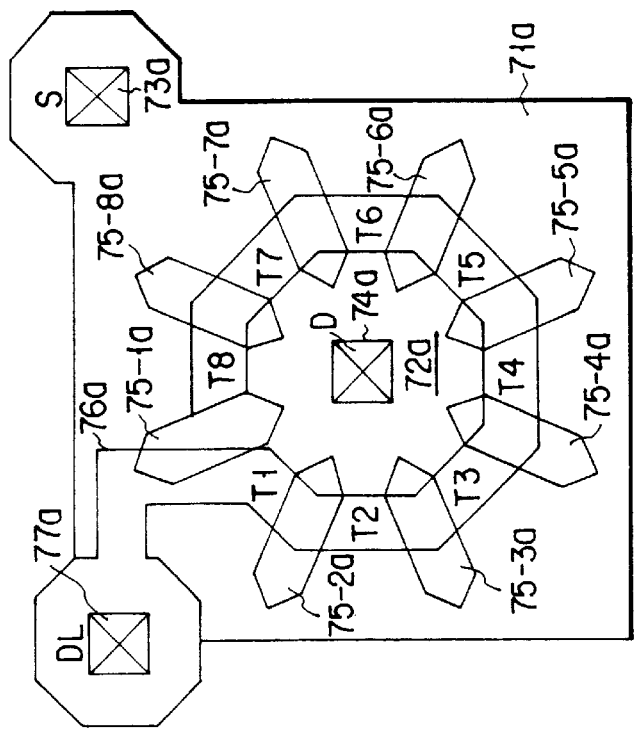
FIG. 12 is a layout showing another example of the FIG. 4 embodiment's circuit formed on a semiconductor substrate.

The circuit layout of FIG. 11 can be varied as shown in FIG. 12. In the circuit layout of FIG. 12, a substantially octagonal drain region 72a is formed at the center and the center drain region is surrounded with a source region 71a with the channel region interposed therebetween. Contacts 73a and 74a are provided at the source region 71a and drain region 72a, respectively.

The gate electrodes of transistors T1 to T8 and LOCOS areas 75-1a to 75-8a are arranged radially around the contact 74a in a substantially evenly divided way. A silicide resistance layer 76a is formed in an overlying relation to these gate electrodes and LOCOS areas 75-1a to 75-8a and its contact 77a is connected to a word line not shown. The circuit of FIG. 4, being laid out as shown in FIG. 12, can have its area further reduced than in the example of FIG. 11.

In the arrangements achieved as shown in FIG. 11 or 12, a floating capacitance is created between the silicide resistance layers 76, 76a and the semiconductor substrate and, as a result, electrostatic capacitors are connected in parallel with the resistors R1 to R8 in the embodiment of FIG. 4. FIG. 13 shows a state in which electrostatic capacitors C thus created are connected parallel to the resistors R1 to R8. Although in the embodiment shown in FIG. 4 a delay amount relative to the access signal which is supplied to the word line WL1 is determined with a time constant by the resistance, it is determined by a CR time constant in the embodiment of FIG. 13.

Although in the embodiment as explained above, eight-bit information has been explained as being written into the eight transistors, if the number of transistors and of their associated delay elements are increased or decreased, it is possible to record and read out information of desired bit number.

It is evident that the present invention can equally be utilized for various types of multi-bit ROM circuits. Needless to say, various switching elements can also be used in place of the programmable transistor.

According to the embodiments as set out in detail above, through the sequential delaying of a signal applied from one word line to the gates of memory elements, for example, program transistors, the respective memory elements can be sequentially operated and multi-bit information stored in the plurality of memory elements can be continuously taken out in a time sequence. By doing so, there are provided an information storage apparatus and its associated operation method, according to which it is possible to largely save the number of the word lines and output signal lines and hence improve the integration density of, for example, a semiconductor integrated storage apparatus.

Further, the circuit layout of FIG. 11 can be modified as shown in FIGS. 14 to 17.

The layout of FIG. 14 shows an information memory cell with eight bits set as one unit. In practice, a mask ROM apparatus is manufactured by forming a plurality of such unit information memory cells on a semiconductor substrate as shown in FIG. 15.

In FIG. 15, three semiconductor regions 121A, 122P. and 122B are formed in a semiconductor substrate (not shown) mutually at predetermined distances. As shown in FIG. 15, a source contact 123A and drain contact 124A are formed respectively in the semiconductor regions 121A and 122A as in the case of FIG. 14, LOCOS areas 125-1A to 125-8A are formed with the gate electrodes interposed, and a silicide resistance layer 126A corresponding to the FIG. 2 delay circuit DL is formed along and between the source region 121A and the drain region 122A in an overlaying relation.

A source contact 123B is formed in a position corresponding to the source contact 123A of the semiconductor region 122A and a drain contact 124B is formed in a position of the semiconductor region 122B corresponding to the drain contact 124A formed in the semiconductor region 122A. Between the semiconductor regions 122A and 122B the gate electrodes are formed between LOCOS areas 125-1B to 125-8B and a silicide resistance layer 126B corresponding to the FIG. 2 delay circuit DL is formed along and between the semiconductor regions 122A and 122B in an overlying relation. Word line contacts 127A and 127B are provided respectively on one-end sides of the silicide resistance layers 126A and 126B. In this way, first and second eight-bit cells Ce1 and Ce2 are provided. The other-end sides of the silicide resistance layers 126A and 126B further extend via other word line contacts 127C and 127D overlying the LOCOS areas 125-8A and 125-8B to provide other third and fourth eight-bit cells Ce3 and Ce4.

The third eight-bit cell Ce3 is formed between two semiconductor regions 121C and 122C and a silicide resistance layer 126C is formed in an overlying relation to the gate electrodes between LOCOS areas 125-1C, 125-2C, 125-3C, . . . . Source regions 123C and 123D are formed at two semiconductor regions 121C and 122C. Similarly, the fourth eight-bit cell Ce4 is provided between the two semiconductor regions 122C and 122D with a silicide resistance layer 126D formed in an overlaying relation to the gate electrodes and LOCOS areas 125-1D, 125-2D, 125-3D, . . . . Thus the drain contact 124A is connected in common between the two eight-bit cells Ce1 and Ce2.

When the two eight-bit cells Ce1 and Ce2 are mutually adjacently formed in the formation of the layout as shown in FIG. 15, the drain contact 124A can be created just in a midposition between the seven-th LOCOS areas 125-7A, 125-7B and eight-th LOCOS areas 125-8A, 125-8B.

Figure 17:
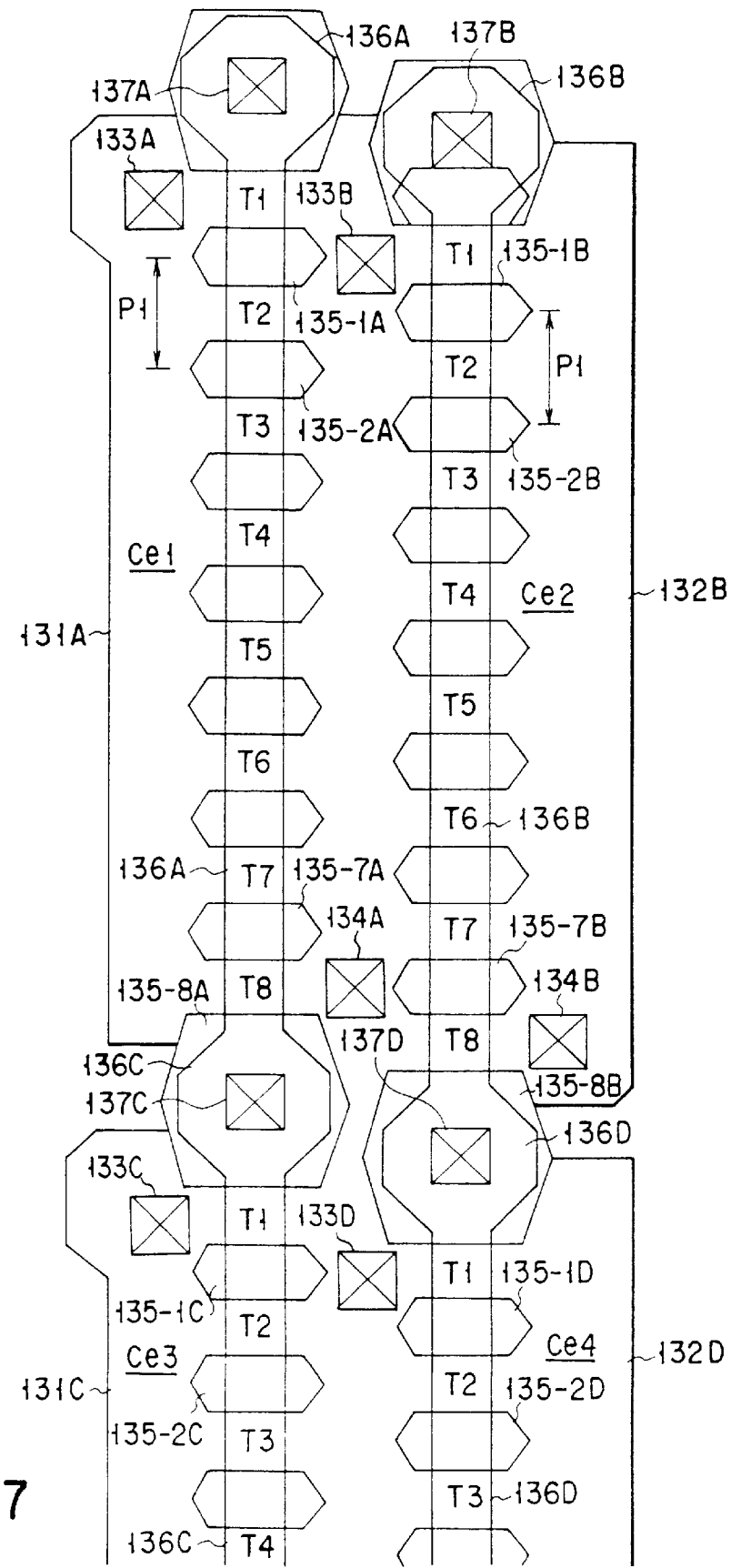
FIG. 17 shows a combination layout of a plurality of layouts each being shown in FIG. 16.

FIG. 16 shows one portion of another layout corresponding to the layout of the FIG. 14 embodiment and a practical layout is as shown in FIG. 17. The layout of FIG. 16 is the same as in FIG. 14 and like reference numerals are employed to designate corresponding parts and further explanation is omitted. The embodiment of FIG. 17 is different from that of FIG. 15 in that in the embodiment shown in FIG. 15 the gate electrodes, for example, the gate electrodes of two corresponding transistors in two parallel-connected. eight-bit cells Ce1 and Ce2 and LOCOS areas 125-1A and 125-1B are so formed as to be situated on the same line in a direction perpendicular to silicide resistance layers 126A, 126B while in the embodiment shown in FIG. 17 the gate electrodes, LOCOS areas 135-1A to 135-8A and overlying silicide resistance layer 136A are so formed as to be displaced by ½ pitches in a longitudinal direction to the gate electrodes, LOCOS areas 135-1B to 135-8B and overlying silicide resistance layer 136B.

In the embodiment shown in FIG. 17, for example, each forward end portion of the LOCOS areas in the eight-bit cell Ce2 confronts a portion between the LOCOS areas in the adjacent eight-bit cell Ce1, so that an interval between the adjacent two eight-bit cells can be made narrower than in the embodiment of FIG. 15. As a result, a resultant mask ROM can be more highly integrated.

Figure 18:
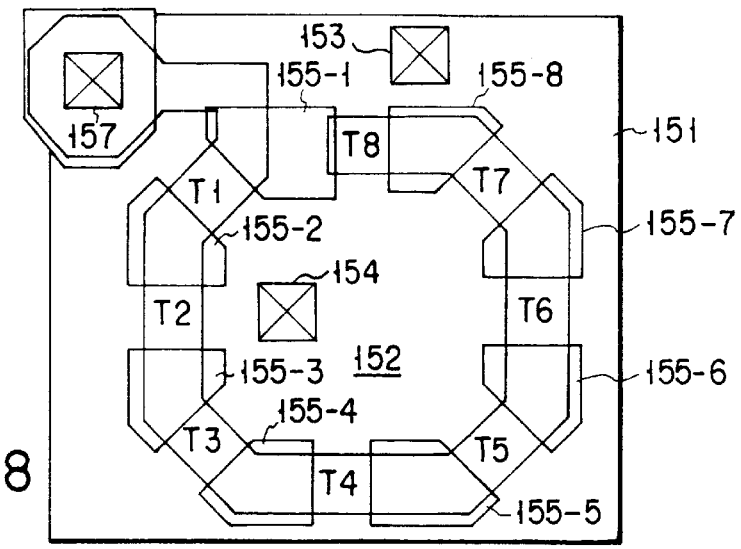
FIG. 18 shows a modification of the layout shown in FIG. 12.
Figure 19:
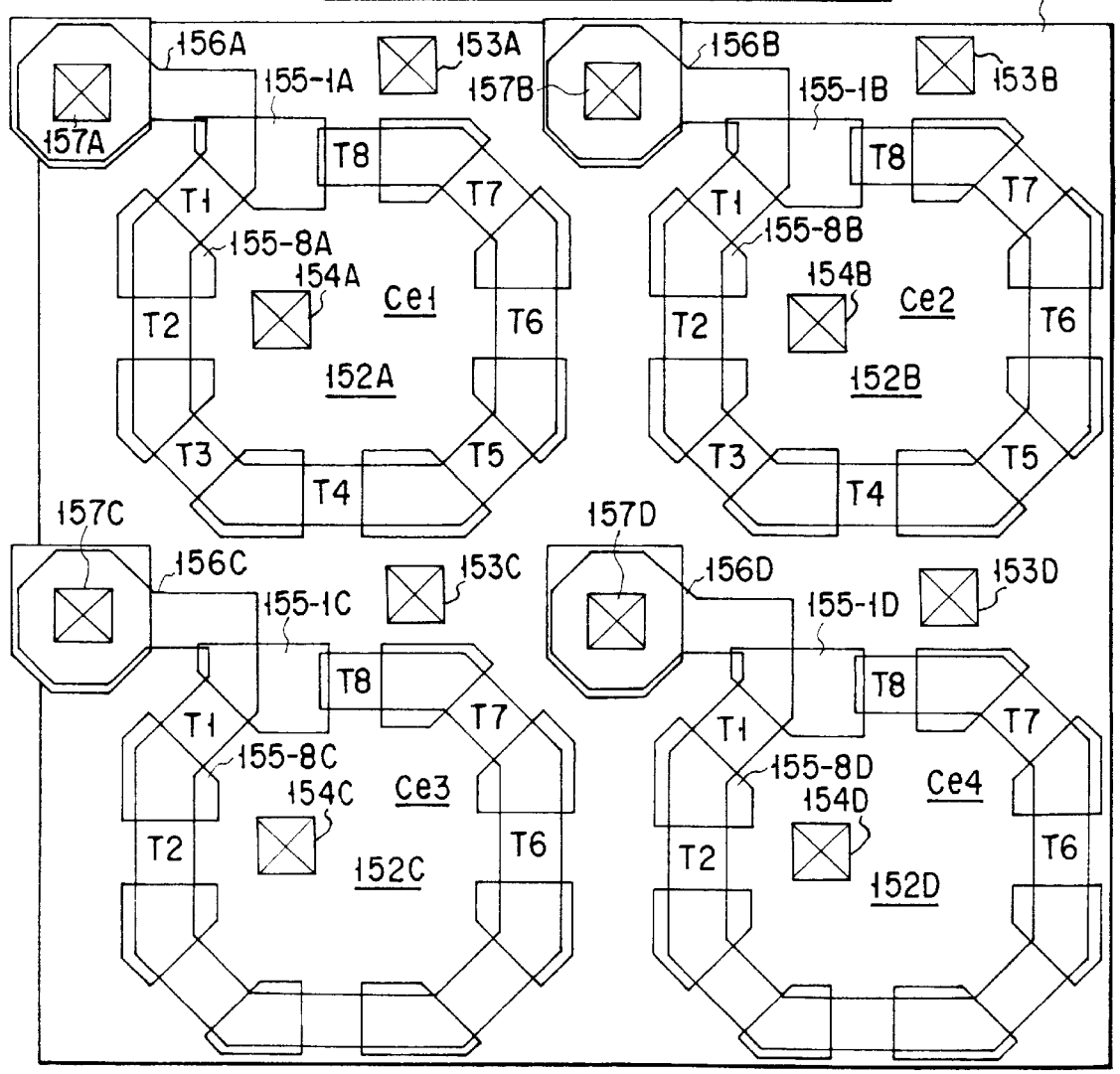
FIG. 19 shows a combination layout of a plurality of layouts each being shown in FIG. 18.

In the embodiment of FIG. 18 a source contact 153 is formed in an unoccupied position in a substantially square region 151, for example, in a position near the LOCOS area 155-8, in place of the source contact 73a which is projected from the region 71a in the example of FIG. 12. If one eight-bit cell is laid out into an octagonal configuration similar to a square configuration, a mask ROM apparatus can be so laid out, in actual practice, as to provide a very compact cell as shown in FIG. 19. The pattern of FIG. 18 is basically the same as that of FIG. 12 and any further explanation is omitted.

FIG. 19 shows an example where the four eight-bit cells of the basic structure as shown in FIG. 18 are formed as one unit on a semiconductor substrate. In this Figure, with respect to the conductivity type of the semiconductor substrate, polygonal drain regions 152A, 152B, 152C and 152D of the opposite conductivity type are formed as a matrix array in a mutually spaced-apart relation. Around a boundary of the polygonal drain regions 152A to 152D a source region 151 of the same conductivity type as those of the drain regions 152A to 152D is formed with a predetermined spacing left to provide channel regions. The source region 151 is formed in common among all the drain regions 152A to 152D. Drain contacts 154A 154D are formed on drain regions 152A . . . 152D, respectively, and source contacts 153A . . . 153D are provided at respective positions corresponding to the source contact 153 in FIG. 18. One-end sides of silicide resistance layers 156A . . . 156D of respective eight-bit cell Ce1 to Ce4 extend toward left upper corners of respective cell formation area with word line contacts 157A . . . 157D provided, respectively, at their forward end portions.

In the layout as shown in FIG. 19, any source contacts 153A to 153D and word line contacts 157A to 157D are provided through effective utilization of spaces at the cell formation areas and it is therefore, possible to effectively utilize the semiconductor substrate surface areas and, as a result, to manufacture a high integration-density mask ROM excellent in space factor.

A cell unit of FIG. 20 is an example where a word line contact corresponding to that situated outside of the silicide layer in an example of FIG. 18 is located inside of a silicide layer. In FIG. 20, at the central area of a first semiconductor region 161 of a square type a second semiconductor region 162 is formed with a channel region interposed and has the same conductivity type as that of the first conductivity type with source contact 163 and drain contact 164 provided at the corresponding regions. The configuration as set out above is the same as in FIG. 18 but it is different therefrom in that, in FIG. 20, a counterpart of the word line contact 157 formed at the forward end portion of the silicide layer 156 in FIG. 18 is formed as a word line contact 167 in the drain region 162 in a state isolated with an LOCOS layer 168. In comparison with an example of FIG. 18 an occupation area per eight bits is further decreased and a resultant mask ROM has its integration density further improved as a whole.

FIG. 21 shows an example where the unit cell of FIG. 20 is provided as a matrix array of four unit cells. As evident from FIG. 21, mutual close spacings among the four eight-bit cells Ce1 . . . Ce4 provide an improved integration density over the counterpart of FIG. 19.

FIG. 22 shows a layout of a unit cell according to another embodiment of the present invention. Here, the unit cell is different from that of FIG. 18 in that two source contacts 173 are formed on a diagonal line with. a word line contact 177 positioned relative to these source contacts. The other arrangement is the same as that of FIG. 18. With the unit cell configured as shown in FIG. 22, if four such cells Ce1 to Ce4 are arranged as shown in FIG. 23, only one word line contact 177 needs to be centrally provided relative to these four cells Ce1 . . . Ce4. A silicide layer 176 is branched in two directions from the word line contact 177, that is, in one branched direction relative to an area between the cells Ce1 and Ce3 and in the other branched direction relative to an area between the cells Ce2 and Ce4 with the one branch area sub-branched on a partway relative to the cells Ce1 and Ce3 and the other branch area sub-branched on a partway relative to the cells Ce2 and Ce4.

If there is a point symmetry relation relative to one word line contact 177 in such a manner, the respective cells also tend to provide no unbalance in terms of their electrical properties. As a result, there is less variation in characteristics among eight-bit cells in a ROM thus manufactured.

Figure 24:
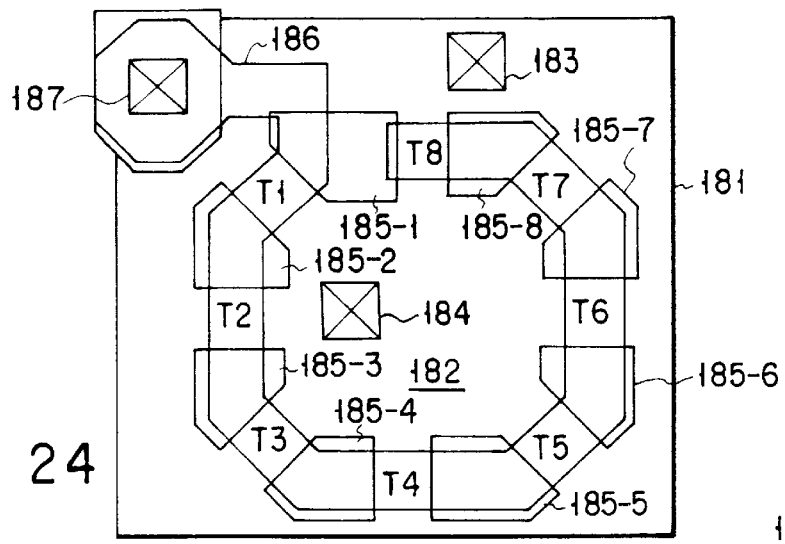
FIG. 24 shows another modification of the layout shown in FIG. 12.

FIG. 24 shows a layout of another unit cell. The layout is basically the same as that shown in FIG. 18. In FIG. 24, the gate electrodes of the transistors T1 to T8 and LOCOS areas 185-1 to 185-8 are arranged radially and substantially regularly from a drain region 182 toward an outside. Further, a silicide resistance layer 186 is formed in an overlying relation to these gate electrodes and LOCOS areas 185-1 to 185-8 and its contact 187 is connected to a word line, not shown.

Figure 25:
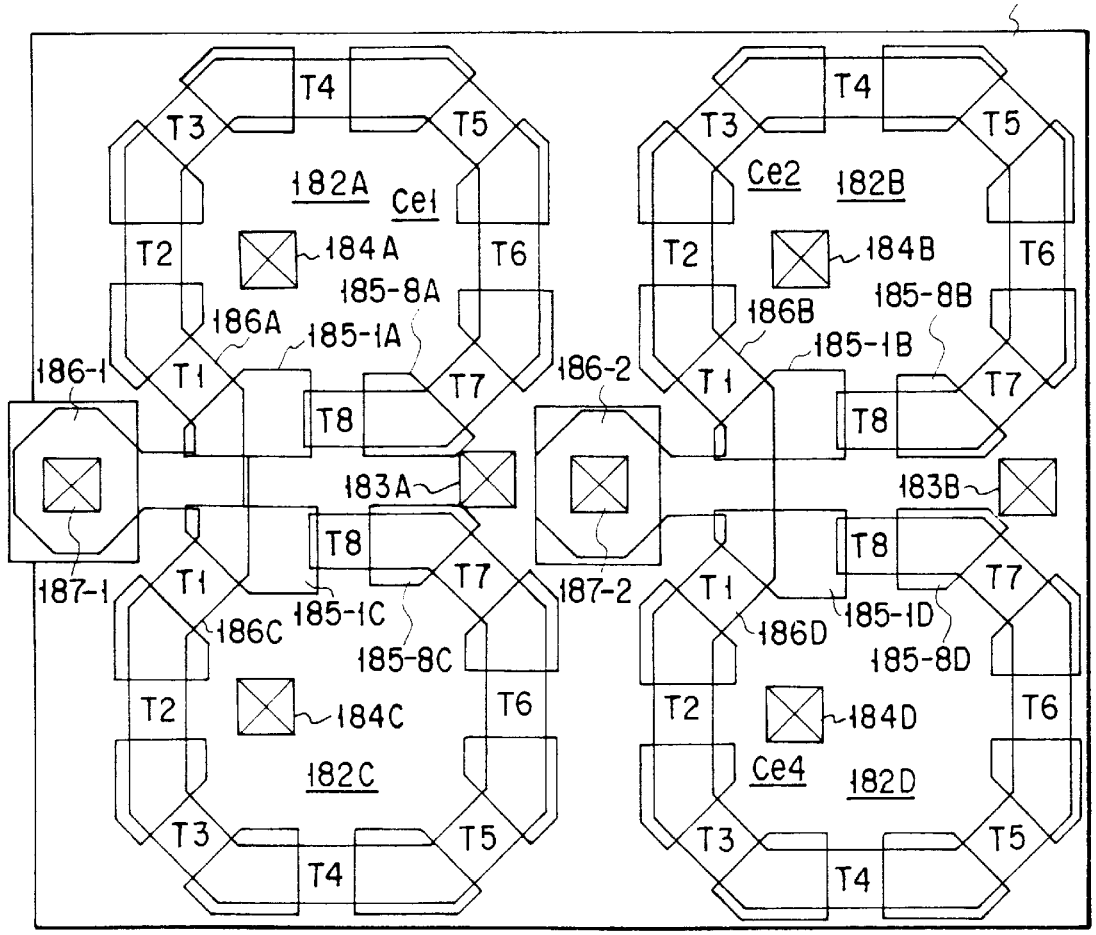
FIG. 25 shows a combination layout of a plurality of layouts each being shown in FIG. 24.

FIG. 25 is a layout conceived with the same idea as that of FIG. 23. Unit cells of a type as shown in FIG. 24 are arranged as shown in FIG. 25. Here, two cells Ce1 and Ce3 have a line-symmetrical relation to one silicide layer 186-1. One word line contact 187-1 is formed on a forward end of the silicide layer 186-1 and the other two cells Ce2 and Ce4 have a line-symmetrical relation to one silicide layer 186-2. A word line contact 187-2 is formed at a forward end portion of a silicide layer 186-2. In this way, the cells Ce1 and Ce3 or cells Ce2 and Ce4 involve less unbalance in their characteristics.

Although in any of the above-mentioned embodiments the eight-bit information are recorded in the eight transistors, any desired bit-number information can be recorded and read out if the number of transistors and of associated delay elements is increased or decreased.

FIG. 26 is a circuit as partly taken from a memory portion of a mask ROM according to another embodiment of the present embodiment. In the Figure, the same reference numerals are employed to designate parts or elements corresponding to those of the above-mentioned embodiment and any further explanation thereof are omitted. In the Figure, T1, T2 and T3 are transistors as memory cells for program and the transistors T1, T2, T3 and T4 are comprised of MOS transistors and their gate electrodes are connected to word lines WL1, WL2, WL3 and WL4 through selectively predetermined value resistances. In the embodiment of FIG. 26, the gate electrode of the transistor T1 is connected through a zero resistance, that is, directly, to the word line WL1, the gate electrode of the transistor T2 is connected through a resistance R11 to the word line WL2, the gate electrode of the transistor T3 is connected to the word line WL3 through series-connected resistances R11 and R12 and the gate electrode of the transistor T4 is connected to the word line WL4 through series-connected first, second and third resistors R11, R12 and R13. Here, the resistive values of the resistors R11, R12 and R13 are equally set. The transistors T1, T2, T3 and T4 are connected at one electrode, that is, at a drain electrode, to a bit line BL1 and at the other electrode, that is, at a source electrode, to ground.

Incidentally, any capacitance C connected in parallel with the respective resistance shows a floating capacitance (stray or parasitic capacitance) created when the resistance is formed on a semiconductor substrate. In a stricter sense, it is necessary to consider a time constant of this floating capacitance and resistance when a signal delay resulting from the resistance is taken into consideration. Here, it is handled as a delay resulting from the resistance only.

The drain electrodes of the transistors T1 to T4 are connected in common with the bit line BL1 and this bit line BL1 is connected to an input terminal of a current amplification type sense amplifier SA. A power supply terminal of the sense amplifier SA is connected to a Vcc power supply and the output terminal thereof is connected to the input terminal of the counter 211. The counter 211 ia supplied with a clock signal as will be set out below.

Here, although the transistors T1, T2, T3 and T4 alone are shown as the memory cells for program, a large number of transistors may be used, as memory cells for program, in accordance with the number of word lines and the respective gate electrodes are connected to the word lines through selectively determined-value resistances and drain electrodes are connected in common with a bit line BL1. In this way, a mask ROM is manufactured.

With reference to FIGS. 27A to 27J, explanation will be given below about the reading operation of information from a multi-valued information storage ROM having an arrangement shown in FIG. 26.

Figure 27A:
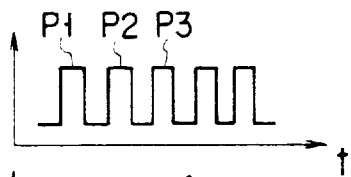
FIGS. 27A to 27J is a timing chart for explaining the operation of the FIG. 26 embodiment.
Figure 27B:
Figure 27C:

Clock signals P1, P2 and P3 as shown in FIG. 27A re supplied to a clock signal input terminal of the counter 211. Here, as shown in FIG. 27B, an address signal A synchronized with three clocks P1 to P3 is supplied to the selected word line WL1, the transistor TI is turned ON, an output B as shown in FIG. 27C is supplied from the sense amplifier SA to the counter 211, and the counter 211 counts three clock signals P1 P2, and P3 which are supplied during a LOW period as three serial "1" signals and hence a count value becomes "3". In this way, in accordance with those read-out clocks from the transistor T1, it is possible to obtain a three-bit serial output "111" or a multi-valued output "3".

Figure 27D:
Figure 27E:

Similarly, when an address signal as shown in FIG. 27B is applied to the selected word line WL2, this signal is read out through the resistor Rll, delayed by an amount corresponding to the clock P1 and at a time shown in FIG. 27D, supplied to the gate electrode of the transistor T2 to render the transistor ON. At a time of the read-out clock P1, the transistor T2 is still in a turned-OFF state and the drain electrode of the transistor T2 is held as a potential on the bit line BL1. In consequence, as an output signal of the transistor T2 a "0" signal is output to the counter 211 through the sense amplifier SA as shown in FIG. 27E. At this time, the clock signal P1 is not supplied to the counter 211 where no count is made.

Subsequently, at a time of the read-out clock P2, an address signal A' delayed by the resistor R11 is supplied to the gate electrode of the transistor T2 to turn the transistor T2 ON. In consequence, a LOW signal is output to the sense amplifier SA and the counter 211 counts a clock signal P2. At a time of a subsequent read-out signal A' an address signal A' still being supplied and the transistor T2 is turned ON. Therefore, a "LOW" signal is obtained at the sense amplifier SA and a third clock P3 is counted by the counter 211. As a result, in accordance with the read-out clocks P1 to P3 the transistor T2 produces a three-bit serial output "011". At this time, the count value of the counter 211 is "2" and a multivalued output "2" is produced.

Figure 27F:
Figure 27G:
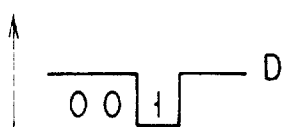

Further, a read-out address A of FIG. 27B is supplied to the word line WL3 in synchronization with the clock P1. When the transistor T3 is selected, this signal is delayed, by the resistors R11, R12, by an amount corresponding to two read-out clocks P1 and P2 as shown in FIG. 27F. At a time of the read-out clocks P1 and P2, the transistor T3 stays OFF and the drain electrode of the transistor T3 is maintained at a potential on the bit line BL1. In consequence, as an output signal of the transistor T3 a "00" signal is obtained at the sense amplifier SA as shown in FIG. 27G. Subsequently, at a time of the read-out clock P3, an address signal A" delayed by the resistors R11 and R12 is applied to the gate electrode of the transistor T3 to turn the transistor T3 ON. And a "LOW" signal is obtained at the sense amplifier SA and the counter 211 counts a third clock P3. As a result, in accordance with the read-out clocks P1 to P3 the transistor T3 produces a three-bit serial output "001".

Figure 27H:
Figure 27I:
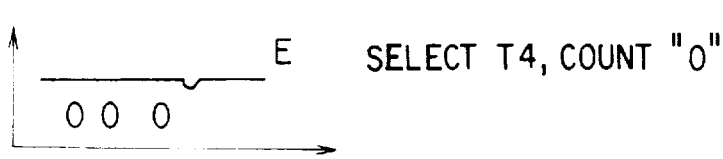

When the transistor T4 is selected and an address signal A of FIG. 27B is supplied to the word line WL4, this signal A is delayed, by the resistors R11, R12 and R13, by an interval corresponding to three clock signals P1 to P3 and, as shown in FIG. 27H, an address signal A is not supplied to the gate electrode of the transistor T4 and stays OFF. In consequence, the clock count value of the counter 211 remains zero and, in accordance with the clocks P1 to P3, the transistor T4 produces a three-bit serial output "000" as shown in FIG. 27I.

Figure 27J:

Thus, the address signal passing through the word line is delayed due to a resistance value connected to the base of the transistor, that is, delayed by a time determined by a time constant of the resistor from a reference time and fed to the corresponding transistor. The transistor produces an output signal representing that it is turned ON after a predetermined time delay. If, therefore, an information read-out effective period, that is, a read-out effective period of information corresponding to three clock signals P1 to P3 as shown in FIG. 27J, is set, then serial multi-valued information having the contents determined by a resistive value is obtained by supplying an enable signal, that is, an address signal, together with clocks, from the sense amplifier SA to the counter 211 at a predetermined time.

In the case where, as set out above, in the embodiment of FIG. 26, the resistors R11, R12 and R13 are formed with the use of, for example, a silicide of polysilicon, a stray capacitance C is present between the resistance layer by itself constituting the resistors and a nearly conductor and, in actual practice, a signal is delayed by a time determined by a CR time constant of the resistors R11, R12 and R13 and stray capacitance C and supplied to the memory cell transistor.

A whole circuit arrangement for reading out serial multi-valued information from the mask ROM arranged as shown in FIG. 26 is as indicated by, like in FIG. 8, a block diagram of FIG. 28 for instance. In FIG. 28, a memory access signal is supplied to an input buffer 21. An output signal of the input buffer 21 is supplied to a decoder 22 where it is decoded to allow the selection of a predetermined word line, for example a WL2, that is, a memory cell T2.

On the other hand, an output signal of the input buffer 21 is supplied to an input terminal of a sense amplifier enable signal generating circuit 23. The sense amplifier enable signal generating circuit 23 generates, as set out above, read-out clock signals P1, P2, P3, . . . , in synchronization with an address signal A to the memory cell T2. The generated clock signal is supplied to a detector 24A. As a result, the detector 24A enables reading of "011" serial multi-valued information from the transistor T2 shown in FIG. 26.

19

FIG. 29 is a circuit diagram showing one example of the sense amplifier enable signal generating circuit 23 and a pulse signal from the input buffer 21 is input to the input terminal 31. The gate of a MOS transistor 32 is connected to the input terminal 31 and one end of a CR delay circuit 36 having substantially the same time constant as that connected to the gate of the transistor of FIG. 26 is connected to the input terminal 31. The other end of the CR delay circuit 36 is connected to the gate of the next-stage transistor 33 and to one end of a CR delay circuit 37 having substantially the same time constant as that connected to the gate of the transistor T2 of FIG. 26. The other end of the CR delay circuit 37 is connected to the gate of the next-stage transistor 34. The sources of the transistors 32, 33, 34 are connected to the input end of the detector 24A via an output terminal 35.

In the circuit thus arranged, when a pulse signal is supplied to the input terminal 31, an output P1 is immediately obtained from the transistor 32. After the lapse of a predetermined time, an output P2 is obtained from the transistor 33. After the further lapse of a predetermined time, an output P3 is obtained from the transistor 34. These outputs P1, P2 and P3 are supplied as the above-mentioned read-out clocks to the detector 24A.

FIGS. 30A to 30E, each, show a relation, to an output signal, of the input address signals applied to the transistors T1, T2 and T3 in accordance with clocks P1, P2 and P3 of FIG. 27. Here, in the transistors T1, T2, T3, the generation period of the output signal is somewhat decreased due to waveform distortion resulting from the delay of the input pulse but since, in the sense amplifier enable signal generating circuit 23, use is made of, in the examples of FIGS. 28 and 29, the transistors 32, 33 and 34 corresponding to the transistors T1, T2 and T3 in FIG. 26, the read-out clocks P1, P2, P3 sufficient to be covered in the output period of the respective transistors T1, T2 and T3 are applied from the detector 24A.

Figure 30A:
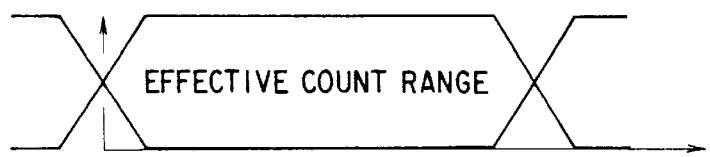
FIGS. 30A to 30E are input/output signal waveform diagrams of the embodiment shown in FIG. 26.
Figure 30B:
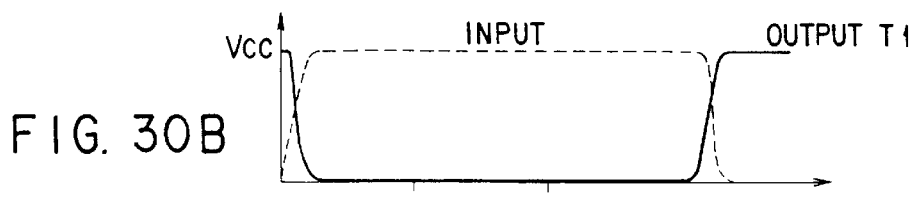
Figure 30C:
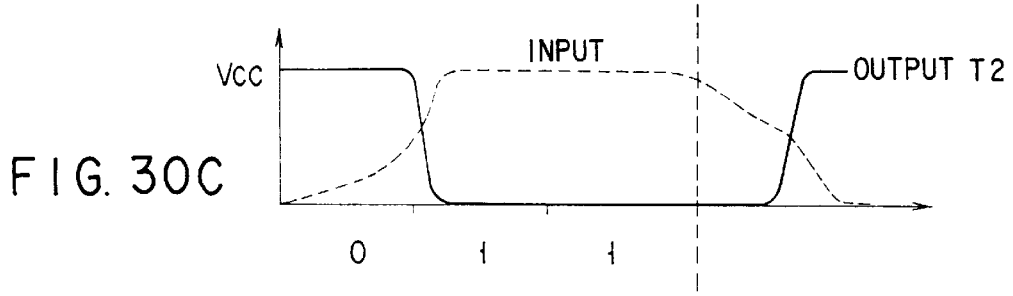
Figure 30D:
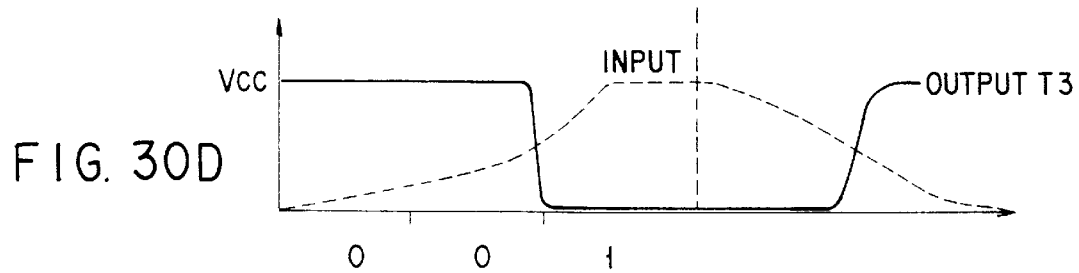
Figure 30E:
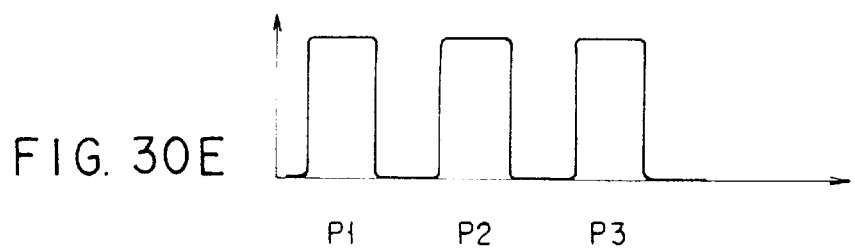

FIG. 30A shows an effective count range of the counter 211 corresponding to the read-out clocks P1, P2 and P3. Since in FIG. 30B no resistance is connected to the gate electrode of the transistor T1, a three-bit "111" serial signal is obtained from the detector 24A. In FIG. 30C, a three-bit "011" serial signal is obtained from the detector 24A because one resistor R11 is connected. In FIG. 30D, a three-bit "001" serial signal is obtained because two resistors R11 and R12 are connected. In place of the two resistors R11+R12 use may of course be made of one resistor having a resistive value of (R11+R12).

As set out above, in this embodiment, if the input and output signals corresponding to the transistors T1, T2, T3 are detected along a time base, it is seen that they are ON signals generated at predetermined times equally divided with the read-out clocks P1, P2 and P3 and, if their specific time is recognized, it is possible to record and read multi-valued information with both one resistance differing in magnitude from another and one transistor.

In the embodiment shown in FIG. 26, although a desired delay amount is obtained by selectively connecting a resistance to the gate of a programmable transistor, a signal delay may be obtained with an electrostatic capacitance in place of a resistance.

Although as the sense amplifier use is made of a current detection type as explained in connection with the embodiment of FIG. 26, since the address designation can be made relative to the word lines WL1 to WL4, use can be made, as the sense amplifier SA, of a voltage detection type so as to detect voltages on the drains of the respective transistors T1 to T4.

20

Figure 31:
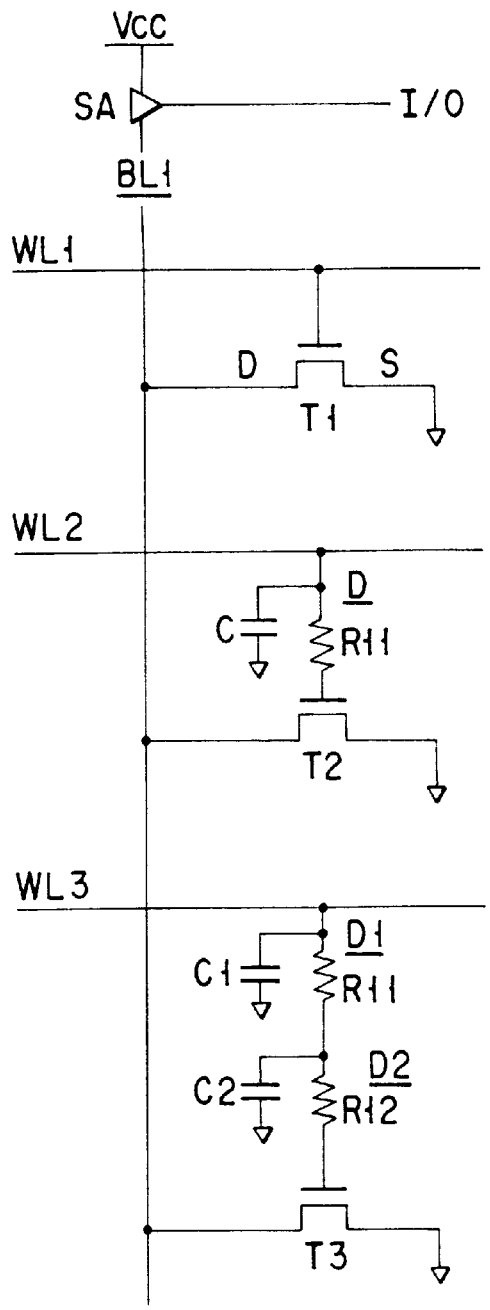
FIG. 31 is a circuit arrangement according to another embodiment of the present invention.

With reference to FIG. 31 explanation will be given of a further embodiment of the present invention.

In FIG. 31, the same reference numerals are employed to designate parts or elements corresponding to those of the embodiment of FIG. 26 and further explanation is, therefore, omitted. In the embodiment shown in FIG. 31 either a resistance nor a capacitive element is connected to the gate of a transistor T1 as in the case of the embodiment of FIG. 31. The gate of a transistor T2 is connected to a word line WL2 via a delay circuit D comprising a resistor R11 and capacitive element C. The gate of a transistor T3 is connected to a word line WL3 via a series combination of a delay circuit D1 comprised of a resistor R11 and capacitive element C1 and delay circuit C2 comprised of a resistor R12 and capacitive element C2. The drain electrodes of the transistors T1, T2 and T3 are connected from a common bit line BL1 to the input terminal of a sense amplifier SA.

The input/output relation to the respective gate electrodes of the respective transistors T1, T2 and T3 in the embodiment of FIG. 31 is, like the embodiment of FIG. 26, as shown in FIGS. 30A to 30E. Even in the embodiment of FIG. 31 it is possible to record and read multi-valued information of, for example, three bits on a time base as explained in FIGS. 27A to 27J.

Figure 32A:
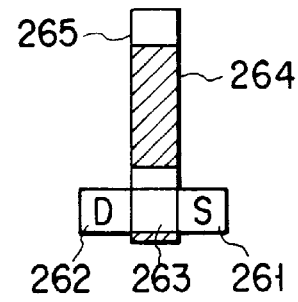
FIGS. 32A to 32C are plan views showing an arrangement of a major section of the FIG. 26 embodiment.

Here, with reference to FIGS. 32A to 32C, explanation will be given about one example of an arrangement of the gate area of the transistors T1, T2 and T3 in the embodiment of FIG. 26. FIG. 32A is a plan view showing a gate area of the transistor T1 and a long strip-like silicide electrode 263 is formed between a word line, not shown, and a gate electrode 263 formed astride between a source region and a drain region of the transistor T1 on a semiconductor substrate with a gate insulating film therebetween. The silicide layer 264 can be provided by forming, for example, an elongated polysilicon layer 265 corresponding in configuration to the silicide layer 264 and forming it as a silicide with a metal, such as tungsten. In this case, the portion of the silicide layer 264 is made long so that a whole resistive value can be decreased to a very small extent and its equivalent circuit can be tantamount to a directly connected one substantially as between the transistor T1 and the word line WL1 of FIG. 26.

Figure 32B:
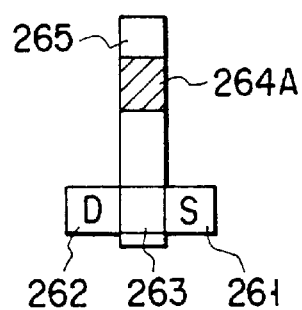

FIG. 32B is a plan view showing a gate area of the transistor T2 of FIG. 26 and a silicide layer 264A is made shorter than that in the example of FIG. 32A to provide a resistor R11. As set out above, a stray capacitance is created in a polysilicon 265 relative to the semiconductor substrate, that is, in a polysilicon 265 containing the silicide layer 264A.

Figure 32C:
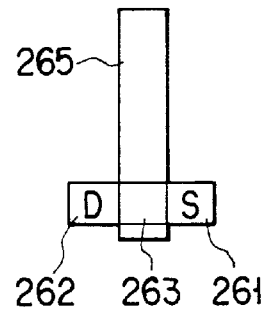

FIG. 32C is a plan view showing a gate area of the transistor T3 in FIG. 26. In this case, a silicide layer 264 used in th examples of FIGS. 32A and 32B is not used and a polysilicon layer 265 alone is employed, thus making it possible to obtain a high resistive value (R11+R12). Naturally it may also be possible to use some silicide layer 264 so as to obtain double the resistive value R11 in the case of FIGS. 32C and 32B. As set out above, a stray capacitance C is created between the polysilicon layer 265 and the semiconductor substrate.

In the embodiment of FIG. 31 the delay circuits D, D1, D2 are such that, in either case, their main delay element is comprised of a capacitive element. The resistors R11 and R12 are formed as incidental resistive components of the electrode in forming opposite electrodes creating capacitive elements C, C1, C2.

Here, with reference to FIGS. 33A to 33C, explanation will be given below about one example of an arrangement of the gate areas of the transistors T1, T2, T3 in the embodiment of FIG. 31.

Figure 33A:
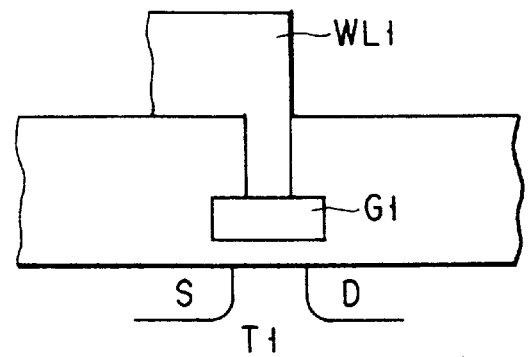
FIGS. 33A to 33C are cross-sectional structures of major sections of the embodiment shown in FIG. 31.
Figure 33B:
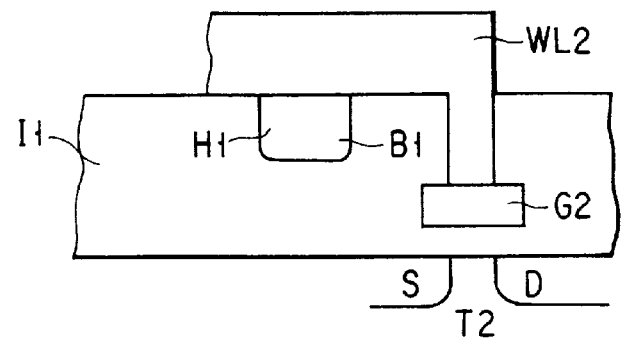
Figure 33C:
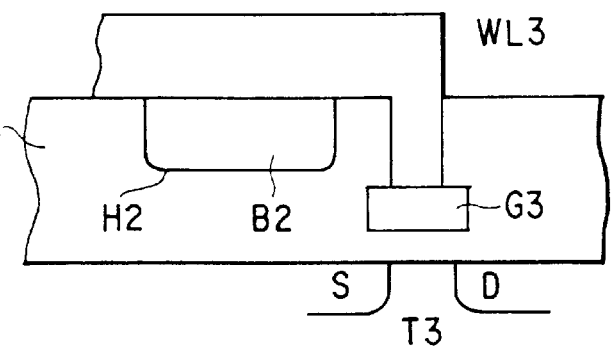

FIG. 33A shows a structure in partial cross-section of the transistor T1 in FIG. 31 and direct connection is made between the gate G1 of the transistor T1 and a metal interconnection layer formed as the word line WL1.

A trench H1 is formed in an interlayer I1 below a metal connection layer connected to the gate of the transistor T2 and formed as the word line WL. The diameter of the trench Hi is adjusted with a mask diameter and a high dielectric material B1 is buried in the trench in a state contacted with the word line WL2. If this is so done, it is possible to adjust the value of a capacitive element C constituting a delay circuit D connected to the gate of the transistor T2 in FIG. 31.

Further, a greater trench H2 is formed also in an interlayer I2 below a metal connection layer connected to the gate of the transistor T3 and formed as the word line WL3. The diameter of the trench H2 is adjusted with a mask diameter and a high dielectric material B2 is buried in the trench in a state contacted with the word line WL3. If this is so done, it is possible to adjust capacitive elements C1, C2 constituting delay circuits D1, D2 connected to the gate of the transistor T3 in FIG. 31. Although in FIG. 33C the capacitive elements C1, C2 have been explained as together being formed in a greater trench H2 by way of example, they may be naturally be formed respectively in two trenches.

According to the above-mentioned embodiment, as set out above, it is possible to record and read multi-valued information in the same way as in FIG. 26 by obtaining signal delays with the use of the electrostatic capacitors in place of resistors.

Although in any of the above-mentioned embodiments the three-bit multi-valued information is recorded in one transistor, if the delay amount of the delay circuit connected to the gate of the transistor is read out as three, four clocks, then, it is possible to record and read the multi-valued bit information, such as 4-bit, 5-bit information.

FIG. 34 is a circuit arrangement showing a memory cell portion of a ROM according to another embodiment of the present invention.

In FIG. 34, word lines WL1, WL2, WL3 and WL4 are so provided as to cross respective eight bit lines BL1 to BL8 and are connected to the output terminal of an X decoder XD respectively through switch transistors SW1, SW2, SW3, SW4 and buffers BF1, BF2, BF3, BF4. The bit lines BL1 to BL8 are connected at one terminal to input terminals of a Y selector YS and a selected output of the Y selector YS, for example, the output of the bit line BL6 is compared with a reference voltage Vref at a detector SA as will be set out above. A memory cell of a configuration as will be set out below is provided at a crosspoint of corresponding ones between the word lines WL1 to WL4 and eight bit lines BL1 to BL8. Although, here, memory cells are shown only relative to the eight bit lines BL1 to BL8 and two word lines WL1 and WL2 for ease in explanation, many more bit lines and word lines are employed as such and such memory cells are provided at respective crosspoints.

The word line WL1 is connected to the anodes of eight diodes D1 to D8 and the cathodes of the diodes D1 to D8 are connected respectively through resistors R1 to R8 to the bit lines BL1 to BL8. Here, the resistors R1A, R3A, R4A, R6A, R8A have values delaying signals passing therethrough by predetermined times and the remaining resistors R2A, R5A, R7A have their values set to be very small. For example, the resistors R1A, R8A are set to very large values compared with an internal resistor of the word line WL1 and internal resistors of the respective bit lines BL1 to BL8.

Similarly, the word line WL2 is connected to the anodes of eight diodes D11 to D18 and the cathodes of the diodes D11 to D18 are connected respectively through resistors R11A to R18A to the bit lines BL1 to BL8. Here, the resistances R11A, R12A, R15A and R16A are set to have great values and the remaining resistors, R13A, R14A, R17A, R18A are set to have very small values.

In this way, at the respective crosspoints of the word lines WL1, WL2, on one hand, and eight bit lines BL1 to BL8, on the other hand, memory cells are provided each as a combination configuration of a diode and resistance or memory cells M1 to M8 and M11 to M18 are provided each as a combination configuration of a diode and a conductor or a very small resistors.

Also regarding the remaining word lines WL3 and WL4 a memory cell constituting a diode and resistance is connected to a crosspoint relative to a corresponding bit line.

Figure 35:
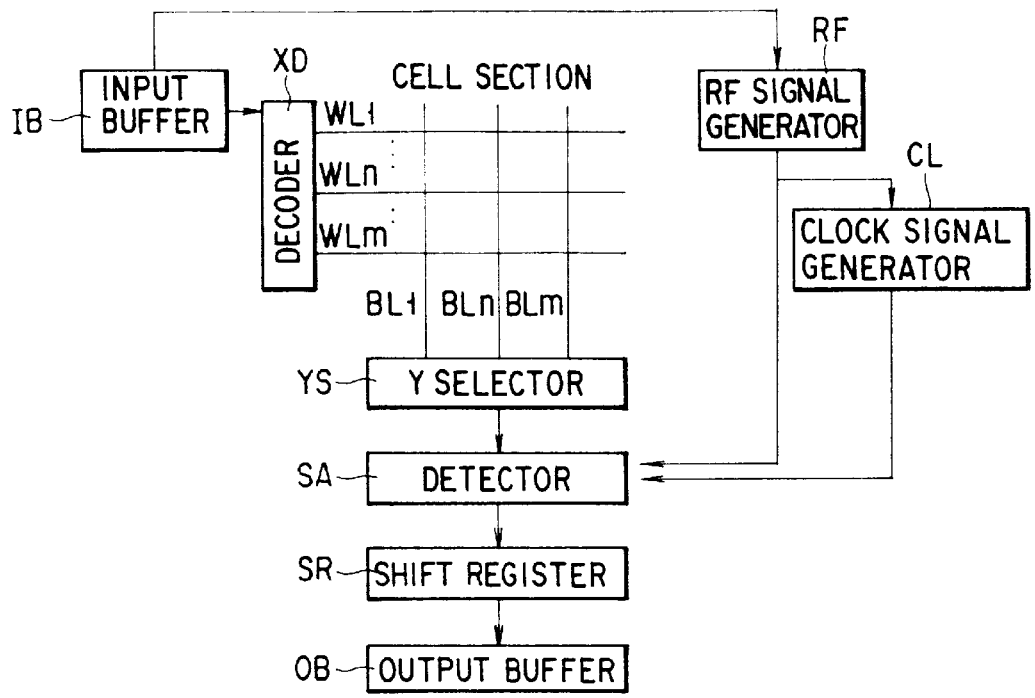
FIG. 35 is a block diagram of a whole circuit including an operation circuit of the FIG. 34 embodiment.

A whole circuit for reading out information from the ROM of the configuration shown in FIG. 34 is so arranged as indicated, for example, in FIG. 35.

In FIG. 35, a memory access signal is supplied to an input buffer IB. The output signal of the input buffer IB is supplied to an X decoder XD and decoded to allow a predetermined word line, for example, WL1, to be selected.

On the other hand, a designation signal for generating a reference signal RF in accordance with the access signal is supplied from the input buffer IB to an RF signal generator RF and a generated RF signal is supplied to the input terminal of a sense amplifier SA as a detector and to a clock signal generator CL. The RF signal is used to obtain a read-out output in synchronism with access gained to the memory cells M1 to M8 connected to the crosspoint of the word line WL1 relative to the bit lines BL1 to BL8 in FIG. 1. The generated reference signal RF is supplied to the detector SA and the detector SA is so configured as to operate only during a time in which the reference signal RF is supplied.

The output of the detector SA is supplied to a shift register SR and the outputs of, for example, eight bit lines BL1 to BL8 are latched to the shift register SR. As a result, eight bit parallel information corresponding to the memory contents of the memory cells M1 to M8, that is, the values of the resistors R1A to R8A, is read out from the output buffer OB. Similarly, when another word line, for example, WL2, is selected, another 8-bit output is obtained from the output buffer OB via the shift register SR.

Figure 36:
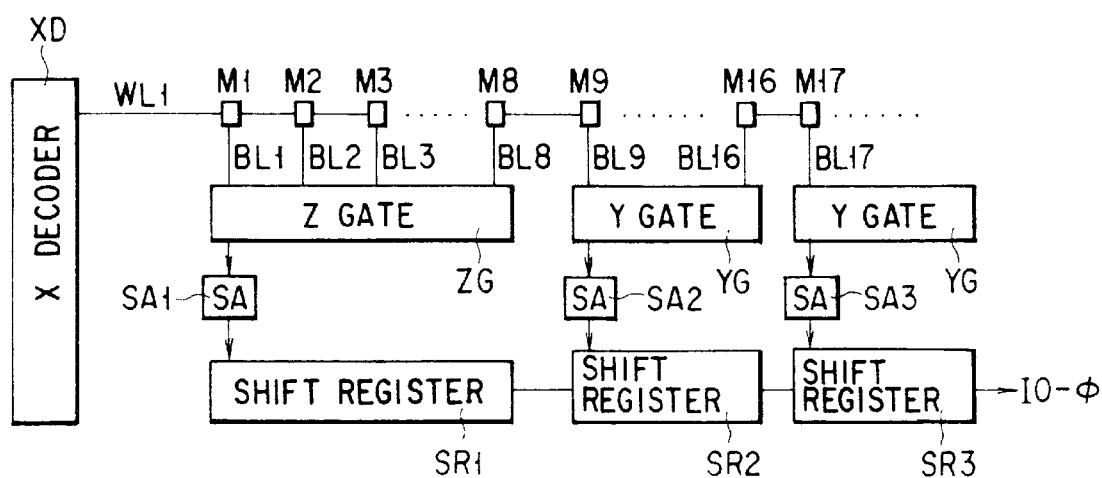
FIG. 36 is a block diagram showing an arrangement of a cell circuit section of FIG. 35.

With reference to FIG. 36 explanation will be given about the arrangement of a cell circuit at crosspoints of word and bit lines in FIG. 35. In FIG. 36, with the decoding of an X decoder XD and selection of, for example, the word line WL1, the information contents stored in the memory cells M1 to M8 connected to the word line WL1 are sent through bit lines BL1 to BL8 to a Z gate ZG. The Z gate ZG is represented as a Y selector YS in FIG. 1. In FIG. 36, the output of the Z; gate ZG is sent through a sense amplifier SA1 to, and latched to, a shift register SR1.

More bit lines cross the word line WL1 in FIG. 34 and at the respective crosspoints many memory cells M9 to M16, M17 are connected using eight memory cells as one unit as shown in FIG. 36. The outputs of the memory cells M9 to M16 are taken from the bit lines BL9 to BL16 onto a Y gate YG and through a second sense amplifier SA2 to a shift register SR2. In the same way as the memory cell M17 et seq., storage information is read out.

With reference to FIGS. 37 to 43C a method for reading out storage information from the mask ROM thus arranged will be explained below in more detail.

FIG. 37 shows a simplified circuit for explaining a circuit from the selection of the memory cell M1 via the word line WL1 from the X decoder XD as shown in FIG. 34 to the obtaining of a read-out output onto the Y selector YS via the bit line BL1. In FIG. 37, the word line WL1 is indicated by both a resistive component R word and a floating capacitive component (a stray capacitance or parasitic capacitive component) C word, the cell M1 by the first resistance R1, and the bit line BL1 by a resistive component R bit and floating capacitive component C bit. The arrangement of this circuit has already been explained above and further explanation is omitted here.

FIGS. 38A to 38E show signal waveforms of respective parts of the circuit of FIG. 37. When an input as shown in FIG. 38A is supplied from the X decoder XD to a buffer BF1 in a decoder section, an inverted replica of this input signal is supplied to the word line WL1 through a switch SW1 and, at a connection point A between the resistive component R word and the floating capacitive component C word, a cell access signal is obtained with some delay resulting from a CR component on the word line WL1 as shown in FIG. 38B. This access signal is supplied via the cell resistor R1 to the bit line BL1 and, at the connection point B between the resistive component R bit, and the floating capacitive component C bit, eventually receives a delay Dt by a CR time constant comprising the word line resistive component R word and floating capacitive component C word, cell resistance R1 and bit line resistive component R bit and floating capacitive component C bit to obtain a read-out signal of a dull waveform as shown in FIG. 38C. This signal is supplied to a sense amplifier SA1 and, since a decision reference voltage Vref is applied to the sense amplifier SA, wave-shaped with the voltage Vref as a threshold or a threshold level to obtain a rectangular signal C from the sense amplifier SA1 as shown in FIG. 38D. It is to be noted that, as shown in FIG. 38E, a reference signal RF is so set as to fall before a rise in a wave-shaped output signal.

Hereinbelow, the arrangement of the detector SA will be explained below with reference to FIG. 39. A read-out signal B, as shown in FIG. 38C, obtained via the bit line BL from a cell resistance R is supplied to one input terminal of a comparator COM1 and compared with the decision reference voltage Vref input to the other terminal of the comparator to obtain a rectangular output C as shown, for example, in FIG. 38D. The rectangular output C is supplied to one end of an AND circuit And. An RF signal is supplied to one input terminal of a comparator COM2 from an input buffer IB in FIG. 35 and compared with a decision reference voltage Vref input to the other end of the comparator to obtain a rectangular output RF. The rectangular output RF is supplied to the other end of the AND circuit And.

Here, in the case where the value of the cell resistance R is very small, there is almost no signal delay in the cell and, as shown in FIG. 40B, a read-out signal supplied to one input terminal of the comparator COM1 in FIG. 39 takes on a waveform almost simultaneously rising with the RF signal shown in FIG. 40B. In consequence, the output of the AND circuit And takes on a waveform rising at t=0 as shown in FIG. 40C. On the other hand, in the case where the value of the cell resistance R is greater, since there is a greater signal delay in the cell, a read-out signal supplied to one input terminal of the comparator COM1 in FIG. 39 takes on a waveform as shown in FIG. 40D, that is, a waveform rising after a fall of the RF signal as shown in FIG. 40E, and hence the output of the AND circuit And takes on a LOW waveform as shown in FIG. 40F. The output of FIG. 40C is put at a "1" signal and the signal of FIG. 40F is at a "0" signal. The output of the AND circuit And is latched to a latch circuit LA in synchronization with the RF signal, the latch circuit LA being comprised of the shift register SR as shown in FIG. 36.

Then the operation of reading Out information from the memory, that is, the memory as shown in FIG. 34, with eight bits as one set for each word line will be explained below with respect to FIGS. 41A to 43B. FIG. 41A shows an address input supplied to the X decoder XD. When the word line WL1 for instance is selected during an effective address period shown in FIG. 41A, a read-out signal shown in FIG. 41B is supplied to the word line WL1. As set out above, in synchronism with the rise of the read-out signal the reference signal RF1 shown in FIG. 41C is obtained. As a result, an output signal coinciding with the reference signal RF1 is obtained, as shown in FIG. 41D., at the bit lines, BL2, BL5, BL7, connected via the memory cells of a small cell resistive value and an output signal not coinciding with the reference signal RF1 is obtained, as shown in FIG. 41E, at the bit lines, BL1, BL3, BL4, BL6, BL8, connected via the memory cells of a greater resistive value. In consequence, the word line WL1-related 8-bit output "10110101", that is, HIGH ("0") on the bits BL2, BL5, BL7 alone and LOW ("1") on the remaining bits on the word line WL1 as shown in FIGS. 42A to 42H, from the AND circuit And shown in FIG. 39 is latched to the latch circuit LA. Here, HIGH is defined as "0" and LOW as "1". The output of the latch circuit LA is fixed, for each bit line, in accordance with the rise of the reference signal RF shown in FIG. 41C and held as effective data for a given time period as shown in FIGS. 43A to 43C.

Similarly, when the word line WL2 is selected by the X decoder XD, the input signal is supplied to the word line WL2 and, at the same time, a reference signal RF2 rises. As a result, a "1" signal is read out from the cells M11, M12. M15, M16 of a greater resistive value and a "0" signal from the cells M13, M14, M17, M18 of a smaller resistive value.

Although the diodes D1 to D8, D11 to D18, are attached to the memory cells M1 to M8, M11 to M18, respectively, as shown in FIG. 34, these are provided for preventing a backflow from those memory cells connected to not-selected bit lines and a readout error.

With the output signals of the selected word lines plotted on a time base as set out above, it is possible to readily detect a ROM output by comparing, with the reference signal RF, an output signal generated at a given time relative to a reference time t0 and recognizing, as a "1", a signal emerging with a delay resulting from the cell resistance and, as a "0", a signal emerging without a delay.

Although the voltage detection type has been explained as the detector SA, unless there is any particular inconvenience in the reading of the information, use may of course be made of a current sensing type detector, such as a sense amplifier, detecting the information with the high/low level of a current in place of the HIGH/LOW voltage.

With reference to top views of FIGS. 44A to 44D and cross-sectional views of FIGS. 45A to 45D, detailed explanation will be given of the method for manufacturing a memory cell of the FIG. 34 embodiment in and on a semiconductor substrate. Shown here are only the areas of memory cells M1, M2, M3 formed in conjunction with a word line WL1 in FIG. 34.

Figure 45A:
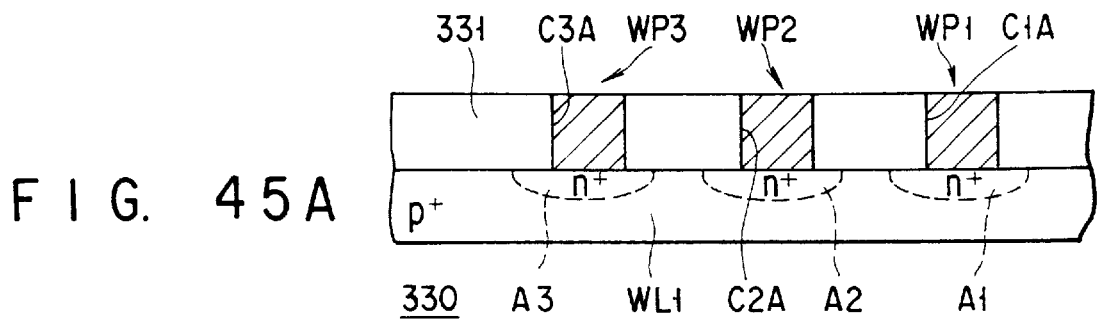
FIGS. 45A to 45D are cross-sectional views showing one example of the FIG. 34 embodiment which is formed on the semiconductor circuit.

As shown in FIG. 45A, a word line WL1 is formed on a silicon semiconductor substrate 330 with a polysilicon layer doped with a P type impurity (p⁺) of high concentration. At those crosspoint positions, relative to bit lines, of an oxide film 331 formed on the word line WL1, square contact holes C1A, C2A, C3A are formed to expose the surface of the word line WL1. By doping an N type impurity (N⁺) of high concentration into the contact holes C1A, C2A, C3A, square pad areas A1, A2, A3 are formed on the surface of the word line WL1 as shown in FIG. 44A.

Figure 45B:
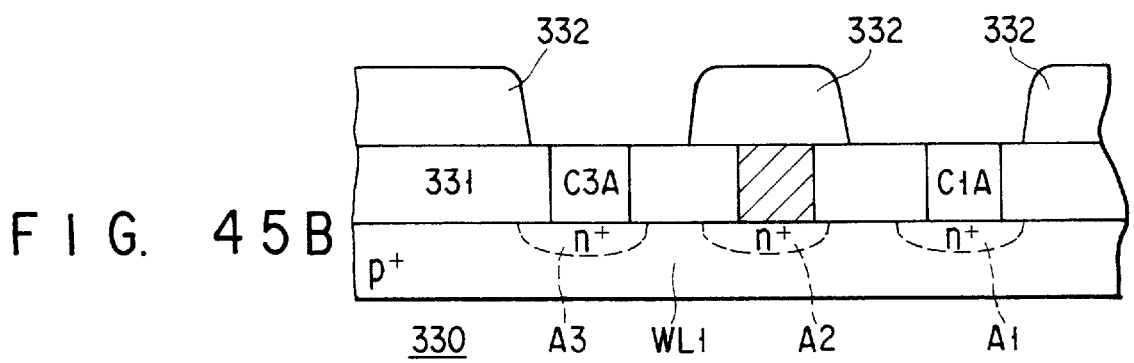

Then, as shown in FIG. 45A, W plugs WP1, WP2, WP3 are deposited to fill in the contact holes C1A, C2A, C3A and a whole surface is covered with a resist. Then, as shown in FIG. 44B and 45B, with a ROM code given as in the case of a mask MROM the resist portion of those positions corresponding to memory cells M1, M3 is removed with a ROM code mask with "0" portions opened. As shown in FIGS. 44B, 45B the exposed conductive plugs WP1, WP3 are etched away so as to form holes at the opening sections C1A, C3A. In the contact holes C1A, C3A where a resist 332 is removed, a highly resistive material (indium, germanium, polysilicon, etc.) is embedded, the resistive material being used as resistors R1A, R2A.

Figure 45C:
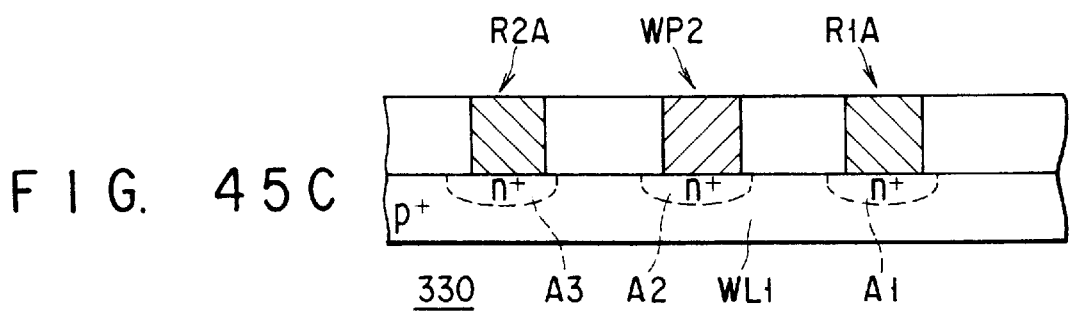
Figure 45D:
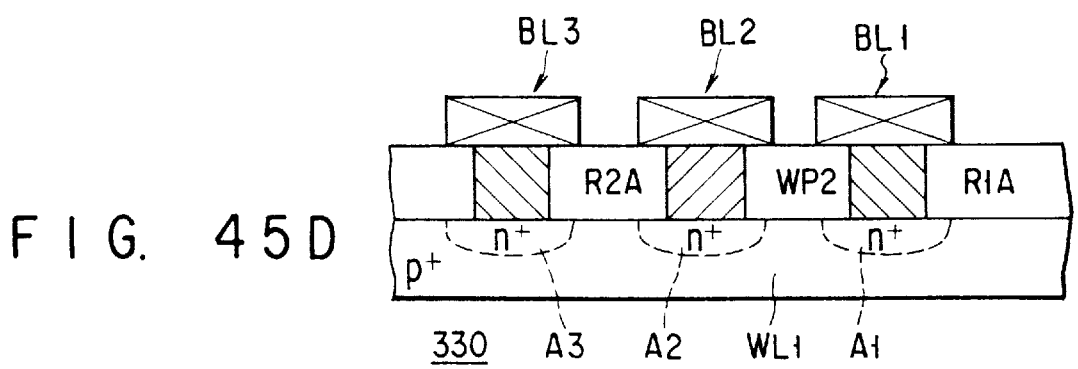

Thereafter, as shown in FIGS. 44C, 45C, the resist 332 is all removed to expose the surface of the resistive layers R1A, R2A and W plug WP2 and, further, the bit lines BL1, BL2, BL3 crossing the respective contact portions are attached with a metal connection layer to effect completion.

In this way, the present embodiment is characterized in that the whole structure is simple and a process from the imparting of the ROM code to the completion of the ROM is short.

The difference of the resistive values is achieved by using the same resistance material with different mask diameters of the contacts C1A, C2A, C3A shown in FIG. 44A to 45D, using burying resistance materials of different resistive values with the same mask diameter, varying the resistive values through the ion implantation into the resistive material, and so on.

Then a multi-valued information ROM according to another embodiment of the present invention will be explained below in more detail.

Figures 46, 47:
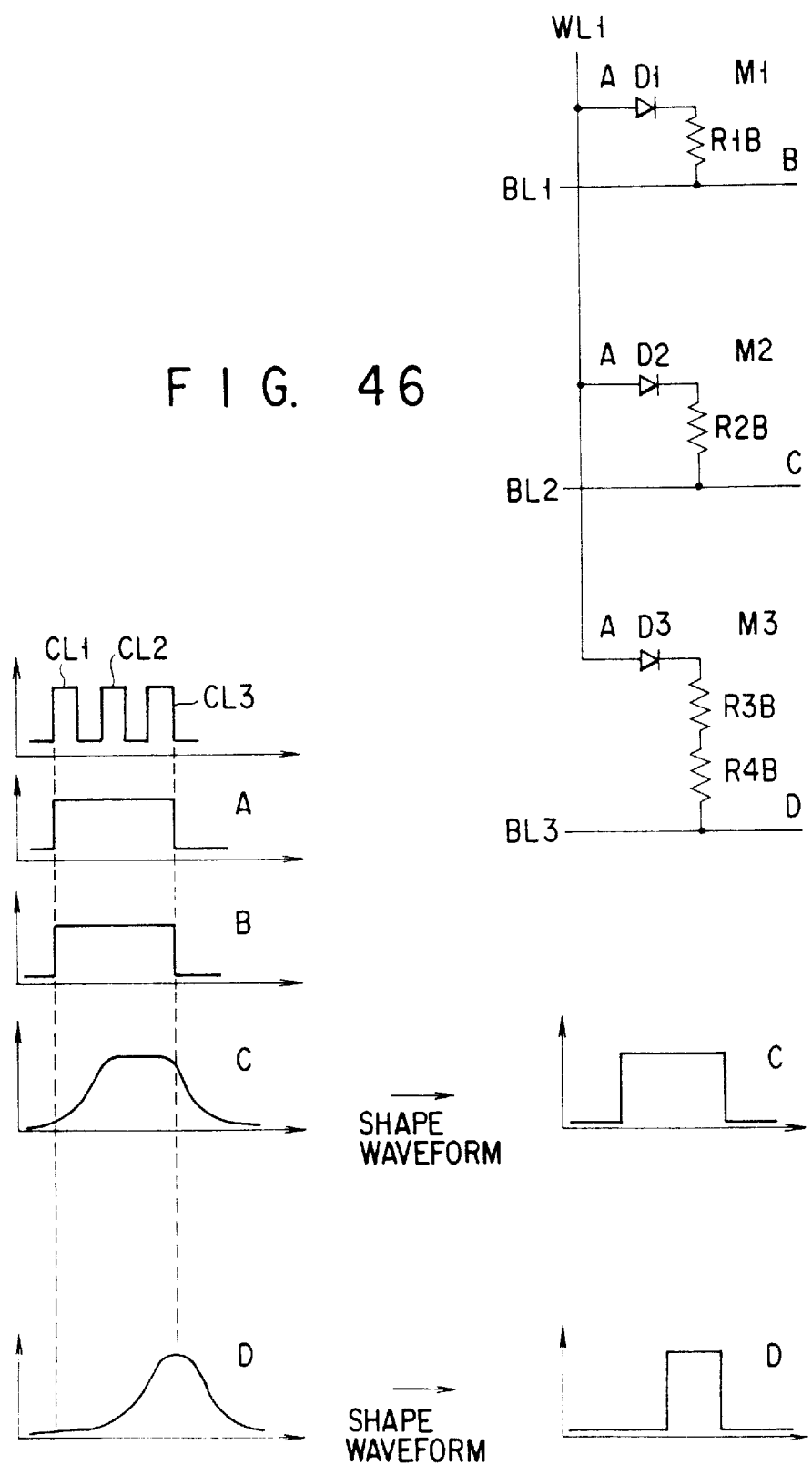
FIG. 46 is a circuit diagram of a memory circuit according to a still further embodiment of the present embodiment.
FIG. 47 is a timing chart for explaining an operation of the embodiment of FIG. 46.

Although, in the FIG. 34 embodiment, cells have two kinds of resistive values, large and small, each group having substantially the same value, the resistive values of resistances R1B, R2B, R3B of cells M1, M2, M3 at crosspoints of, for example, a word line WL1 relative to bit lines BL1, BL2 and BL3 can be set to be three kinds, that is, small, medium and large values, as shown in FIG. 46 and, by doing so, information can be recorded as multi-valued information in place of "1" and "0". For example, the resistance R1B is so set as to correspond to a connection layer resistance alone, resistance R2B correspond to a restive value the same as that of the FIG. 34 embodiment, and resistance R3B correspond to a value (R2B+R2B).

The read-out operation of a multi-valued memory arranged as shown in FIG. 46 will be explained below by referring to FIG. 47. If, for example, a word line WL1 and bit line BL1 are selected, an output signal B emerges from the bit line BL1, in response to a pulse signal A input from the word line WL1, with a small delay resulting from a connection layer resistance. As appreciated from FIG. 49, the width of the output signal corresponds to three clock signals used as a reference signal RF and comparison is made, by an AND circuit And of FIG. 48, between an output signal C and clock signals CL1, CL2 and CL3 and an output of the AND circuit And is counted with a counter CT to obtain multi-valued information of a count value "3".

When, on the other hand, the word line WL1 and bit line BL2 are selected, an output signal C emerges from a bit line BL2, in response to the pulse signal A input from the word line WL1, with a delay resulting from a resistor R2B. The width of this output signal C corresponds to 2 clock signals, as appreciated from FIG. 49, used as the reference signal RF and comparison is made, by the AND circuit And of FIG. 48, between the output signal C and clock signals CL2, CL3 and its output is counted with the counter CT to obtain multi-valued information of a count value "2". That is, for the case of the resistor R1B, the output signal B emerges with almost no dull waveform against the input signal A because its resistive value is very small.

For the case of the resistor R2B, on the other hand, the output signal C emerges as a dull waveform as shown in FIG. 47. For this reason, the output signal C is wave-shaped with the same method as set out in FIGS. 38A to 38E to provide an output signal C'. The period of the output signal C', that is, an effective data range, corresponds to two clocks and comparison is made between the output signal C' and the clock signals to obtain multi-valued information of a count value "2" against the clock signals CL2, CL3.

When the word line WL1 and bit line BL3 are selected, an output signal D emerges from a bit line BL3, with a delay resulting from a resistance (R2B+R2B), in response to the input signal A as shown in FIG. 47. As shown in FIG. 49, the width of the output signal D corresponds to one clock signal used as the reference signal RF and comparison is made, by the AND circuit And of FIG. 48, between the output signal D and the clock signal CL3 and its output is counted with the counter CT to provide multi-valued information of a count value "1". That is, for the case of the resistor R1B, the output signal B emerges with almost no dull waveform against the input signal A because its resistive value is very small. For the case of the resistance value (R2B+R2B), on the other hand, the output signal D emerges with a larger dull waveform as shown in FIG. 47. For this reason, the output signal D is wave-shaped with the same method as set out in connection with FIGS. 38A to 38E to provide an output signal D'. The period of the output signal D', that is, an effective data range corresponds to one clock and comparison is made between the output signal D' and the clock signal to obtain multi-valued information of a count value "1" against the clock signal CL3.

Thus, since due to the difference of resistances included in the memory cells the output signal is delayed as shown in FIG. 47, if the effective width of the output signal is counted by the clock signal, "3", "2", "1" multi-valued information can be recorded and reproduced.

According to this embodiment, as set out above in detail, a resistance is interposed selectively between the word line and the bit line and it is possible to output an input signal through a selective delay by a predetermined time and record and read out binary or multi-valued information in a predetermined timing against an input signal. It is possible to obtain a better memory cell function even if transistors are omitted and readily manufacture memory cells in compact form.

FIG. 50 is a circuit diagram showing a portion of a memory cell section of a ROM according to another embodiment of the present invention.

In FIG. 50, word lines WL1, WL2 are so provided as to cross eight bit lines BL1 to BL8. Memory cell of a configuration as will be set out below are provided at their crosspoints.

The word line WL1 is connected to the anodes of eight diodes D1 to D8 and the cathodes of the diodes D2, D5 and D7 are connected, respectively, through conductors C1C, C2C and C3C to the bit lines BL2, BL5 and BL7.

Similarly, the word line WL2 is connected to the anodes of eight diodes D11 to D18 and the cathodes of diodes D13, D14, D17, D18 are connected, respectively, through conductors C11C, C12C, C13C, C14C to the bit lines BL3, BL4, BL7, BL8.

The remaining diodes D11, D12, D15, D16 are coupled through open terminals T11 to T14 to the bit lines BL1, BL2, BL5, BL6.

In this way, at the crosspoints of the word lines WL1, WL2 relative to the eight bit lines BL1 to BL8 are provided memory cells each comprising a combination of the diode and an element of an infinite resistive value or memory cells M1 to M8, M11 to M18 each comprising a combination of the diode and conductor having a very small connection layer resistance close to substantially zero. It is to be noted that the bit lines BL1 to BL8 are connected to I/O terminals I/O1 to I/O8 as required.

Figure 51:
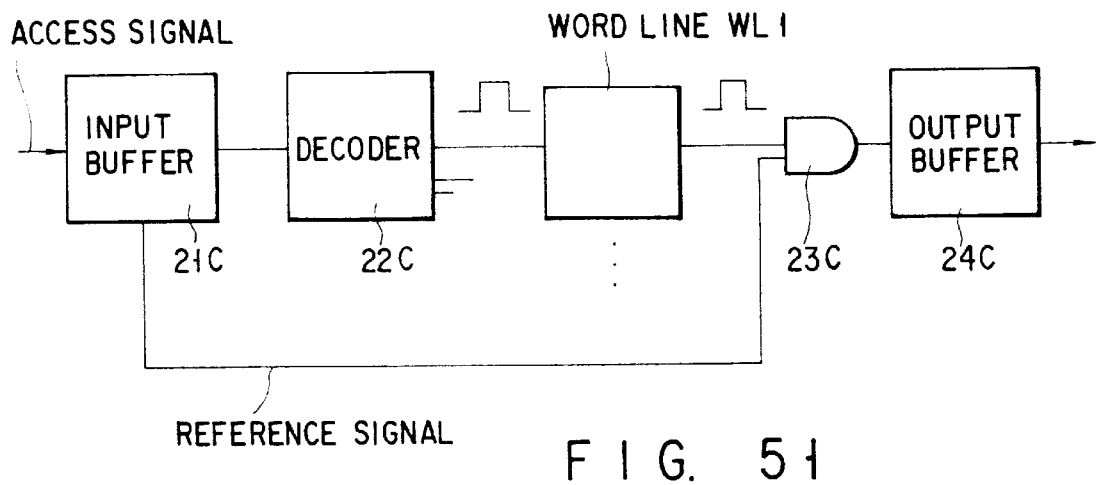
FIG. 51 is a block schematic diagram showing a whole circuit including an operation circuit of the FIG. 50 embodiment.

A whole circuit for reading out information from the mask ROM arranged as shown in FIG. 50 is configured as indicated by a block diagram in FIG. 51. In FIG. 51, a memory access signal is supplied to an input buffer 21C. The output signal of the input buffer 21C is supplied to a decoder 22C where it is decoded. And a predetermined word line, such as WL1, is selected.

On the other hand, the output signal of the input buffer 21C is generated as a reference signal RF in accordance with the access signal and supplied to the input terminal of a detector 23C. This detector 23C is adapted to generate the reference signal RF in synchronization with access applied to memory cells M1 to M8 connected to the crosspoints of the word line WL1 relative to the bit lines BL1 to BL8 or in synchronization with access applied to the memory cells M11 to M18 connected to the crosspoints of the word line WL2 relative to the bits BL1 to BL8. The generated reference signal RF is supplied to the detector 23C and the detector 23C is operated during a time period in which the reference signal RF is supplied. As a result, where the memory cells M1, M2 are sequentially accessed, 2-bit "10" parallel information, being passed via the I/O1, I/O2 from the bit lines BL1, BL2, can be read out from an output buffer 24C in accordance with the memory contents of the memory cells M1, M2. Similarly, where another word line WL2 is selected, an output "11" is obtained from the output buffer 24C.

Figure 52A:
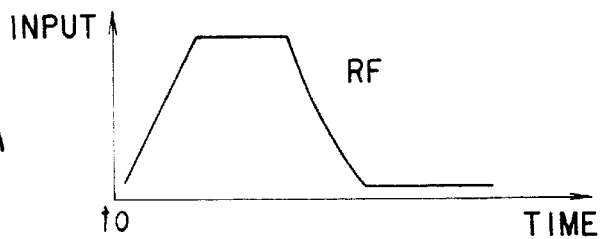
FIGS. 52A to 52C are waveform diagrams showing an information read-out principle of the embodiment of FIG. 50.
Figure 52B:
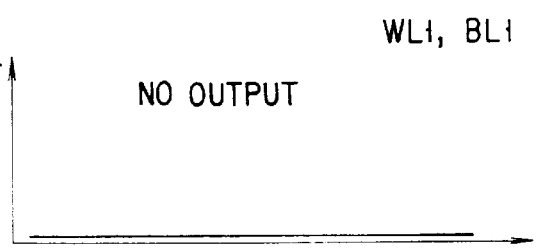
Figure 52C:
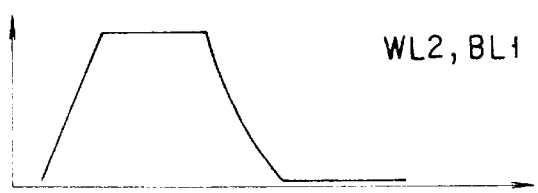

With reference to FIGS. 52A to 52C, detailed explanation will be given of the operation principle on which storage contents are read out from the memory cells each comprising the combination of the diode and infinite resistance resulting from the opening of the circuit or memory cells M1 to M8, M11 to M18 each comprising the diode and connection layer alone assumable as a zero resistance.

FIG. 52A shows a signal waveform diagram of an input access signal or reference, reference RF rising at a reference signal t0. When the word line WL1 and bit line BL1 for instance are selected by the input access signal at the decoder 22C, a potential difference is generated, by a power source, relative to the bit line BL1 via the diode Dl, that is, by that power source, not shown, connected to the bit line BL1. Although the potential difference emerges at the open terminal T1, this is, substantially equivalent to the connection of an infinite resistance and, as shown in FIG. 52B, a delay time constant with respect to the output signal to I/O1 becomes infinite and a "1" output emerges on the bit line BL1.

In consequence, the detector 23C detects that when the reference signal RF as shown in FIG. 52A is placed at a high level the bit line BL1 becomes a low level as shown in FIG. 52B. As a result, the storage content of the memory M1 is recognized as "1".

Subsequently, when the word line WL2 and bit line BL1 are selected by the input access signal at the decoder 22C, the memory cell M11 at the crosspoint relative to the bit line BL1 is selected and, since it has the open terminal T11 in the same manner as the memory cell M1, a "1" output emerges on the bit line BL1 and 2-bit "11" information is sequentially read out in a time sequence.

Further, when the word line WL1 and bit line BL2 for instance are selected by the input access signal at the decoder 22C, electric current flows through the bit line BL2 from a power source, not shown, connected to the word line WL1. This electric current flows directly in the bit line BL2 past the diode D2 and conductor C1 and the output signal is transmitted, as shown in FIG. 52C, to the bit line BL2 with almost no delay.

Thus the detector 23C detects that, when the reference signal RF as shown in FIG. 52A becomes a high level, the bit line BL2 becomes a high level as shown in FIG. 52C and, as a result, the storage content of the memory cell M2 is recognized as being "0".

Here, the diodes D1 to D8, D11 to D18 are attached to the memory cells M1 to M8, M11 to M18 and these diodes prevents a backflow of electric current from another memory cell connected to a not-selected word line and prevents a reading error.

With an output signal, that is, a signal coming from a selected word line, emerging on a time base, it follows that, through comparison between an output signal generated at a given one of equally-divided portions of a time period defined relative to a reference time t0 and a reference signal RF, an infinitely delayed signal from an open terminal of an infinite resistance is recognized as a "1" and a not-delayed signal as a "0". It is, therefore, possible to readily detect a ROM output.

Although two-bit "11" information continuous on the time base has been explained as being read out from the bit line BL1, for instance, through the sequential driving of the word lines WL1, WL2, if the bit lines BL1 to BL8 are selected with the word line WL1, for example, placed in a driven state in the embodiment of FIG. 50, then it is possible to read out an 8-bit word information at a time through I/O1 to I/O8.

The whole circuit for reading out information from the ROM arranged as shown in FIG. 50 is configured as indicated in the block diagrams in FIG. 35 and 36 and, here, any further explanation is omitted.

Further, since the operation of reading out information from the memory, as shown in FIG. 50, with 8 bits per word line as one set has already been explained by reference to FIGS. 41A to 43C, no further explanation is omitted.

The method for manufacturing the memory cell of the FIG. 50 embodiment at a semiconductor substrate will be explained below by referring to top views in FIG. 53A to 53D and cross-sectional views in FIGS. 54A to 54D. Here is shown a section only of memory cells M1, M2, M3 formed in conjunction with the word line WL1 in FIG. 50.

Figure 54A:
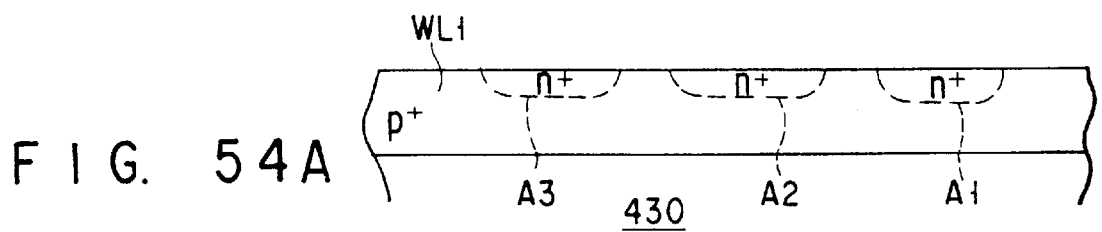
FIGS. 54A to 54D are cross-sectional views showing an inner arrangement of a semiconductor substrate in the process of FIGS. 53A to 53D.

As shown in FIG. 54A, a word line WL1 is formed on a silicon semiconductor substrate 430 with a polysilicon layer doped with a P type impurity (p+) of high concentration. Then a resist layer, not shown, is formed on the word line WL1 and, at those positions corresponding to square contact holes to be formed at those crosspoint positions of the formed resist layer relative to the bit positions, openings are formed to expose the surface of the word lines WL1. By doping an N type impurity (N⁺) of high concentration into the openings, impurity regions A1, A2 and A3 are formed in the surface portion of the word line WL1 (see FIG. 54A) as shown in FIG. 53A. Diodes D1, D2, D3 as shown in FIG. 50 are formed between the word line WL1 comprised of the polysilicon layer doped with the P type impurity (P⁺) of high concentration and the impurity regions Al, A2, A3 doped with the N type impurity (N⁺) of high concentration.

Figure 54B:
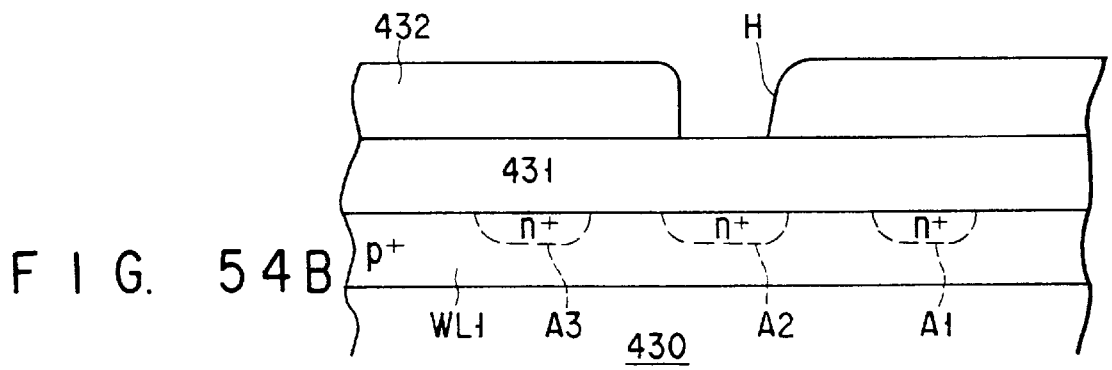

Then an oxide film 431 is uniformly formed on the word line WL1 as shown in FIG. 54B and a resist layer 432 is formed on the oxide film 431. With a ROM code given as in the manufacture of a mask ROM, the resist 432 at a position corresponding to the memory cell M2 is removed with a ROM code mask with "1" portions opened and the exposed oxide film 431 is etched away sc as to form a contact hole CB. The formed contact hole CB is buried with a metal, such as tungsten, for use as a conductor and deposited with a conductive W plug WP to be made in contact with the impurity region A2.

Figure 54C:
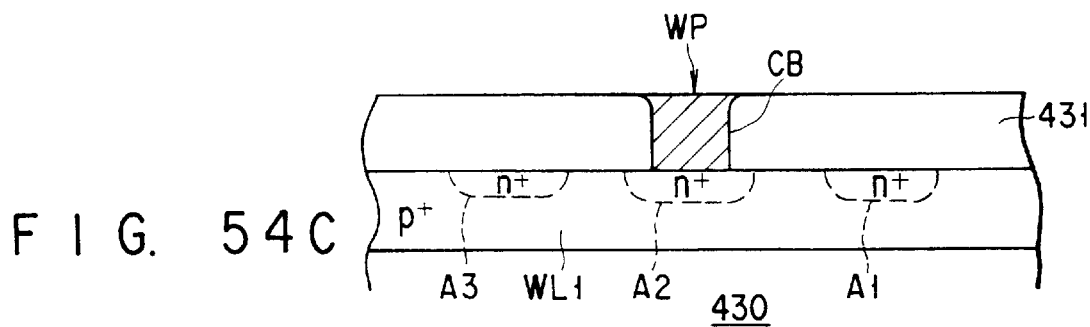
Figure 54D:
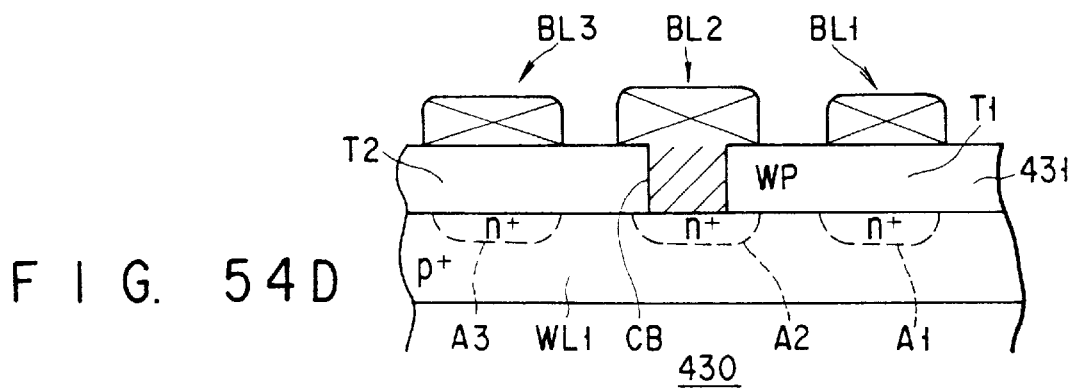

Thereafter, as shown in FIGS. 53C and 54C, the resist 432 are all removed, the surface of a W (tanguston) plug WP2 is exposed and the bit lines BL1, BL2, BL3 crossing the respective contact portions are attached with a metal connection layer as shown in FIGS. 53D and 54D to effect completion. Here, open terminals T1, T2 are formed one between the bit line BL1 and the impurity region A1 and between the bit line BL3 and the impurity region A3. As a result, memory cells M1, M2, M3 are formed along the word line WL1 of FIG. 50.

In this way, the present embodiment is characterized in that it is very simple as a whole arrangement and very short from the reception of the ROM code to the completion of the ROM.

According to the present embodiment, as set out above in detail, selectively infinite resistors, or substantially zero resistors, are interposed between the word lines and the bit lines and, by doing so, an input signal is selectively delayed by memory cells of a zero delay amount or of infinitely delay amount and, even if transistors are omitted, it is possible to, by reading out information at a predetermined time relative to the signal input time, obtain better memory cell functions and readily manufacture memory cells in compact form.

We claim:

1. An information storage apparatus comprising:
   a plurality of bit lines;
   at least one word line arranged in a direction to cross the bit lines to transfer an input read signal to the bit lines;
   a plurality of delay elements each connected to a crosspoint between the bit lines and the word line to delay the input read signal, each of the delay elements having one of a first and second delay times;
   electric control means for allowing electric currents caused by said input read signal to flow in the delay elements, respectively, in a predetermined direction only;
   means for generating a reference signal having a leading timing corresponding to the first delay time of the input read signal; and
   means for detecting whether a starting timing of the input read signal by a delay element appearing at a bit line coincides with the leading timing of the reference signal;

wherein plural-bit information is stored by the delay elements and electric current control means.

2. The information storage apparatus according to claim 1, wherein the electric current control means is comprised of diodes formed on a semiconductor substrate and the delay element includes a resistor formed on the semiconductor substrate and connected in series with the diode.

3. The information storage apparatus according to claim 2, wherein the resistor is comprised of a polysilicon layer formed on the semiconductor substrate and having a predetermined resistive value.

4. An information storage apparatus characterized by comprising:
   a plurality of bit lines;
   at least one word line arranged in a direction to cross the bit lines;
   a first memory element connected to a crosspoint between a selected one of the bit lines and the word line and having a first resistive element;
   a second memory element connected to a crosspoint between the other bit line of the bit lines and the word line and having a second resistive element different in resistive value from the first resistive element;
   electric current control means for making electric current flow in the first and second memory elements respectively in a predetermined direction only; and
   means for detecting multi-valued information appearing at a predetermined time at the word line in accordance with the read-out signal applied to the word line, wherein
   the multi-valued information is stored by the first and second resistive elements and electric current control means.

5. The information storage apparatus according to claim 4, wherein the electric current control means is comprised of a diode formed on a semiconductor substrate and each of the first and second resistive elements includes a resistor formed on the semiconductor substrate and connected in series with the diode.

6. The information storage apparatus according to claim 5, wherein the resistor is formed of a polysilicon formed on the semiconductor substrate and having a predetermined resistive value.

7. The information recording apparatus according to claim 5, wherein the second resistive element has a resistive value for allowing electric current which flows in accordance with the applied input read signal to be delayed by a time corresponding to the first delay time and the second resistive element has a very small resistive value corresponding to a connection layer resistance so as to achieve substantially direct connection between the diode and the word line.

8. An information storage apparatus characterized by comprising:
   a plurality of bit lines;
   contact areas provided at corresponding bit lines;
   diodes formed in the corresponding contact areas;
   a resistive material selectively buried in the contact areas so as to be connected to the diode;
   a plurality of bit lines arranged in a direction to cross the word lines and connected directly or via the resistive material to the contact area; and
   means for detecting a potential variation appearing at a predetermined time at the bit line in accordance with a read-out signal applied to the word line, wherein information is stored by combining together the diodes and resistive material.

9. The information storage apparatus according to claim 8, wherein each word line is formed of a polysilicon layer having a first impurity of high concentration and each diode is formed relative to a second impurity region of high concentration formed in contact with a portion around a contact area provided in the polysilicon layer.

10. An information storage apparatus characterized by comprising:
at least one bit line;
a plurality of word lines arranged in a direction to cross the bit line;
a plurality of delay elements connected to crosspoints between bit line and word lines and having at least three kinds of delay times;
electric current control means for allowing electric current to flow in the delay elements in a corresponding predetermined direction only; and
means for detecting information appearing at least three different timings at the bit lines in accordance with a read-out signal applied to the word lines;
wherein the information is stored at a predetermined timing along a time base by combining together the delay elements and electric current control means.

11. The information storage apparatus according to claim 10, wherein the electric current control means comprises a diode formed on a semiconductor substrate and wherein the resistive element is formed on the semiconductor substrate and includes a resistor connected in series with the diode.

12. The information storage apparatus according to claim 11, wherein the delay elements are formed as resistive elements of a polysilicon layer formed on the semiconductor substrate and having a predetermined resistive value.

13. The information storage apparatus according to claim 10, wherein the delay element has a delay time corresponding to an integral multiple of a corresponding clock signal and the information detecting means includes means for comparing, with the clock signal, a read-out signal delayed by the delay element and making count.

14. The information storage apparatus according to claim 13, wherein the count means comprises an AND circuit having a first input terminal supplied with a delayed read-out signal and a second input terminal supplied with the clock signal and a counter for counting the outputs of the AND circuit.

15. A method for operating an information storage apparatus having resistors of different values connected between one word line and a plurality of bit lines, comprising the steps of:
delaying an access signal which is supplied to the word line, by a predetermined period, through the resistors of different values connected between the word line and the bit lines; and
reading out multi-valued information with the use of the delayed access signal.

16. The method according to claim 15, wherein the delay time is set to an integral multiple of a clock signal and count is made by comparison between the delayed access signal and clock signals generated in a predetermined effective data range, whereby the multi-valued information is read out in serial form on a time base in accordance with the resistive values of the resistors.

17. An information storage apparatus comprising:
a plurality of bit lines;
at least one word line arranged in a direction to cross the bit lines to transfer an input read signal to the bit lines;
a plurality of memory elements connected at crosspoints between the bit lines and the word line and including resistors having resistive values of substantially zero or substantially infinity;
means for generating a reference signal having a timing corresponding to that of an output signal obtained from one of said resistors; and
means for detecting information of the memory elements by detecting whether an output signal is obtained from the bit lines at the starting timing in accordance with the input read signal applied to the word line.

18. The information storage apparatus according to claim 17, further comprising diodes connected in series with the memory elements between the bit lines and the word line.

19. The information storage apparatus according to claim 17, wherein the resistors having resistive values of substantially zero are formed of conductive layers formed on a semiconductor substrate and the resistors having resistive values of substantially infinity are formed of a connection layer having an open terminal or an opened area.

20. An information storage apparatus comprising:
a plurality of bit lines;
a plurality of word lines arranged in a direction to cross the bit lines to transfer an input read signal to the bit lines;
a plurality of memory elements respectively connected to crosspoints between the bit lines and the word lines and including resistors having resistive values of substantially zero or substantially infinity;
means for generating a reference signal having a starting timing corresponding to that of an output signal obtained from one of said resistors; and
means for reading out plural-bit information at a time from the bit lines at the starting timing in accordance with the input read signal applied to selected word lines or detecting information of the memory elements emerging at the word lines through the memory elements connected to selected bit lines.

21. The information storage apparatus according to claim 20, wherein further comprising diodes connected in series with the memory elements between the bit lines and the word lines.

22. The information storage apparatus according to claim 21, wherein the resistors having resistive values of substantially zero are formed of metal layers formed on the semiconductor substrate and the resistors having resistive values of substantially infinity are formed of opened areas of connection layers.

23. An information storage apparatus comprising:
a plurality of bit lines;
a plurality of contact areas formed at the bit lines;
diodes formed at the contact areas;
conductive layers selectively buried at the contact areas to be connected to the diodes;
a plurality of word lines arranged in a direction to cross the bit lines and connected to the contact areas via insulating layers or the conducting layers to transfer an input read signal to the bit lines;
means for generating a reference signal having a starting timing corresponding to that of an output signal obtained from one of the conducting layers or insulating layers; and
means for reading out plural-bit information from the bit lines the starting timing in accordance with the input read signal applied to a selected word line or detecting information emerging at word lines via the conducting layer, or the insulating layer, connected to the selected bit line, the plural-bit information being stored in the crosspoint, wherein the plural-bit information is stored by combining together the conducting layers and the insulating layers.

24. The information storage apparatus according to claim 23, characterized in that the word lines are comprised of a polysilicon layer having a first impurity of high concentration and the diode is formed relative to a second impurity region of high concentration formed in contact with a portion around the contact area formed at the polysilicon layer.

25. A method for operating an information storage apparatus having memory elements provided by making connection, by resistors having resistive values of substantially zero, or resistances of substantially infinity, between at least one word line and bit lines insulatively crossing the at least one word line, comprising the steps of:

generating a reference signal having a starting timing corresponding to that of an output signal obtained from one of said resistors;

detecting, at the starting timing, a signal appearing at the bit lines in accordance with the input read signal supplied to the word line; and reading out the signal as plural-bit information.

26. A method for operating an information storage apparatus having memory elements provided by making connection, by resistors having resistive values of substantially zero or resistors of substantially infinity by opening of a circuit, between at least one word line and bit lines, comprising the steps of:

generating a reference signal having a starting timing corresponding to that of an output signal obtained from one of said resistors;

detecting a presence or absence of the output signal at the starting timing from the bit lines in accordance with an input read signal supplied to the word line; and reading out the presence or absence as plural-bit information.

* * * * *